(12) United States Patent
Duescher et al.

(10) Patent No.: US 9,233,452 B2
(45) Date of Patent: Jan. 12, 2016

(54) VACUUM-GROOVED MEMBRANE ABRASIVE POLISHING WAFER WORKHOLDER

(71) Applicants: Wayne O. Duescher, Roseville, MN (US); Cameron M. Duescher, Maplewood, MN (US)

(72) Inventors: Wayne O. Duescher, Roseville, MN (US); Cameron M. Duescher, Maplewood, MN (US)

( * ) Notice: Subject to any disclaimer, the term of this patent is extended or adjusted under 35 U.S.C. 154(b) by 0 days.

(21) Appl. No.: 14/474,157

(22) Filed: Aug. 31, 2014

(65) Prior Publication Data

US 2014/0370787 A1 Dec. 18, 2014

Related U.S. Application Data

(63) Continuation-in-part of application No. 14/185,882, filed on Feb. 20, 2014, and a continuation-in-part of application No. 14/329,967, filed on Jul. 13, 2014, and a continuation-in-part of application No. 14/154,133, (Continued)

(51) Int. Cl.
*B24B 37/30* (2012.01)
*H01L 21/304* (2006.01)
*B24B 37/04* (2012.01)

(52) U.S. Cl.
CPC ............... *B24B 37/30* (2013.01); *B24B 37/042* (2013.01); *H01L 21/304* (2013.01)

(58) Field of Classification Search
CPC ...... B24B 37/30; B24B 37/042; B24B 49/16; B24B 37/04; B24B 13/00; B24B 13/005; B24B 37/345; H01L 21/304; H01L 21/6838; B25B 11/005

USPC .................... 451/41, 285–290, 388
See application file for complete search history.

(56) References Cited

U.S. PATENT DOCUMENTS 4,593,495 A 6/1986 Kawakami et al.
4,918,870 A 4/1990 Torbert et al.
(Continued)

FOREIGN PATENT DOCUMENTS

EP 0859399 A2 * 8/1998

OTHER PUBLICATIONS

Wayne O. Duescher, Three-point spindle-supported floating abrasive platen, U.S. Appl. No. 12/661,212, filed Mar. 12, 2010. Earliest Publication No: US 20110223835 A1 Earliest Publication Date: Sep. 15, 2011.

(Continued)

*Primary Examiner* — George Nguyen
(74) *Attorney, Agent, or Firm* — Mark A. Litman & Associates, P.A.

(57) ABSTRACT

Hard-material, flat-surfaced workpieces such as semiconductor wafers or sapphire disks are attached with vacuum to the flexible elastomeric membrane of a wafer carrier that allows one surface of the workpiece to be in conformal abrading contact with a moving flat-surfaced abrasive. The elastomeric membrane external wafer attachment surface has a pattern of recessed vacuum grooves and vacuum is supplied to the grooves to firmly attach the rigid-material silicon wafer in flat-surfaced contact with the membrane. The attached wafer seals the vacuum grooves and also provides lateral stiffness to the center portion of the membrane. An outer annular extension of the flexible elastomer membrane maintains the wafer at its original membrane-centered location when abrading forces are applied to the rotating wafer. The rotating wafer peripheral edge does not contact a rigid retaining ring during a wafer polishing procedure. Fixed-abrasive disks or raised-island abrasive disks are attached to a rotatable flat-surfaced platen.

20 Claims, 16 Drawing Sheets

Related U.S. Application Data filed on Jan. 13, 2014, which is a continuation-in-part of application No. 14/148,729, filed on Jan. 7, 2014, which is a continuation-in-part of application No. 13/869,198, filed on Apr. 24, 2013, which is a continuation-in-part of application No. 13/662,863, filed on Oct. 29, 2012.

(56) References Cited

U.S. PATENT DOCUMENTS

| | | | |
|---|---|---|---|
| 5,205,082 | A | 4/1993 | Shendon et al. |
| 5,329,732 | A | 7/1994 | Karlsrud et al. |
| 5,335,453 | A | 8/1994 | Baldy et al. |
| 5,364,655 | A | 11/1994 | Nakamura et al. |
| 5,421,768 | A | 6/1995 | Fujiwara et al. |
| 5,423,716 | A * | 6/1995 | Strasbaugh ............ B23B 31/307 269/21 |
| 5,443,416 | A | 8/1995 | Volodarsky et al. |
| 5,449,316 | A * | 9/1995 | Strasbaugh ............. B24B 37/30 451/287 |
| 5,569,062 | A | 10/1996 | Karlsrud |
| 5,597,346 | A | 1/1997 | Hempel, Jr. |
| 5,624,299 | A * | 4/1997 | Shendon ................ B24B 37/042 451/28 |
| 5,643,053 | A | 7/1997 | Shendon |
| 5,643,067 | A | 7/1997 | Katsuoka et al. |
| 5,683,289 | A | 11/1997 | Hempel, Jr. |
| 5,738,574 | A | 4/1998 | Tolles et al. |
| 5,769,697 | A | 6/1998 | Nishio |
| 5,800,254 | A | 9/1998 | Motley et al. |
| 5,874,318 | A | 2/1999 | Baker et al. |
| 5,910,041 | A | 6/1999 | Duescher |
| 5,916,009 | A | 6/1999 | Izumi et al. |
| 5,916,016 | A * | 6/1999 | Bothra .................. B24B 37/107 451/289 |
| 5,944,583 | A | 8/1999 | Cruz et al. |
| 5,961,169 | A | 10/1999 | Kalenian et al. |
| 5,964,651 | A | 10/1999 | Hose |
| 5,964,653 | A * | 10/1999 | Perlov ..................... B24B 37/30 451/285 |
| 5,967,882 | A | 10/1999 | Duescher |
| 5,975,997 | A | 11/1999 | Minami |
| 5,985,093 | A | 11/1999 | Chen |
| 5,989,104 | A | 11/1999 | Kim et al. |
| 5,993,298 | A | 11/1999 | Duescher |
| 5,993,302 | A | 11/1999 | Chen et al. |
| 6,024,630 | A | 2/2000 | Shendon et al. |
| 6,027,398 | A | 2/2000 | Numoto et al. |
| 6,048,254 | A | 4/2000 | Duescher |
| 6,050,882 | A | 4/2000 | Chen |
| 6,056,632 | A | 5/2000 | Mitchel et al. |
| 6,074,277 | A | 6/2000 | Arai |
| 6,074,289 | A * | 6/2000 | Murakami ............... B24B 37/30 257/E21.23 |
| 6,080,050 | A | 6/2000 | Chen et al. |
| 6,089,959 | A | 7/2000 | Nagahashi |
| 6,102,777 | A | 8/2000 | Duescher et al. |
| 6,116,993 | A | 9/2000 | Tanaka |
| 6,120,352 | A | 9/2000 | Duescher |
| 6,126,993 | A | 10/2000 | Orcel et al. |
| 6,132,298 | A | 10/2000 | Zuniga et al. |
| 6,146,259 | A | 11/2000 | Zuniga et al. |
| 6,149,506 | A | 11/2000 | Duescher |
| 6,159,073 | A | 12/2000 | Wiswesser et al. |
| 6,162,116 | A | 12/2000 | Zuniga et al. |
| 6,165,056 | A | 12/2000 | Hayashi et al. |
| 6,168,506 | B1 | 1/2001 | McJunken |
| 6,179,956 | B1 | 1/2001 | Nagahara et al. |
| 6,183,354 | B1 | 2/2001 | Zuniga et al. |
| 6,217,433 | B1 | 4/2001 | Herrman et al. |
| 6,224,472 | B1 | 5/2001 | Lai et al. |
| 6,251,215 | B1 | 6/2001 | Zuniga et al. |
| 6,270,392 | B1 | 8/2001 | Hayashi et al. |
| 6,299,741 | B1 | 10/2001 | Sun et al. |
| 6,336,846 | B1 * | 1/2002 | Park ........................ B24B 37/32 451/288 |
| 6,361,420 | B1 | 3/2002 | Zuniga et al. |
| 6,371,838 | B1 | 4/2002 | Holzapfel |
| 6,390,901 | B1 | 5/2002 | Hiyama et al. |
| 6,390,905 | B1 | 5/2002 | Korovin et al. |
| 6,394,882 | B1 | 5/2002 | Chen |
| 6,398,906 | B1 | 6/2002 | Kobayashi et al. |
| 6,425,809 | B1 | 7/2002 | Ichimura et al. |
| 6,436,828 | B1 | 8/2002 | Chen et al. |
| 6,439,965 | B1 | 8/2002 | Ichino |
| 6,439,978 | B1 | 8/2002 | Jones et al. |
| 6,443,821 | B1 | 9/2002 | Kimura et al. |
| 6,447,368 | B1 | 9/2002 | Fruitman et al. |
| 6,491,570 | B1 | 12/2002 | Sommer et al. |
| 6,506,105 | B1 | 1/2003 | Kajiwara et al. |
| 6,558,232 | B1 | 5/2003 | Kajiwara et al. |
| 6,585,567 | B1 | 7/2003 | Black et al. |
| 6,585,850 | B1 * | 7/2003 | Kenji ..................... B24B 37/32 156/345.12 |
| 6,592,434 | B1 | 7/2003 | Vanell et al. |
| 6,592,439 | B1 | 7/2003 | Li et al. |
| 6,607,157 | B1 | 8/2003 | Duescher |
| 6,659,850 | B2 | 12/2003 | Korovin et al. |
| 6,663,466 | B2 | 12/2003 | Chen et al. |
| 6,672,949 | B2 | 1/2004 | Chopra et al. |
| 6,729,944 | B2 | 5/2004 | Birang et al. |
| 6,752,700 | B2 | 6/2004 | Duescher |
| 6,769,969 | B1 | 8/2004 | Duescher |
| 6,837,779 | B2 | 1/2005 | Smith et al. |
| 6,893,332 | B2 | 5/2005 | Castor |
| 6,896,584 | B2 | 5/2005 | Perlov et al. |
| 6,899,603 | B2 | 5/2005 | Homma et al. |
| 6,899,607 | B2 | 5/2005 | Brown |
| 6,899,609 | B2 | 5/2005 | Hong |
| 6,908,366 | B2 | 6/2005 | Gagliardi |
| 6,935,013 | B1 | 8/2005 | Markevitch et al. |
| 7,001,251 | B2 | 2/2006 | Doan et al. |
| 7,001,257 | B2 | 2/2006 | Chen et al. |
| 7,008,295 | B2 | 3/2006 | Wiswesser et al. |
| 7,008,303 | B2 | 3/2006 | White et al. |
| 7,014,535 | B2 | 3/2006 | Custer et al. |
| 7,018,275 | B2 | 3/2006 | Zuniga et al. |
| 7,018,906 | B2 | 3/2006 | Chen et al. |
| 7,029,380 | B2 | 4/2006 | Horiguchi et al. |
| 7,033,251 | B2 | 4/2006 | Elledge |
| 7,044,838 | B2 | 5/2006 | Maloney et al. |
| 7,070,490 | B2 * | 7/2006 | Chen ....................... B24B 37/30 451/289 |
| 7,081,042 | B2 | 7/2006 | Chen et al. |
| 7,086,929 | B2 | 8/2006 | Wiswesser et al. |
| 7,101,272 | B2 | 9/2006 | Chen et al. |
| 7,101,273 | B2 | 9/2006 | Tseng et al. |
| 7,125,313 | B2 | 10/2006 | Zelenski et al. |
| 7,144,304 | B2 | 12/2006 | Moore |
| 7,147,541 | B2 | 12/2006 | Nagayama et al. |
| 7,166,016 | B1 | 1/2007 | Chen |
| 7,250,368 | B2 | 7/2007 | Kida et al. |
| 7,276,446 | B2 | 10/2007 | Robinson et al. |
| 7,292,427 | B1 | 11/2007 | Murdoch et al. |
| 7,357,699 | B2 | 4/2008 | Togawa et al. |
| 7,367,867 | B2 | 5/2008 | Boller |
| 7,393,790 | B2 | 7/2008 | Britt et al. |
| 7,419,910 | B2 | 9/2008 | Minamihaba et al. |
| 7,422,634 | B2 | 9/2008 | Powell et al. |
| 7,445,847 | B2 | 11/2008 | Kulp |
| 7,446,018 | B2 | 11/2008 | Brogan et al. |
| 7,452,817 | B2 | 11/2008 | Yoon et al. |
| 7,456,106 | B2 | 11/2008 | Koyata et al. |
| 7,456,107 | B2 | 11/2008 | Keleher et al. |
| 7,470,169 | B2 | 12/2008 | Taniguchi et al. |
| 7,485,028 | B2 | 2/2009 | Wilkinson et al. |
| 7,485,241 | B2 | 2/2009 | Schroeder et al. |
| 7,488,235 | B2 | 2/2009 | Park et al. |
| 7,488,236 | B2 | 2/2009 | Shimomura et al. |
| 7,488,240 | B2 | 2/2009 | Saito |
| 7,491,116 | B2 | 2/2009 | Sung |
| 7,491,342 | B2 | 2/2009 | Kamiyama et al. |
| 7,507,148 | B2 | 3/2009 | Kitahashi et al. |

(56) References Cited

U.S. PATENT DOCUMENTS

| | | | |
|---|---|---|---|
| 7,510,974 B2 | 3/2009 | Li et al. |
| 7,520,798 B2 | 4/2009 | Muldowney et al. |
| 7,520,800 B2 | 4/2009 | Duescher |
| 7,527,271 B2 | 5/2009 | Oh et al. |
| 7,527,722 B2 | 5/2009 | Sharan |
| 7,553,214 B2 | 6/2009 | Menk et al. |
| 7,568,970 B2 | 8/2009 | Wang |
| 7,572,172 B2 | 8/2009 | Aoyama et al. |
| 7,579,071 B2 | 8/2009 | Huh et al. |
| 7,582,221 B2 | 9/2009 | Netsu et al. |
| 7,601,050 B2 | 10/2009 | Zuniga et al. |
| 7,614,939 B2 | 11/2009 | Tolles et al. |
| 7,618,529 B2 | 11/2009 | Ameen et al. |
| 7,632,434 B2 | 12/2009 | Duescher |
| 7,648,410 B2 | 1/2010 | Choi |
| 7,699,684 B2 | 4/2010 | Prasad |
| 7,708,621 B2 | 5/2010 | Saito |
| 7,731,568 B2 | 6/2010 | Shimomura et al. |
| 7,741,656 B2 | 6/2010 | Nakayama et al. |
| 7,753,761 B2 | 7/2010 | Fujita |
| 7,754,611 B2 | 7/2010 | Chen et al. |
| 7,762,870 B2 | 7/2010 | Ono et al. |
| 7,807,252 B2 | 10/2010 | Hendron et al. |
| 7,822,500 B2 | 10/2010 | Kobayashi et al. |
| 7,833,907 B2 | 11/2010 | Anderson et al. |
| 7,837,800 B2 | 11/2010 | Fukasawa et al. |
| 7,838,482 B2 | 11/2010 | Fukasawa et al. |
| 7,840,305 B2 | 11/2010 | Behr et al. |
| 7,883,397 B2 | 2/2011 | Zuniga et al. |
| 7,884,020 B2 | 2/2011 | Hirabayashi et al. |
| 7,897,250 B2 | 3/2011 | Iwase et al. |
| 7,922,783 B2 | 4/2011 | Sakurai et al. |
| 7,947,190 B2 | 5/2011 | Brown |
| 7,950,985 B2 | 5/2011 | Zuniga et al. |
| 7,955,964 B2 | 6/2011 | Wu et al. |
| 7,972,396 B2 | 7/2011 | Feng et al. |
| 8,002,860 B2 | 8/2011 | Koyama et al. |
| 8,021,215 B2 | 9/2011 | Zuniga et al. |
| 8,025,813 B2 | 9/2011 | Liu et al. |
| 8,029,640 B2 | 10/2011 | Zuniga et al. |
| 8,043,140 B2 | 10/2011 | Fujita |
| 8,047,899 B2 | 11/2011 | Chen et al. |
| 8,062,096 B2 | 11/2011 | Brusic et al. |
| 8,062,098 B2 | 11/2011 | Duescher |
| 8,066,551 B2 | 11/2011 | Chen et al. |
| 8,070,909 B2 | 12/2011 | Shanmugasundram et al. |
| 8,071,479 B2 | 12/2011 | Liu |
| 8,088,299 B2 | 1/2012 | Chen et al. |
| 8,101,060 B2 | 1/2012 | Lee |
| 8,101,093 B2 | 1/2012 | De Rege et al. |
| 8,157,615 B2 * | 4/2012 | Thallner ............... B32B 43/006 |
| | | | 451/289 |
| 8,256,091 B2 | 9/2012 | Duescher |
| 8,545,583 B2 | 10/2013 | Duescher |
| 2001/0034198 A1 * | 10/2001 | Kimura ................... B24B 37/32 |
| | | | 451/285 |
| 2004/0038625 A1 * | 2/2004 | Chandrasekaran ..... B24B 37/30 |
| | | | 451/11 |
| 2004/0175951 A1 * | 9/2004 | Chen ...................... B24B 37/30 |
| | | | 438/692 |
| 2004/0259476 A1 * | 12/2004 | Korovin .................. B24B 37/30 |
| | | | 451/6 |
| 2005/0118939 A1 | 6/2005 | Duescher |
| 2005/0272355 A1 * | 12/2005 | Jung ....................... B24B 37/30 |
| | | | 451/285 |
| 2008/0299875 A1 | 12/2008 | Duescher |
| 2010/0003904 A1 | 1/2010 | Duescher |
| 2011/0223835 A1 | 9/2011 | Duescher |
| 2011/0223836 A1 | 9/2011 | Duescher |
| 2011/0223838 A1 | 9/2011 | Duescher |
| 2014/0120806 A1 | 5/2014 | Duescher |
| 2014/0127976 A1 | 5/2014 | Duescher |
| 2014/0370787 A1 * | 12/2014 | Duescher ................ B24B 37/30 |
| | | | 451/41 |

OTHER PUBLICATIONS

Wayne O. Duescher, Three-point fixed-spindle floating-platen abrasive system, U.S. Appl. No. 12/799,841, filed May 3, 2010. Earliest Publication No: US 20110223836 A1 Earliest Publication Date: Sep. 15, 2011.

Wayne O. Duescher, Fixed-spindle and floating-platen abrasive system using spherical mounts, U.S. Appl. No. 12/807,802, filed Sep. 14, 2010. Earliest Publication No: US 20110223838 A1 Earliest Publication Date: Sep. 15, 2011.

* cited by examiner

VACUUM-GROOVED MEMBRANE ABRASIVE POLISHING WAFER WORKHOLDER

CROSS REFERENCE TO RELATED APPLICATIONS

This invention is a continuation-in-part of U.S. patent application Ser. No. 14/329,967 filed Jul. 13, 2014 that is a continuation-in-part of U.S. patent application Ser. No. 14/185,882 filed Feb. 20, 2014 that is a continuation-in-part of U.S. patent application Ser. No. 14/154,133 filed Jan. 13, 2014 that is a continuation-in-part of U.S. patent application Ser. No. 14/148,729 filed Jan. 7, 2014 that is a continuation-in-part of U.S. patent application Ser. No. 13/869,198 filed Apr. 24, 2013 that is a continuation-in-part of U.S. patent application Ser. No. 13/662,863 filed Oct. 29, 2012. These are each incorporated herein by reference in their entirety.

BACKGROUND OF THE INVENTION

Field of the Invention

The present invention relates to the field of abrasive treatment of surfaces such as grinding, polishing and lapping. In particular, the present invention relates to a high and low speed abrasive lapping or polishing workholder system for use with rotary, abrasive-coated flat-surfaced platens. The abrasive technology provides flat-surfaced and smooth-polished surfaces for semiconductor wafers and for other hard-material workpieces such as sapphire wafers or sapphire workpieces and ceramic or hard-metal rotary seals. The lapping and polishing production speeds of this system are many times faster than with conventional lapping systems.

In the present system, workpieces or wafers are attached with vacuum to the flexible elastomeric membrane of a wafer carrier that allows one surface of the workpiece to be in conformal abrading contact with a moving flat-surfaced abrasive. The elastomeric membrane external wafer attachment surface has a pattern of vacuum grooves and vacuum is supplied to the grooves to firmly attach the rigid-material silicon wafer in flat-surfaced contact with the membrane. The wafer provides lateral stiffness to the center portion of the membrane. An integral outer annular extension of the flexible elastomer membrane is attached to a rotatable rigid housing where the membrane annular extension maintains the wafer at its original location when abrading forces are applied to the wafer. The wafer peripheral edge does not contact a rigid retaining ring during a wafer polishing procedure.

To provide uniform material removal across the full surface of the workpiece, the carrier is rotated in the same direction as the platen at the same desired high rotation speeds as the platen. Often these rotating platens and workholder carriers have abrading speeds of over 10,000 surface feet per minute (SFPM). Here, a 12 inch diameter abrasive coated platen, and a workpiece carrier, can operate at 3,000 rpm to obtain these desired high abrading speeds. Larger diameter abrasive coated platens are rotated at slower speeds to attain these same high abrading speeds. Diamond abrasive particles are often used as they provide unexcelled material removal rates at high abrading speeds especially for flat-lapping of hard-material workpieces such as rotary sealing devices.

Conventional flexible membrane carrier heads loosely attach thin silicon wafers to a nominally-flat bottom surface of the membrane. The membrane is intentionally made flexible in a direction along the flat surface of the wafer to allow the outer periphery of the wafer to be in rolling contact with a rigid annular ring that surrounds the wafer. Here, the wafer having abrading forces applied to its abraded surface is confined within the carrier head by the rigid wafer retaining ring. These substantial abrading forces are transmitted through the laterally-stiff body of the wafer directly to the rigid retainer ring. The abrading forces are not transmitted through the flexible membrane.

With conventional wafer polishing, wafers are loosely attached to a membrane flat surface by a suction-bonding technique. A wafer is placed on a flat surface and the carrier head is moved into position over the wafer where both the wafer and the circular membrane are concentric. Then the membrane is pressed to be in flat-surfaced conformity with the wafer exposed flat surface. A weak suction-bond is established between the wafer and the membrane when all of the air is pushed out of the gap between the wafer and the flexible membrane. This suction-bond is sufficiently strong to transport the wafer to and from the wafer storage systems and to the rotatable resilient CMP pad that is surface-saturated with a liquid abrasive slurry mixture. After the wafer is pressed into conformal contact with the CMP pad and the pad is rotated, the weak suction-bond of the wafer does not need to resist the abrading forces applied to the wafer because the laterally-rigid wafer transmits these forces directly to the rigid wafer retainer ring.

However, the rolling contact of the outer periphery of the rigid, brittle and fragile silicon wafer with the retainer ring as the wafer is rotated can create abrading process problems. First, the fragile wafer edge can become cracked because of the rolling contact where dynamically changing abrading forces are concentrated at the point of contact of the wafer and the retainer ring. Here, when a circular wafer contacts an annular ring, the contact area is geometrically concentrated at a point. Also, neither the wafer nor the retainer ring has precisely circular surfaces. Any out-of-round portion of either of these will tend to concentrate the contact force at these circular high-spot areas.

Further, grooves tend to be worn into the annular wall surface of the retainer ring by the rolling-contact wafers. Then, when abrading forces are applied perpendicular to the wafer surface by the workholder carrier head pressure chamber, the wafer edge can become trapped in the retainer ring grooves. This lack of movement freedom of the wafer perpendicular to the wafer surface can prevent the application of a uniform abrading pressure on the wafer at its outer periphery. This non-uniform abrading pressure can result in non-uniform abrading of the wafer surface.

If wafer retainer rings are constructed from extremely hard materials, wear of the retainer ring is reduced but damage to the wafer edges is increased. Use of softer retainer ring materials helps increase the size of the contact area which reduces the localized stress on the wafer edge. However, softer retainer ring materials increases the wear of the retainer ring and the formation of annular grooves. Retainer rings are replaced periodically to minimize these problems.

Wafers are prepared for CMP pad polishing by grinding a curved spherical-type edge on the outer periphery edge of the wafer. Each wafer curved surface is different and the nominal thickness of each wafer is slightly different. The contact grooves worn into the retainer ring by these different-sized wafers affect the contact behavior of the wafers during a wafer polishing operation.

Other wafers are configured with one side cut-off to provide a straight-edge to orient or register the wafer during fabrication. This edge-cut wafer results in two contact points at the intersection of the cut line and the wafer outer circle. When this style of wafer is rotated, all of the wafer-restraining forces are concentrated at these two junction points as the wafer is rotated and the wafer edge contacts the retainer ring during a polishing operation.

Generally, the membrane type of carrier is rotated at very slow speeds. In part, these slow speeds are required to minimize damage to the edge of the wafer as it is rolling contact with the retainer ring. Also, localized distortion of the resilient CMP pad as it contacts the abraded surface of the wafer requires the CMP pad to be rotated at slow speeds. These slow abrading speeds result in slow material removal rates from the surface of the wafer. Carrier heads can also have multiple annular pressure chambers to provide annular zones of higher or lower abrading pressures across the radial surface of the wafer.

The flexibility of the wafer and the flexible carrier bottom allows applied fluid pressure applied to pressure chambers that are an integral part of the flexible membrane to exert a controlled abrading pressure across the surface of the wafer to provide uniform material removal from the full surface of the wafer.

With the present system, the planar-stiff silicon semiconductor wafers are flexible in a vertical direction that is perpendicular to the surface of the wafer but are very stiff in a horizontal direction that is in the plane of the wafer surface. Here, the planar-stiff wafers are firmly attached to the membrane surface with vacuum which rigidizes the whole inner circular portion of the flexible membrane along its nominally-flat surface area that is in contact with the wafer. However, both the membrane and the attached wafer are flexible in a vertical direction that is perpendicular to the flat surface of the wafer. The workpiece carrier head has a radial free-span annular portion of the membrane that is located between the outer periphery of the wafer and the inner portion of a rigid membrane restraining ring. Here the outer periphery of the membrane is attached to the rigid membrane-restraining ring that surrounds the wafer. The radial flexibility of the annular portion of the elastomer membrane that extends radially outward from the outer periphery of the wafer has substantial radial stiffness but has perpendicular flexibility. This allows the wafer to be moved vertically against a flat surfaced abrasive coated platen where the abrading force is uniform across the full surface of the wafer and the wafer is restrained laterally in the plane of the wafer by the radial free-span annular portion of the flexible membrane.

High speed flat lapping is typically performed using flexible abrasive disks that have an annular band of abrasive-coated raised islands. These raised-island disks are attached to flat-surfaced platens that rotate at high abrading speeds. Coolant water is applied to the abrading surface to remove heat generated by the abrading action, and also, to remove abrading debris. The use of the raised island disks prevent hydroplaning of the lapped workpieces when they are lapped at high speeds with the presence of coolant water. Hydroplaning causes the workpieces to tilt which results in non-flat lapped workpiece surfaces. Excess water is routed from contact with the workpiece flat surfaces into the recessed passageways that surround the abrasive coated raised island structures. The coolant water also continuously flushes the abrading debris from the top abrasive surface of the raised-island into the recessed channels.

Also, by using wafers that extend out slightly over both the inner and outer annular edges of the fixed abrasive, the abrasive is worn down uniformly across the annular-band surface of the raised islands. Uniform wear of the abrasive coated raised islands across the radial width of the annular band of abrasive continually provides a precision-flat abrasive surface that contacts the abraded surface of the wafers. If desired, a conditioning tool can periodically be used to refine the flat surface of the raised island abrasive.

To operate successfully at high abrading speeds, the flexible abrasive disks are conformally attached to the flat surfaces of precision-flat rotary platens. Also, the abrasive disks must be precisely uniform in thickness across their full annular abrading surface to provide full utilization of all the abrasive and to provide smooth abrading contact with the workpiece. Abrasive disks having circumferential thickness variations will provide undesirable "bumpy" abrasive contact with a wafer when the disks are rotated at high speeds. The flexible disks are quickly attached to the platens with the use of vacuum. A range of sizes of abrasive particles are typically used to optimize an abrading operation. Diamond particles, having a size of 30 microns encapsulated in ceramic beads that are coated on the top surfaces of the raised islands are used for coarse abrading. An abrasive disk having medium sized diamond particles of 10 or 3 microns is then used. The final polish is then done by sub-micron sized diamond particles.

Conventional wafer-polishing workholders are typically very limited to slow speeds and can not attain the high rotational speeds that are required for high speed lapping and polishing. Even very thin and ultra-hard disks such as sapphire can be easily abraded and polished at very high production rates with this high speed abrading system especially when using diamond abrasives. Extremely hard tungsten carbide (used as cutting tool bits for machine tools) can be "cut like butter" using diamond abrasives at high speeds>

The slide-pin arm-driven workholders having flexible annular diaphragm devices provide that a wide range of uniform abrading pressures can be applied across the full abraded surfaces of the workpieces such as semiconductor wafers. These slide-pin devices also allow the workholder carrier device flexible membrane to provide flat-surfaced contact of workpieces that are attached to the workholder device with a flat-surfaced abrasive coating on a rotating abrading platen. Also, one or more of the workholders can be used simultaneously with a rotary abrading platen.

Flat lapping of workpiece surfaces used to produce precision-flat and mirror smooth polished surfaces is required for many high-value parts such as semiconductor wafers and rotary seals. The accuracy of the lapping or abrading process is constantly increased as the workpiece performance, or process requirements, become more demanding. Required workpiece feature tolerances for flatness accuracy, the amount of material removed, the part thickness and the smoothness of the polish become more progressively more difficult to achieve with existing abrading machines and abrading processes. In addition, it is necessary to reduce the processing costs without sacrificing performance.

The chemical mechanical planarization (CMP) liquid-slurry abrading system has been the system-of-choice for polishing newly-deposited surface-layers on semiconductor wafers that are already exceedingly flat. During CMP polishing, a very small amount of material is removed from the surface of the wafer. Typically the amount of material removed by polishing is measured in angstroms where the overall global flatness of the wafer is not affected much. It is critical that the global flatness of the wafer surface is maintained in a precision-flat condition to allow new patterned layers of metals and insulating oxides to be deposited on the wafer surfaces with the use of photolithography techniques. Global flatness is a measure of the flatness across the full surface of the wafer. Site or localized flatness of a wafer refers to the flatness of a localized portion of the wafer surface where the photolithography deposition patterns are made.

The semiconductor industry has used wafer carrier heads having flexible polymer membranes for many years to polish the semiconductor-side surface of wafers after the deposition of layers of materials that form new semiconductor devices and electrical conductors. These membrane-type carrier heads are mostly used with flexible CMP pads that are saturated with a liquid abrasive slurry. However, the same type of membrane carrier head is also used to polish wafers with fixed-abrasive-island types of web-sheets of abrasive. The CMP pads are resilient and the carrier head thrusts the wafers down into the surface-depths of the rotating pads as the wafers are rotated. The fixed-abrasive web-sheets are quite rigid and they are supported by a stationary polymer platen which is also quite rigid so the wafers "ride" on the surface of the fixed-abrasive. Both the resilient CMP pads and the rigid fixed-abrasive sheets provide acceptable polishing of the semiconductor wafers.

Deformation of the CMP pads allows the pads to provide somewhat uniform abrading pressures across the full inner diameter of the wafer. However, distortion of the CMP pads occurs at the periphery of the wafer as the rotating pad moves against the stationary-positioned but rotating wafer. This wafer-edge pad distortion causes excessive wafer deposition material removal at the outer annular portion of the wafer. As a result, the polished wafer is not precisely flat across the full surface of the wafer. In order to compensate for the uneven material removal across the surface of the wafer due to the wafer-periphery CMP pad distortion, multiple annular abrading pressure chambers are used with these membrane-type wafer carrier heads.

The abrading pressure is independently controlled in each annular membrane chamber to attempt uniform material removal at different annular portions of the wafer. However, these independent pressure chambers are at fixed locations within the carrier head where each pressure zone is adjacent to another zone. Here, the abrading rate of each annular pressure fixed-position zone is completely different than that in a directly adjacent zone as the pressure in each zone is different. From an abrading standpoint here, there is no logical reason that the non-uniform abrading of a wafer by a CMP pad has step variations that occur exactly at the annular demarcation lines that exist at the locations of the independent flexible membrane pressure zones. Rather, it is expected that the material removal rate will have a smooth (non-step) variation radially across the surface of the rotating wafer. The use of more independent annular pressure chambers improves the performance somewhat.

When flexible membranes having one or more independent abrading pressure chambers are used where wafers are attached by suction-bonding the wafers to the bottom nominally-flat membrane surface, rigid wafer-retaining rings are commonly used with these carrier heads. The flexible membrane has little stiffness in a lateral direction along the surface of the wafer so the stiff circular wafer disk is forced against the rigid wafer-retaining rings that surround the wafer perimeter. As the wafer rotates, the substantial abrading forces imposed on the wafer abraded surface urges the wafer edge to be in rolling contact with the outer retaining ring. The relatively thin silicon wafers are brittle and fragile so damage to the wafer can easily occur as the wafer if polished. Slow rotational speeds of the wafer are required with this operation because of the continual lateral movement of the elastomer membrane and the attached wafer. If the retainer rings are not used, the wafer would not be contained within the confines of the wafer carrier head.

It is well known that the rate of material removal at localized portions of the wafer are directly proportional to both the abrading speed and the abrading pressure that exist at these localized portions. For CMP polishing, a resilient CMP pad is attached to a rotatable platen and the wafer is attached to a rotatable carrier. The wafer carrier and the pad can be rotated in the same direction at the same rotation speeds to provide a uniform localized abrading speed over the full surface of the wafer. Often the rotational speed of the wafer is half, or less, than the rotational speed of the CMP pad which can be well below the optimal speed of the wafer. However, it is quite difficult to provide a uniform localized abrading pressure over the full surface of the wafer because of the distortions of the resilient pad when the wafer is thrust down into the surface-depths of the moving pad. Because these localized abrading pressures are not uniform, the material removal rates from the surface of the wafer are not uniform.

Wear patterns on the surface of the CMP pad itself can be a cause of non-uniform material removal on wafers. Because of the travel path of the wafer relative to the larger-sized CMP pad, the inner annular portion of the pad can become more worn than the inner and outer annular portions of the pad. This non-level pad surface results in non-uniform surface shapes of the wafer. Also, when a pad is used for some time, the pad tends to accumulate abrading debris and worn abrasive particles, often in the central annular region of the pad. This contaminated central area of the pad can result in above-average aggressive material removal of portions of the wafer surface. Wafers tend to have "domed" or "dished" central portions, depending on the conditions of the pad and the relative rotational speeds of both the pad and the wafer. CMP pads are typically continuously "dressed" with sharp-edged diamond tools to break-up the debris caused hardened surfaces of the pad. More surface debris is generated by these pad dressing tools.

Liquid abrasive slurry is continually supplied to the surface of the pads but there is little movement of the spent slurry, containing dull abrasive particles, pad particles and wafer debris from the surface of the large flat pads to a region off the surface of the pads. The wafers are in constant abrading contact with this debris. CMP pads are changed as their effective use life is quite limited.

The individual fibers of a resilient CMP pad are considered to protrude upward from the nominal surface of the pad where the free ends of these individual fibers are in abrading contact with the surface of a polished wafer. When a high-spot of a rotating wafer contacts the protruding ends of these fibers, the pad fiber free ends are pushed down by this high spot as it moves past the individual fibers. Due to the nature of the construction of the resilient pads and also due to the liquid abrasive slurry that coats the pads, it takes some time for the "pushed-down" individual fibers to recover their full original protruded heights after the wafer moving high spot has passed. This motion-damping effect of the pad body and its protruding fiber ends is enhanced by the presence of the liquid slurry. Here, the low-spot areas of the rotating wafer that directly follow the high-spot areas are not contacted effectively with the depressed fiber ends that do not have enough time to "spring-back" to their original protruded heights. The result is less amounts of material are removed from the deposition layer on the low-spot areas of the wafer than was preferentially removed from the high-spot areas of the wafer.

The whole object of removing a uniform depth of the deposited semiconductor material across the full surface of the wafer can not be achieved unless the wafer is rotated slow enough that the damped individual fiber ends of the CMP pads have time to "spring back" enough to provide uniform abrading pressures. By comparison, when a fixed-abrasive raised-island, rigid-thickness abrasive disk is used for abrading at high speeds, there is no abrasive surface "spring-back" issue because the abrasive surface is rigid.

Another cause of non-uniform material removal from a wafer surface is the deformation of the wafer into a free-standing non-flat condition by the high temperature furnace processing of the wafers. Uneven heating of the wafer by radiation typically causes the outer periphery of the wafer to heat up more rapidly than the inner central portion of the wafer. This uneven temperature causes thermal stresses in the wafer which distort the wafer. Non-uniform heating of the wafer can cause saddle-shaped wafers. Non-uniform cooling of the wafer can cause cone-shaped wafers. Each wafer has different semiconductor die patterns, different semiconductor materials and different thermal processing which results in different amounts of deformation and different patterns of deformation for individual wafers. These wafer non-flat deformations are present prior to the individual wafers being abrasively polished.

For the use of the stationary-position fixed abrasive web-sheets, the membrane type carrier head rotates at same time it pivots on an eccentric crank-shaft swing-arm to provide uniform localized abrading speeds across the full surface of the wafer. The flexibility of the carrier head membrane can provide near-uniform abrading pressure at the localized areas of the wafer during the polishing action. The rigid-thickness raised-island abrasive web does not provide a precision-flat abrasive surface as it is supported by a large flat platen surface made of a polymer that is not precisely flat. Also, the wafer is swept in a path that tends to leave a worn recessed annular central area having raised abrasive walls that are encountered by the wafer as the abrasive web is periodically incremented forward. These raised annular walls primarily contact the outer periphery of the wafers which results in a non-uniform polishing of the wafer surface.

Presently, wafers typically range in size from 4 to 12 inches (300 mm) diameter and are typically 0.027 inches (680 microns) thick and have unpolished deposited semiconductor coatings that are about 2 microns (about 0.1 thousands of an inch) thick. Large diameter 450 mm (18 inches) wafers being developed can also be polished by this system. Deposited semiconductor coatings on the wafer are then abraded and polished to have a resultant thickness of approximately 0.8 microns (about 0.03 thousandths of an inch) where the variation of the polished coating deposition layer is only about 0.02 microns. This very small variation is about 1 millionth of an inch or about 0.1 lightbands. A 12 inch diameter wafer that is only 0.027 inches thick is nominally quite flexible perpendicular to its planar surface even though it is made from silicon, which is quite stiff. These wafers have this substantial thickness to allow them to be repetitively handled during the multiple manufacturing steps required to produce the individual semiconductor chips. After the wafer has been completed, the back side of the wafer is ground off to produce a very thin wafer that is scribed and cut into individual chips. Also, the circular wafers need to be relatively thick because their outer periphery edges contact a rigid retainer ring to contain the wafer in a carrier head when large lateral abrading friction forces are applied to the wafer surface in a polishing operation as the flexible membranes can not provide this support.

When a wafer is loosely attached to a carrier head by pressing the wafer into intimate contact with the flexible nominally-flat membrane, the wafer becomes attached to the membrane by "suction" forces. Here, neither the wafer nor the flexible membrane assumes a flat-surfaced shape. The relatively thin wafer tends to flex with the flexed membrane to create controlled localized abrading forces as pressure is applied to the carrier pressure chamber that is part of the membrane. The nominally non-flat but thin wafers are pressed into a relatively more-flat condition against the abrasive slurry CMP pad (or fixed-abrasive web sheet) by the carrier head flexible membrane which has an abrading pressure applied to it by the internal pressure chamber. Because the flexible wafer is held in pressurized contact with the abrasive CPM pad (or abrasive island web) by the flexible membrane, material is removed quite uniformly across most of the abraded surface of the wafer, completely independent of reference to the back side of the wafer.

However, when a photolithographic device is used to create a material deposition pattern on a semiconductor device, the wafer is backside-mounted on a precision-flat platen with vacuum. Thus, the critical focusing of the photolithographic device across the full selected pattern area on the front side of a wafer is indirectly referenced to the back side of the wafer. The whole localized patterned area of the wafer being exposed to the light source is laterally positioned under the photolithographic device by a stepper device that moves the platen-attached wafer horizontally in two independent and perpendicular directions. Even though the stepper platen can be rotated spherically, it is important that the front polished surface of the wafer is precisely flat relative to the flat back-side surface of the wafer to minimize the localized spherical adjustment of the wafer as the different selected areas of the wafer are sequentially exposed.

Free-standing wafers are often non-flat as they assume curled shapes when not attached to a flat surface. When a wafer is conformally attached to a flat rigid platen, the exposed surface of the wafer assumes the shape of the platen if the two opposed surfaces of the wafer are perfectly parallel to each other. If a platen is not precisely flat, the exposed surface of the wafer will not be precisely flat. For a rigid abrading system, any variation in the flatness of the abraded surface of the wafer that exceeds the desired uniformity of 0.02 microns can prevent uniform material removal on a wafer surface.

With the present membrane wafer polishing system, the fixed abrasive is supported by a rigid rotatable platen having a precision-flat abrading surface. The wafer abraded surface assumes a uniform flat surface as it conforms to the flat abrasive surface. As the abrading pressure is uniform across the full abraded surface of the wafer, material removal is uniform across the full abraded surface of the wafer. This uniformity of material removal is achieved because of the stable and rigid precision flatness of the abrasive coated platen.

A level-coated fixed-abrasive disk or a raised-island abrasive disk can be used with the precision-flat platen to achieve these highly desirable uniform material removals from a polished wafer surface. Also, a thin liquid abrasive slurry coating can be applied to a rigid precisely-flat surface of a rotatable platen to provide uniform material removal using the vacuum-grooved flexible elastomer membrane workpiece carrier head. The raised-island disks having an annular band of fixed-abrasive coated islands can be used at very high abrading speeds with water coolant without hydroplaning. A flexible disk with an annular level-coating of fixed-abrasive can be used with water coolant but only at very low abrading speeds to avoid hydroplaning. The liquid abrasive slurry coated platen is also used at very low abrading speeds. All three of these abrasive media provide a rigid or semi-rigid flat-surfaced abrading surface because they are supported by or are attached to a precision-flat rigid rotary platen.

By contrast, when a conventional flexible membrane workpiece carrier head is used with a liquid abrasive slurry saturated resilient CMP pad, the outer periphery of a wafer experiences excessive material removal due to the wafer being plunged into the surface depths of the resilient CMP pad during a wafer polishing procedure. Both the wafer and the CPM pad are distorted out-of-plane during the CMP pad abrasive slurry wafer polishing procedure.

It is difficult to construct a lapping or polishing machine that has a rigid carrier attached to a rotating spindle where the spindle axis is maintained in precisely perpendicular alignment with a precision-flat surfaced rotating abrasive coated platen. Here, it is critical this alignment exists to provide precision-flat workpieces and wafers. However, the lack of precision perpendicular alignment of a rigid wafer carrier head spindle axis with the top surface of a platen abrasive can be overcome by the use of the flexible-membrane type of carrier head where the wafer abraded surface assumes conformal contact with the platen abrasive surface.

This invention references commonly assigned U.S. Pat. Nos. 5,910,041; 5,967,882; 5,993,298; 6,048,254; 6,102,777; 6,120,352; 6,149,506; 6,607,157; 6,752,700; 6,769,969; 7,632,434; 7,520,800; 8,062,098; 8,256,091; 8,328,600; and 8,545,583; 8,647,171; 8,647,172 and U.S. patent application Ser. Nos. 12/661,212; 12/799,841; 13/665,759; 13/869,198; 14/148,729 and 14/154,133 and all contents of which are incorporated herein by reference.

U.S. Pat. No. 7,614,939 (Tolles et al) describes a CMP polishing machine that uses flexible pads where a conditioner device is used to maintain the abrading characteristic of the pad. Multiple CMP pad stations are used where each station has different sized abrasive particles. U.S. Pat. No. 4,593,495 (Kawakami et al) describes an abrading apparatus that uses planetary workholders. U.S. Pat. No. 4,918,870 (Torbert et al) describes a CMP wafer polishing apparatus where wafers are attached to wafer carriers using vacuum, wax and surface tension using wafer. U.S. Pat. No. 5,205,082 (Shendon et al) describes a CMP wafer polishing apparatus that uses a floating retainer ring. U.S. Pat. No. 6,506,105 (Kajiwara et al) describes a CMP wafer polishing apparatus that uses a CMP with a separate retaining ring and wafer pressure control to minimize over-polishing of wafer peripheral edges. U.S. Pat. No. 6,371,838 (Holzapfel) describes a CMP wafer polishing apparatus that has multiple wafer heads and pad conditioners where the wafers contact a pad attached to a rotating platen. U.S. Pat. No. 6,398,906 (Kobayashi et al) describes a wafer transfer and wafer polishing apparatus. U.S. Pat. No. 7,357,699 (Togawa et al) describes a wafer holding and polishing apparatus and where excessive rounding and polishing of the peripheral edge of wafers occurs. U.S. Pat. No. 7,276,446 (Robinson et al) describes a web-type fixed-abrasive CMP wafer polishing apparatus.

U.S. Pat. No. 6,425,809 (Ichimura et al) describes a semiconductor wafer polishing machine where a polishing pad is attached to a rigid rotary platen. The polishing pad is in abrading contact with flat-surfaced wafer-type workpieces that are attached to rotary workpiece holders. These workpiece holders have a spherical-action universal joint. The universal joint allows the workpieces to conform to the surface of the platen-mounted abrasive polishing pad as the platen rotates. However, the spherical-action device is the workpiece holder and is not the rotary platen that holds the fixed abrasive disk.

U.S. Pat. No. 6,769,969 (Duescher) describes flexible abrasive disks that have annular bands of abrasive coated raised islands. These disks use fixed-abrasive particles for high speed flat lapping as compared with other lapping systems that use loose-abrasive liquid slurries. The flexible raised island abrasive disks are attached to the surface of a rotary platen to abrasively lap the surfaces of workpieces.

U.S. Pat. No. 8,062,098 (Duescher) describes the use of a spherical-action workpiece carrier that has an off-set center of rotation that coincides with the abraded surface of the workpiece. This device prevents tilting of the workpiece caused by abrading forces that are applied on the workpiece abraded surface. A spherical bearing is incorporated in the carrier to provide this spherical action motion as the workpiece is rotated by the carrier.

U.S. Pat. No. 8,328,600 (Duescher) describes the use of spherical-action mounts for air bearing and conventional flat-surfaced abrasive-covered spindles used for abrading where the spindle flat surface can be easily aligned to be perpendicular to another device. Here, in the present invention, this type of air bearing and conventional flat-surfaced abrasive-covered spindles can be used where the spindle flat abrasive surface can be easily aligned to be perpendicular with the rotational axis of a floating bellows-type workholder device.

Various abrading machines and abrading processes are described in U.S. Pat. No. 5,364,655 (Nakamura et al). U.S. Pat. No. 5,569,062 (Karlsrud), U.S. Pat. No. 5,643,067 (Katsuoka et al), U.S. Pat. No. 5,769,697 (Nisho), U.S. Pat. No. 5,800,254 (Motley et al), U.S. Pat. No. 5,916,009 (Izumi et al), U.S. Pat. No. 5,964,651 (Hose), U.S. Pat. No. 5,975,997 (Minami, U.S. Pat. No. 5,989,104 (Kim et al), U.S. Pat. No. 6,089,959 (Nagahashi, U.S. Pat. No. 6,165,056 (Hayashi et al), U.S. Pat. No. 6,168,506 (McJunken), U.S. Pat. No. 6,217,433 (Herrman et al), U.S. Pat. No. 6,439,965 (Ichino), U.S. Pat. No. 6,893,332 (Castor), U.S. Pat. No. 6,896,584 (Perlov et al), U.S. Pat. No. 6,899,603 (Homma et al), U.S. Pat. No. 6,935,013 (Markevitch et al), U.S. Pat. No. 7,001,251 (Doan et al), U.S. Pat. No. 7,008,303 (White et al), U.S. Pat. No. 7,014,535 (Custer et al), U.S. Pat. No. 7,029,380 (Horiguchi et al), U.S. Pat. No. 7,033,251 (Elledge), U.S. Pat. No. 7,044,838 (Maloney et al), U.S. Pat. No. 7,125,313 (Zelenski et al), U.S. Pat. No. 7,144,304 (Moore), U.S. Pat. No. 7,147,541 (Nagayama et al), U.S. Pat. No. 7,166,016 (Chen), U.S. Pat. No. 7,250,368 (Kida et al), U.S. Pat. No. 7,367,867 (Boller), U.S. Pat. No. 7,393,790 (Britt et al), U.S. Pat. No. 7,422,634 (Powell et al), U.S. Pat. No. 7,446,018 (Brogan et al), U.S. Pat. No. 7,456,106 (Koyata et al), U.S. Pat. No. 7,470,169 (Taniguchi et al), U.S. Pat. No. 7,491,342 (Kamiyama et al), U.S. Pat. No. 7,507,148 (Kitahashi et al), U.S. Pat. No. 7,527,722 (Sharan) and U.S. Pat. No. 7,582,221 (Netsu et al).

Also, various CMP machines, resilient pads, materials and processes are described in U.S. Pat. No. 8,101,093 (de Rege Thesauro et al.), U.S. Pat. No. 8,101,060 (Lee), U.S. Pat. No. 8,071,479 (Liu), U.S. Pat. No. 8,062,096 (Brusic et al.), U.S. Pat. No. 8,047,899 (Chen et al.), U.S. Pat. No. 8,043,140 (Fujita), U.S. Pat. No. 8,025,813 (Liu et al.), U.S. Pat. No. 8,002,860 (Koyama et al.), U.S. Pat. No. 7,972,396 (Feng et al.), U.S. Pat. No. 7,955,964 (Wu et al.), U.S. Pat. No. 7,922,783 (Sakurai et al.), U.S. Pat. No. 7,897,250 (Iwase et al.), U.S. Pat. No. 7,884,020 (Hirabayashi et al.), U.S. Pat. No. 7,840,305 (Behr et al.), U.S. Pat. No. 7,838,482 (Fukasawa et al.), U.S. Pat. No. 7,837,800 (Fukasawa et al.), U.S. Pat. No. 7,833,907 (Anderson et al.), U.S. Pat. No. 7,822,500 (Kobayashi et al.), U.S. Pat. No. 7,807,252 (Hendron et al.), U.S. Pat. No. 7,762,870 (Ono et al.), U.S. Pat. No. 7,754,611 (Chen et al.), U.S. Pat. No. 7,753,761 (Fujita), U.S. Pat. No. 7,741,656 (Nakayama et al.), U.S. Pat. No. 7,731,568 (Shimomura et al.), U.S. Pat. No. 7,708,621 (Saito), U.S. Pat. No. 7,699,684 (Prasad), U.S. Pat. No. 7,648,410 (Choi), U.S. Pat. No. 7,618,529 (Ameen et al.), U.S. Pat. No. 7,579,071 (Huh et al.), U.S. Pat. No. 7,572,172 (Aoyama et al.), U.S. Pat. No. 7,568,970 (Wang), U.S. Pat. No. 7,553,214 (Menk et al.), U.S. Pat. No. 7,520,798 (Muldowney), U.S. Pat. No. 7,510,974 (Li et al.), U.S. Pat. No. 7,491,116 (Sung), U.S. Pat. No. 7,488,236 (Shimomura et al.), U.S. Pat. No. 7,488,240 (Saito), U.S. Pat. No. 7,488,235 (Park et al.), U.S. Pat. No. 7,485,241 (Schroeder et al.), U.S. Pat. No. 7,485,028 (Wilkinson et al), U.S. Pat. No. 7,456,107 (Keleher et al.), U.S. Pat. No. 7,452,817 (Yoon et al.), U.S. Pat. No. 7,445,847 (Kulp), U.S. Pat. No. 7,419,910 (Minamihaba et al.), U.S. Pat. No. 7,018,906 (Chen et al.), U.S. Pat. No. 6,899,609 (Hong), U.S. Pat. No. 6,729,944 (Birang et al.), U.S. Pat. No. 6,672,949 (Chopra et al.), U.S. Pat. No. 6,585,567 (Black et al.), U.S. Pat. No. 6,270,392 (Hayashi et al.), U.S. Pat. No. 6,165,056 (Hayashi et al.), U.S. Pat. No. 6,116,993 (Tanaka), U.S. Pat. No. 6,074,277 (Arai), U.S. Pat. No. 6,027,398 (Numoto et al.), U.S. Pat. No. 5,985,093 (Chen), U.S. Pat. No. 5,944,583 (Cruz et al.), U.S. Pat. No. 5,874,318 (Baker et al.), U.S. Pat. No. 5,683,289 (Hempel Jr.), U.S. Pat. No. 5,643,053 (Shendon),), U.S. Pat. No. 5,597,346 (Hempel Jr.).

Other wafer carrier heads are described in U.S. Pat. No. 5,421,768 (Fujiwara et al.), U.S. Pat. No. 5,443,416 (Volodarsky et al.), U.S. Pat. No. 5,738,574 (Tolles et al.), U.S. Pat. No. 5,993,302 (Chen et al.), U.S. Pat. No. 6,050,882 (Chen), U.S. Pat. No. 6,056,632 (Mitchel et al.), U.S. Pat. No. 6,080,050 (Chen et al.), U.S. Pat. No. 6,126,116 (Zuniga et al.), U.S. Pat. No. 6,132,298 (Zuniga et al.), U.S. Pat. No. 6,146,259 (Zuniga et al.), U.S. Pat. No. 6,179,956 (Nagahara et al.), U.S. Pat. No. 6,183,354 (Zuniga et al.), U.S. Pat. No. 6,251,215 (Zuniga et al.), U.S. Pat. No. 6,299,741 (Sun et al.), U.S. Pat. No. 6,361,420 (Zuniga et al.), U.S. Pat. No. 6,390,901 (Hiyama et al.), U.S. Pat. No. 6,390,905 (Korovin et al.), U.S. Pat. No. 6,394,882 (Chen), U.S. Pat. No. 6,436,828 (Chen et al.), U.S. Pat. No. 6,443,821 (Kimura et al.), U.S. Pat. No. 6,447,368 (Fruitman et al.), U.S. Pat. No. 6,491,570 (Sommer et al.), U.S. Pat. No. 6,506,105 (Kajiwara et al.), U.S. Pat. No. 6,558,232 (Kajiwara et al.), U.S. Pat. No. 6,592,434 (Vanell et al.), U.S. Pat. No. 6,659,850 (Korovin et al.), U.S. Pat. No. 6,837,779 (Smith et al.), U.S. Pat. No. 6,899,607 (Brown), U.S. Pat. No. 7,001,257 (Chen et al.), U.S. Pat. No. 7,081,042 (Chen et al.), U.S. Pat. No. 7,101,273 (Tseng et al.), U.S. Pat. No. 7,292,427 (Murdock et al.), U.S. Pat. No. 7,527,271 (Oh et al.), U.S. Pat. No. 7,601,050 (Zuniga et al.), U.S. Pat. No. 7,883,397 (Zuniga et al.), U.S. Pat. No. 7,947,190 (Brown), U.S. Pat. No. 7,950,985 (Zuniga et al.), U.S. Pat. No. 8,021,215 (Zuniga et al.), U.S. Pat. No. 8,029,640 (Zuniga et al.), and U.S. Pat. No. 8,088,299 (Chen et al.).

A number of other carrier heads are described in the following patents: U.S. Pat. No. 5,329,732 (Karlsrud et al), U.S. Pat. No. 5,449,316 (Strasbaugh), U.S. Pat. No. 5,423,716 (Strasbaugh), U.S. Pat. No. 5,335,453 (Baldy et al.), U.S. Pat. No. 5,964,653 (Perlov et al.), U.S. Pat. No. 5,961,169 (Kalenian et al.), U.S. Pat. No. 6,024,630 (Shendon et al.), U.S. Pat. No. 6,159,073 (Wiswesser et al.), U.S. Pat. No. 6,162,116 (Zuniga et al.), U.S. Pat. No. 6,224,472 (Lai et al.), U.S. Pat. No. 6,439,978 (Jones et al.), U.S. Pat. No. 6,663,466 (Chen et al.), U.S. Pat. No. 6,592,439 (Li et al.), U.S. Pat. No. 6,908,366 (Gagliardi), U.S. Pat. No. 7,008,295 (Wiswesser et al.), U.S. Pat. No. 7,018,275 (Zuniga et al.), U.S. Pat. No. 7,086,929 (Wiswesser), U.S. Pat. No. 7,101,272 (Chen et al.), U.S. Pat. No. 7,527,271 (Oh et al.), U.S. Pat. No. 8,021,215 (Zuniga et al.), U.S. Pat. No. 8,066,551 (Chen et al.), U.S. Pat. No. 8,070,909 (Shanmugasundram et al).

All references cited herein are incorporated in their entirety by reference.

SUMMARY OF THE INVENTION

Semiconductor wafers are attached to a carrier head that has an elastomer flexible bottom membrane where the wafer is attached to this membrane bottom with vacuum. A pattern of open shallow vacuum grooves are present on the exposed bottom flat surface of the elastomeric membrane. A wafer is placed in flat-surfaced contact with the membrane where the wafer surface seals the open vacuum grooves and vacuum is applied to the grooves. This applied vacuum creates a vacuum pressure across the surface of the wafer which firmly attaches the wafer to the flexible membrane where the wafer and the membrane mutually conform to each other. The circular silicon wafer is very rigid in the plane of the wafer but the thin wafer is somewhat flexible in a direction that is perpendicular to the planar surface of the wafer. The membrane assumes the planar rigidity of the wafer in the central region of the circular membrane where the wafer is attached.

An outer periphery annular portion of the membrane extends radially past the outer periphery of the attached wafer. This membrane outer annular portion is flexible in a direction that is perpendicular to the planar surface of the wafer but the elastomeric membrane outer annular portion is substantially stiff in a radial direction that is in the plane of the wafer. The membrane flexible annular outer portion is restrained radially at its outer periphery by a rigid membrane-restraining ring. Here, both the membrane and the attached wafer are flexible in a direction that is perpendicular to the planar surface of the wafer but both the membrane and the attached wafer are restrained radially by the elastomeric membrane outer annular portion that is substantially stiff in a radial direction that is in the plane of the wafer. When the surface of the wafer is subjected to abrading forces, the wafer remains radially-centered in the workpiece carrier head due to the planar stiffness of the wafer and due to the planar stiffness of the membrane flexible annular outer portion.

Unlike conventional membrane-type wafer carrier polishing heads, there is no rolling contact of the outer edge of the wafer with a rigid wafer-restraining ring during a wafer abrasive polishing procedure. Here, an integral outer annular extension of the flexible elastomer membrane is attached to a rotatable rigid housing where the radially-stiff membrane annular extension maintains the rotating circular wafer at its original position at the center of the circular membrane when abrading forces are applied to the wafer. Because of the radial stiffness of the elastomeric annular extension of the membrane, the center-restrained wafer peripheral edge does not contact a rigid retaining ring during a wafer polishing procedure. With this lack of rolling contact of the fragile silicon wafer with a rigid wafer retainer ring, no chipping of the wafer edge or other damage to the wafer occurs during a wafer polishing procedure. Also, the integral outer annular extension of the flexible elastomer membrane that is attached to a rotating carrier head housing transmits wafer rotational torque from the rotating housing to the wafer to rotate the wafer during a wafer polishing procedure.

Also, water cooled fixed-abrasive, raised-island flexible abrasive disks that are conformally attached to the precision-flat surface of a rotating platen are used to polish the wafer surface. And, unlike conventional liquid abrasive slurry polishing systems, the water coolant continually washes the wafer during the polishing procedure and the effort of removing the abrasive slurry from the wafer is eliminated. Further, the present invention system can be operated at very high abrading speeds with high productivity as compared to conventional nominally very slow CMP pad abrasive slurry wafer polishing systems.

The bottom flat surface of the membrane is sufficiently thick to allow the exterior surface to have patterns of shallow channels or grooves that can provide vacuum attachment of a wafer or workpiece to the membrane surface. A vacuum passageway and a vacuum source are provided for these vacuum grooves. Positive fluid pressure can also be supplied to these groves to separate the wafer from the membrane upon completion of a polishing procedure. Typically the vacuum surface grooves have curved upper groove-surfaces to allow the effective removal of abrading debris from the grooves by flushing the exposed vacuum grooves with water after an abrasively-polished wafer is separated from the membrane.

The membrane material or composite layers of a laminated membrane can be constructed from a variety of materials including thermoplastic and thermoset polyurethanes, woven cloths, individual polymer threads, carbon fibers, ceramic fibers, inorganic materials, organic materials and individual metal strands or woven metal strands, thin metals and composite or laminated layers of metals and non-metals. The elastomer membrane material can have a range of hardness of from 15 to 90 durometer. Laminated layers and reinforcing materials can be bonded together with adhesives, solvents or heat.

Single fibers or strands such as monofilaments or woven threads that are very stiff axially can be bonded to the membrane bottom surface with a nominal radial orientation to provide radial stiffness to the membrane. These fibers can preferably located at the outer circumference of the membrane and oriented in a radial direction to minimize the lateral stretching in the annular portion of the membrane that is located between the wafer periphery and a rigid ring that surrounds the wafer. Reinforcing fibers can bonded to the membrane as single strands or can have continuous loop patterns of long fiber strands. Mats of fiber cloth can also be bonded to the membrane.

The circular shaped wafer carrier membrane has a compliant layer of an elastomer that is flexible perpendicular to the membrane flat surface but is stiff radially along the membrane surface. This membrane provides radial support of the vacuum-attached wafer to minimize radial movement of the wafer with each revolution of a wafer as its abraded surface is subjected to abrading forces during an abrasive polishing operation. The wafer continually moves a small distance radially as it is rotated but the periphery of the wafer does not contact a rigid retainer ring during an abrading procedure. Moving contact of the rigid retainer ring by the wafer is avoided and the possibility of damage to the fragile and brittle silicon wafer edge is eliminated.

As the amount of material removal from the surface of a polished semiconductor wafer is so small (about 1 micron) there is an extremely small amount of vertical movement of the flexible membrane and the wafer toward the abrasive surface after a wafer polishing procedure is begun. Because of the very small vertical movement of the wafer, the angularity of the outer annular periphery of the membrane has little change. The result here is that the outer periphery of the membrane provides substantial radial support of the rotating wafer with little or no tendency to lift or push down the outer periphery of the wafer. It is desired to minimize these vertical forces on the edge of the wafer that would increase or decrease the abrading forces at that location.

Use of a longer radial span width of the outer periphery of the flat surface of the membrane in the annular zone between the wafer periphery and the membrane retainer ring minimizes the tilt angle of this outer annular zone. If the radial width of the annular free-span zone of the membrane is 1 inch and the vertical deflection of the wafer side of that zone is only 1 micron due to the wear-down polishing of the wafer surface, the resultant tilt angle of the annular membrane zone is insignificant. Correspondingly, the resultant changes in the lifting or pushing forces on the wafer periphery are insignificant.

The outboard edge of the free-span annular membrane that is located between the wafer and the membrane retainer ring is attached to the ring by mechanical clamps or adhesives or solvent bonding techniques. A minimal distance is provided between the bottom surface of the membrane in this annular zone and the moving surface of the abrasive coating on the platen. The flexible abrasive disk that is attached to the platen surface has a very uniform thickness so the top exposed surface of the moving abrasive is consistently at the same elevation. Also, the thicknesses of the wafers are consistently quite uniform at about 0.030 inches. The outer diameter annular free-span of the membrane is uniform in thickness so the attachment of the outer periphery of the membrane allows a controlled vertical gap to exist between the membrane and the moving abrasive.

All of the downward abrading pressure applied by the membrane to the wafer is confined to the area of the wafer by fluid abrading pressure that exists in a sealed abrading pressure chamber having the same approximate size as the flat surface of the wafer. The circular sealed abrading pressure chamber is formed in part by the flexible circular membrane and is located approximately concentric with the wafer that is attached to the flexible membrane.

The sealed abrading pressure chamber does not apply downward pressure directly on the outer free-span annular area of the membrane. The membrane in this annular zone has sufficient out-of-plane stiffness to prevent the membrane to droop within the zone where contact is made with the abrasive. The nominally small vertical gap between the body portions of the wafer carrier head and the moving abrasive is similar to the vertical gap used by conventional membrane-type wafer polishing heads.

The outer annular zone of the membrane can have an initial radial tensioning or the span tension can be neutral (no tension) or the membrane can be initially slack in this annular zone. A pre-tensioned membrane can provide extra-stiffness of the membrane in a radial direction but yet provide adequate flexibility in a perpendicular direction. A neutral-tensioned membrane provides minimal stiffness in a perpendicular direction but still provides stiffness in a radial direction. A slack membrane provides little perpendicular stiffness and little radial stiffness to the membrane initially but provides more stiffness to both when the wafer moves horizontally or laterally due to the applied abrading forces.

The present invention uses precision-thickness fixed-abrasive flexible disks having disk thickness variations of less than 0.0001 inches (3 microns) across the full annular bands of abrasive-coated raised islands to allow flat-surfaced contact with workpieces at very high abrading speeds. Use of a rotary platen vacuum flexible abrasive disk attachment system allows quick set-up changes where different sizes of abrasive particles and different types of abrasive material can be quickly attached to the flat platen surfaces.

Semiconductor wafers require extremely flat surfaces when using photolithography to deposit patterns of materials to form circuits across the full flat surface of a wafer. When theses wafers are abrasively polished between deposition steps, the surfaces of the wafers must remain precisely flat.

The same types of chemicals that are used in the conventional CMP pad polishing of wafers can also be used with this fixed-abrasive lapping or polishing system to enhance material removal rates. These liquid chemicals can be applied as a mixture with the coolant water that is used to cool both the wafers and the fixed abrasive coatings on the rotating abrading platen This mixture of coolant water and chemicals continually washes the abrading debris away from the abrading surfaces of the fixed-abrasive coated raised islands which prevents unwanted abrading contact of the abrasive debris with the abraded surfaces of the wafers.

Workpieces are often rotated at rotational speeds that are approximately equal to the rotational speeds of the platens to provide equally-localized abrading speeds across the full radial width of the platen annular abrasive when the workpiece spindles are rotated in the same rotation direction as the platens. To effectively use raised island abrasive disks at these very high abrading speeds, the disks must be precisely uniform in thickness and the rotating platen that the flexible disk is attached to must have a precision-flat surface.

The same types of abrading-process enhancing chemicals including ceria that are used in the conventional CMP polishing of wafers can be used with this abrasive lapping or polishing system. These liquid chemicals can be applied as a mixture with the coolant water that is used to cool both the wafers and the fixed abrasive coatings on the rotating abrading platen This mixture of coolant water and chemicals continually washes the abrading debris away from the abrading surfaces of the fixed-abrasive coated raised islands which prevents unwanted abrading contact of the abrasive debris with the abraded surfaces of the wafers. These same types of chemicals including ceria can also be mixed in liquid abrasive slurries that are also used to abrade or polish wafers.

DETAILED DESCRIPTION OF THE INVENTION

Figure 1:
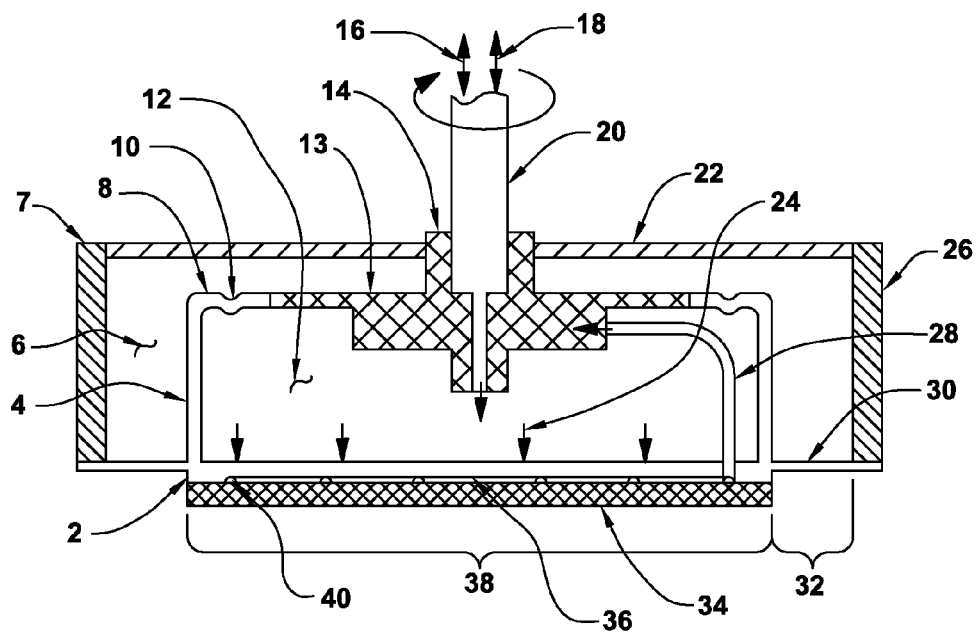
FIG. 1 is a cross section view of a membrane workpiece carrier rotation abrading device.

FIG. 1 is a cross section view of a membrane workpiece carrier rotation abrading device which is used for lapping or polishing semiconductor wafers or other workpiece substrates. A stationary workpiece carrier head 7 has a flat-surfaced workpiece 34 that is attached by vacuum to a floating workpiece carrier flexible elastomeric membrane 2 that is rotationally driven by an annular-wall device 26. A vertical rotatable hollow drive shaft 20 is supported by bearings (not shown) that are supported by a stationary-positioned rotatable carrier housing (not shown) where the rotatable carrier housing is adjustable in a vertical direction and is held stationary in a vertical position by an abrading machine frame (not shown). Rotational torque is supplied by the drive shaft 20 to an attached drive hub 14 that has an attached rotational drive device 22 that rotates the annular-wall device 26. Torque is transmitted from the annular-wall device 26 to a flexible membrane outer annular band 30 that is an integral extension of the flexible membrane 2 where the transmitted torque rotates both the flexible membrane 2 and the workpiece 34 that is attached to the flexible membrane 2.

The workpiece carrier flexible elastomeric membrane 2 that has a nominally-horizontal integral outer annular band 30 and also has a nominally-vertical annular wall 4 that has a nominally-horizontal annular portion 8 that can have an annular indentation 10. The upper membrane wall annular portion 8 is attached to the hub annular extension 13 of the drive hub 14 where a sealed pressure chamber 12 is formed by the membrane 2, the annular wall 4, the hub annular extension 13 and the drive hub 14. Pressurized fluid or vacuum 16 can be applied to the sealed pressure chamber 12 via the hollow drive shaft 20 create an abrading pressure 24 that is transmitted to the workpiece 34 through the thickness of the flexible membrane 2.

The flexible membrane 2 has a circular inner zone portion 38 and an integral outer annular band 30 annular portion 32 where the attached laterally-rigid semiconductor wafer workpiece 34 is firmly attached with vacuum to the flexible membrane 2 circular inner zone portion 38 which rigidizes the circular inner zone portion 38 of the membrane 2. Vacuum 18 is supplied through the hollow drive shaft 20 and through fluid passageways in the drive hub 14 to a flexible hollow tube 28 that is fluid-connected to grooved passageways 36, 40 in the exposed surface of the membrane 2. When a circular workpiece 34 is attached by the vacuum 18 to the membrane 2, the grooved vacuum passageways 36, 40 in the exposed surface of the membrane 2 are sealed by mutual flat-surfaced contact of the workpiece 34 and the membrane 2 circular inner zone portion 38.

The flexible elastomer membrane 2 circular inner zone portion 38 has a nominal thickness that ranges from 0.010 to 0.375 inches and the grooved vacuum passageways 36, 40 have a groove depth that ranges form 0.002 to 0.035 inches depending on the thickness of the membrane 2 circular inner zone portion 38. The cross-sectional shapes of the grooved vacuum passageways 36, 40 comprise half-circular, half-oval and rectangular shapes. Half-circular and half-oval cross-sectional shapes are preferred as the present continuous-curved shapes that are easy to clean with water or pressurized air to dislodge any accumulated abrading debris prior to attaching a "new" semiconductor wafer after an existing wafer has been abrasively polished.

Another annular non-pressurized vented chamber 6 surrounds the sealed pressure chamber 12. Pressurized fluid 18 can also be supplied to the flexible hollow tube 28 that is fluid-connected to grooved passageways 36, 40 in the exposed surface of the membrane 2 to provide fluid pressure to separate the workpiece 34 from the flexible membrane 2 upon completion of an abrading procedure. The flexible elastomeric membrane 2 flexible elastomeric integral outer annular band 30 annular portion 32 can flex in a vertical direction that is perpendicular to the nominally flat surface of the workpiece 34 which allows the workpiece 34 to move in a vertical direction when pressure or vacuum 16 is applied to the sealed pressure chamber 12. Flexible localized movement of the membrane 2 and its integral components, the annular wall 4, the annular portion 8 and the annular indentation 10 allow the workpiece 34 to assume flat-surfaced abrading contact with the flat surface of an abrasive coating (not shown) on a rotary flat-surfaced platen.

Figure 2:
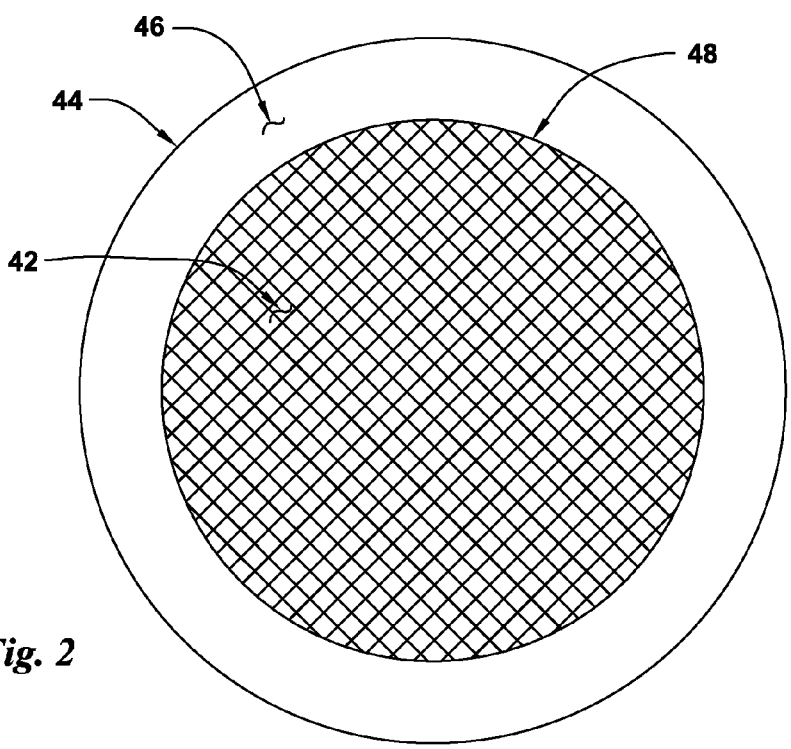
FIG. 2 is a top view of a membrane workpiece carrier rotation abrading device.

FIG. 2 is a top view of a membrane workpiece carrier rotation abrading device. A flexible elastomeric membrane 44 has a circular semiconductor wafer 48 attached to the central region 42 of the circular elastomeric membrane 44. The elastomeric membrane 44 also has an integral outer annular band 46 that is flexible in a direction that is perpendicular to the wafer 48 flat surface but is nominally stiff in a radial direction. The radial stiffness of the integral outer annular elastomeric band 46 maintains the circular wafer 48 nominally at the center of the circular elastomeric membrane 44 as the rotating wafer 48 is subjected to abrading forces by moving abrasive (not shown) that contacts the rotating wafer 48. Attachment of the radially-rigid wafer 48 to the flexible membrane 44 rigidizes the circular inner zone portion of the membrane 44.

Figure 3:
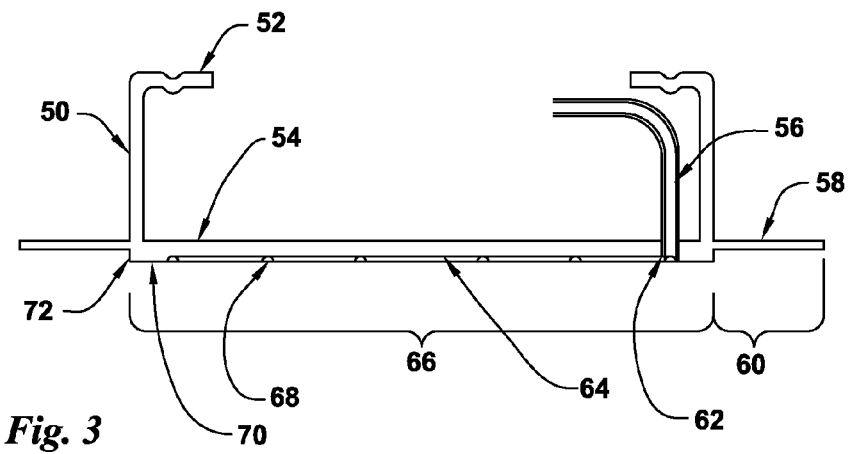
FIG. 3 is a cross section view of a workpiece carrier abrading device flexible membrane.

FIG. 3 is a cross section view of a workpiece carrier abrading device flexible membrane. A flexible elastomeric membrane 72 has a central region 66 and also has an integral outer annular band 58 outer region 60. Both the flexible elastomeric membrane 72 central region 66 and the integral outer annular band 58 outer region 60 are flexible in a direction that is perpendicular to the circular membrane 72 flat surface 70 but are nominally stiff in a radial direction. The elastomeric membrane 72 has an integral annular wall 50 that has an integral angled wall top 52 where the angled wall top 52 allows vertical motion of the annular wall 50 and the elastomeric membrane 72 when abrading pressure is applied to the inner surface 54 of the elastomeric membrane 72.

A flexible hollow tube 56 is attached to the elastomeric membrane 72 at the fluid joint 62 which allows vacuum or fluid pressure to be supplied to the grooved radial fluid passageways 64 that supply vacuum or fluid pressure to the grooved annular fluid passageways 68. Vacuum that is present in the grooved passageways 64, 68 attaches wafers or workpieces (not shown) to the flat bottom surface 70 of the elastomeric membrane 72 and fluid pressure present in the grooved passageways 64, 68 allows the wafers or workpieces to be separated from the flat bottom surface 70 of the elastomeric membrane 72.

Figure 4:
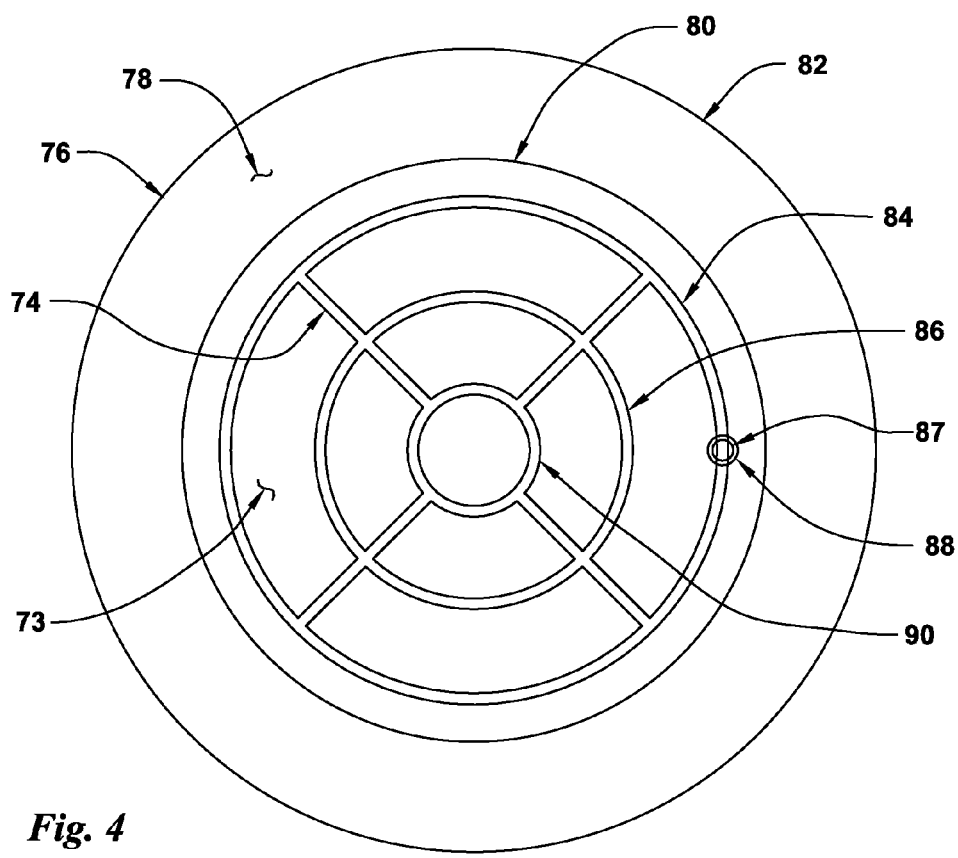
FIG. 4 is a top view of a vacuum-grooved workpiece carrier flexible membrane.

FIG. 4 is a top view of a workpiece carrier abrading device flexible membrane. A flexible elastomeric membrane 76 has a central region 80 and also has an integral outer annular band 82 outer region 78. Both the flexible elastomeric membrane 76 central region 80 and the integral outer annular band 82 outer region 78 are flexible in a direction that is perpendicular to the circular membrane 76 flat surface 73 but are nominally stiff in a radial direction.

A flexible hollow tube 87 is attached to the elastomeric membrane 76 at the fluid joint 88 which allows vacuum or fluid pressure to be supplied to both the grooved annular fluid passageways 84 and to the grooved radial fluid passageways 74. Vacuum that is present in the grooved passageways 74, 84 attaches wafers or workpieces (not shown) to the flat bottom surface 73 of the elastomeric membrane 76 and fluid pressure present in the grooved passageways 64, 68 allows the wafers or workpieces to be separated from the flat bottom surface 73 of the elastomeric membrane 76. The elastomeric membrane 76 is shown with three annular grooved open-type passageways 84, 86 and 90 where more or fewer annular grooved open-type passageways can be used to attach wafers or workpieces to the flat bottom surface 73 of the elastomeric membrane 76.

Figure 5:
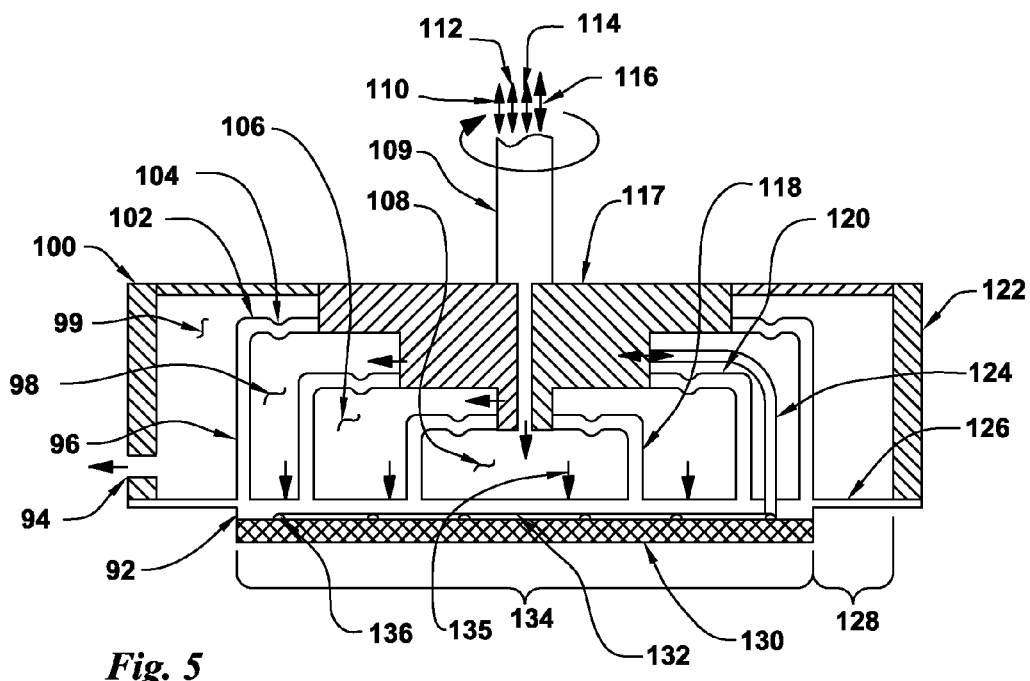
FIG. 5 is a cross section view of a workpiece carrier with multiple flexible membranes.

FIG. 5 is a cross section view of a flexible membrane vacuum-grooved carrier with multiple pressure chambers. A flat-surfaced workpiece 130 is attached with vacuum to a nominally-horizontal floating workpiece carrier rotor 100 having a flexible membrane 92 that is rotationally driven by a drive hub 117 that is attached to a hollow drive shaft 109.

Pressurized air or another fluid such as water 110, 112 and 114 or vacuum is supplied through the hollow drive shaft 109 that has fluid passages which allows multiple pressurized air or another fluid such as water 110, 112 and 114 to fill the independent sealed pressure chambers 98, 106 and 108 that are formed by the sealed annular flexible elastomer walls 118 and the elastomer membrane 92. Different controlled fluid 110, 112 and 114 pressures are present in each of the independent annular or circular sealed chambers 98, 106 and 108 to provide uniform abrading action across the full flat abraded surface of the workpiece 130 that is in abrading contact with the abrasive coating (not shown) on the rotary platen (not shown).

The flexible membrane 92 has a circular inner zone portion 134 and an integral outer annular band 126 annular portion 128 where the attached laterally-rigid semiconductor wafer workpiece 130 is firmly attached with vacuum to the flexible membrane 92 circular inner zone portion 134 which rigidizes the circular inner zone portion 134 of the membrane 92. Vacuum 116 is supplied through the hollow drive shaft 109 and through fluid passageways in the drive hub 117 to a flexible hollow tube 124 that is fluid-connected to grooved passageways 132, 136 in the exposed surface of the elastomeric membrane 92. When a circular workpiece 130 is attached by the vacuum 116 to the membrane 92, the grooved vacuum passageways 132, 136 in the exposed surface of the membrane 92 are sealed by mutual flat-surfaced contact of the workpiece 130 and the membrane 92 circular inner zone portion 134.

Vacuum or pressure can be supplied independently to the annular or circular sealed chambers 98, 106 and 108 and vacuum 116 can be provided through passageways in the drive hub 117 from a rotary fluid union (not shown). A flexible hollow tube 124 that is attached to the flexible elastomer membrane 92 can provide attachment of workpieces 130 to the central flexible bottom portion of the membrane 92 and fluid pressure can be applied to the flexible hollow tube 124 to separate the workpiece or wafer from the flexible elastomer membrane 92 upon completion of the procedure to abrasively lap, abrade or polish the wafer 130. A combination of vacuum or pressures in the individual chambers 98, 106 and 108 may be used to optimize the uniform abrading of the abraded surface of the workpieces 130. An outer annular chamber 99 has a vent hole 94 to prevent pressure variations in the chamber 99 as the other adjacent chambers 98, 106 and 108 are pressurized.

The elastomeric membrane 92 has integral annular walls 96 that have integral angled wall tops 102 where the angled wall tops 102 and optionally, angled wall top out-of plane distortions 104, allows vertical motion of the annular walls 96 and the elastomeric membrane 92 when abrading pressures 135 are applied to the inner surface of the elastomeric membrane 92. A rigid annular drive member 122 is attached to the drive hub 117 and is attached to the outer periphery of the elastomeric membrane 92 integral or attached flexible elastomeric outer annular band 126. Here, rotation of the rotatable hub 117 rotates the rigid annular drive member 122 and the attached elastomeric outer annular band 126 and the workpiece 130 that is attached by vacuum to the elastomeric membrane workpiece holder 92

Figure 6:
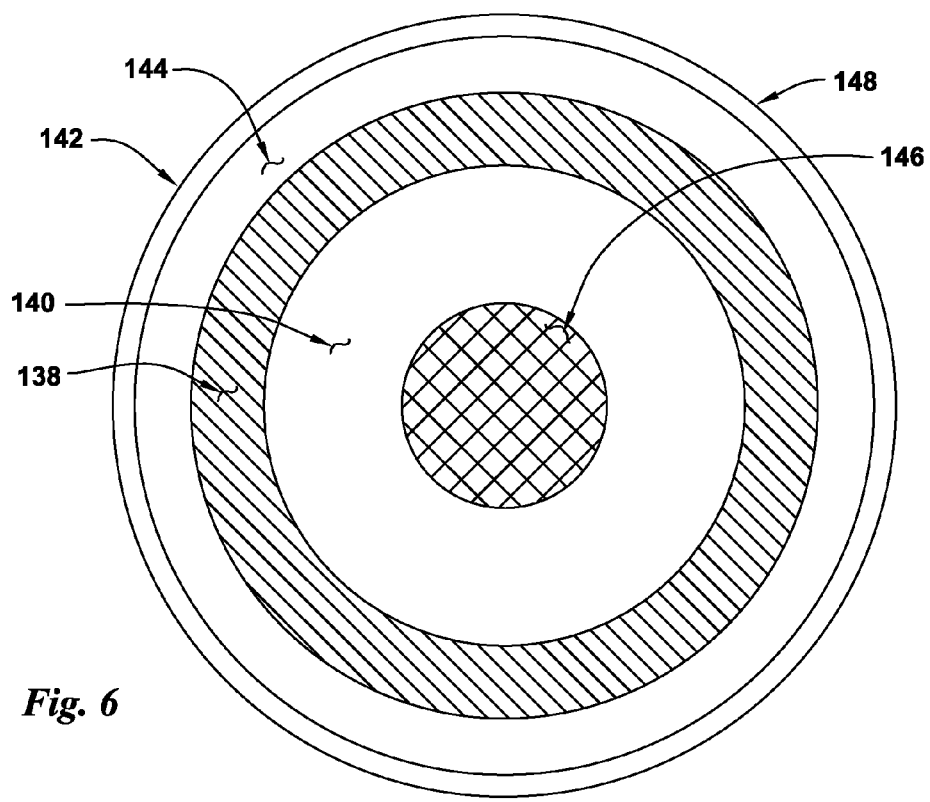
FIG. 6 is a top view of a workpiece carrier with multiple flexible membrane chambers.

FIG. 6 is a top view of a driven workpiece carrier with multiple pressure chambers. A elastomeric membrane flexible-bottom workpiece holder 142 has an annular outer abrading pressure zone 138, an annular inner abrading pressure zone 140 and a circular inner abrading pressure zone 146. The abrading pressure is independently controlled in each of the three zones 138, 140 and 146. The device shown here has three independent pressure zones but other device embodiments can have five or more independent pressure zones. The elastomeric membrane workpiece holder 142 has an integral or attached flexible elastomeric outer annular band 144 that is also attached to a rotatable hub 148 where rotation of the rotatable hub 148 rotates the elastomeric outer annular band 144 and the workpiece (not shown) that is attached by vacuum to the elastomeric membrane workpiece holder 142.

Figure 7:
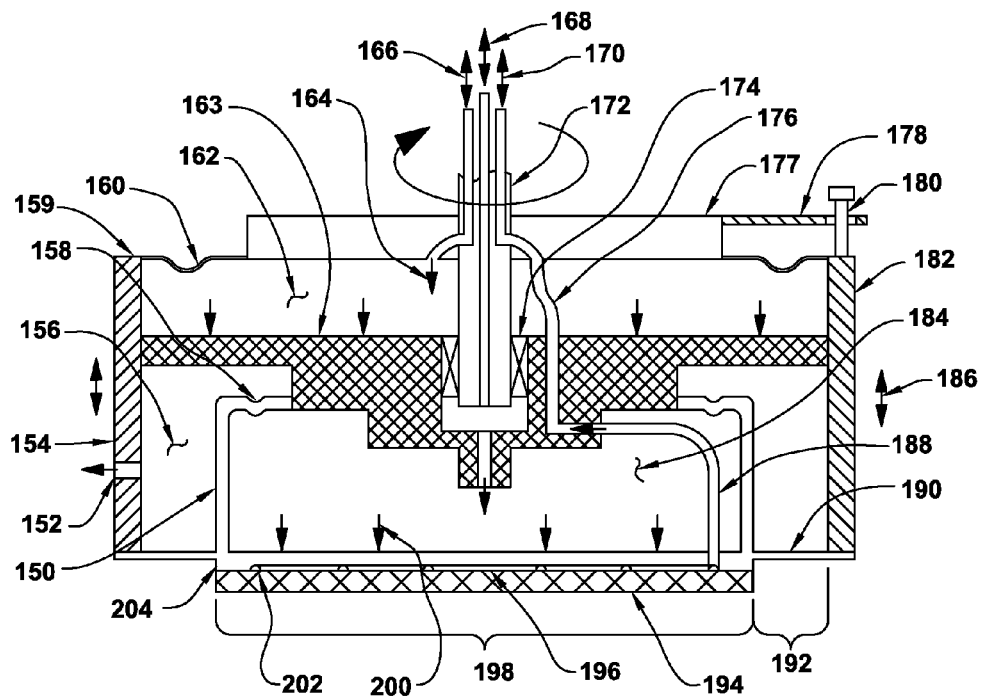
FIG. 7 is a cross section view of a pin-driven membrane workpiece carrier abrading device.

FIG. 7 is a cross section view of a pin-driven vacuum-grooved membrane workpiece carrier abrading device. A workpiece carrier head 159 has a flat-surfaced workpiece 194 that is attached to a slidable workpiece carrier rotor housing 154 attached flexible membrane 204 where the rotor housing 154 is rotationally driven by a drive-pin device 180. A nominally-horizontal drive plate 163 is supported by slidable shaft bearings 174 that are attached to a hollow drive shaft 172 where the carrier housing 154 can be raised and lowered in a vertical direction 186 by sliding in the bearings 174 along the hollow drive shaft 172.

A rigid drive hub 177 that is attached to the hollow drive shaft 172 has an attached rotational drive arm 178 where rotation of the hollow drive shaft 172 rotates the rotational drive arm 178. The slidable drive-pin device 180 is attached a rigid annular member 182 that is attached to the rotor housing 154 and rotation of the drive arm 178 that is in sliding contact with the drive-pin device 180 causes the rotor housing 154 to rotate. An annular flexible diaphragm device 160 that is attached to the rigid drive hub 177 and to the rotor housing 154 forms a sealed pressure chamber 162 and the flexible diaphragm device 160 allows the slidable workpiece carrier rotor housing 154 to be translated vertically 186 along the rotational axis of the rotatable hollow drive shaft 172.

Fluid pressure or vacuum 166 can be supplied to fluid passageways in the rotatable hollow drive shaft 172 to create a pressure or vacuum 164 in the sealed pressure chamber 162 where the pressure 164 moves the carrier rotor housing 154 vertically downward and where vacuum 164 moves the carrier rotor housing 154 vertically upward.

The workpiece carrier head 154 has a flat-surfaced workpiece 194 that is attached by vacuum to a floating workpiece carrier flexible elastomeric membrane 204 that is rotationally driven by the rotor housing 154. The vertical rotatable hollow drive shaft 172 is supported by bearings (not shown) that are supported by a stationary-positioned rotatable carrier housing (not shown) where the rotatable carrier housing is adjustable in a vertical direction and is held stationary in a vertical position by an abrading machine frame (not shown). Rotational torque is supplied by the drive shaft 172 to rotate the annular-wall device 182 and the rotor housing 154. Torque is transmitted from the annular-wall device 182 to a flexible membrane outer annular band 190 that is an integral extension of the flexible membrane 204 where the transmitted torque rotates both the flexible membrane 204 and the workpiece 194 that is attached to the flexible membrane 204.

The workpiece carrier flexible elastomeric membrane 204 that has a nominally-horizontal integral outer annular band 190 also has a nominally-vertical annular wall 150 that has a nominally-horizontal annular portion 158 that can have an annular indentation. The upper membrane wall annular portion 158 is attached to the drive hub 163 where a sealed pressure chamber 184 is formed by the membrane 204, the annular wall 150, the annular portion 158 and the drive hub 163. Pressurized fluid or vacuum 168 can be applied to the sealed pressure chamber 184 via the hollow drive shaft 172 to create an abrading pressure 200 that is transmitted uniformly across the full abraded surface of the workpiece 194 through the thickness of the flexible membrane 204.

The flexible membrane 204 has a circular inner zone portion 198 and an integral outer annular band 190 annular portion 192 where the attached laterally-rigid semiconductor wafer workpiece 194 is firmly attached with vacuum to the flexible membrane 204 circular inner zone portion 198 which rigidizes the circular inner zone portion 198 of the membrane 204. Vacuum 170 is supplied through the hollow drive shaft 172 and through flexible fluid passageways 176 to the drive hub 163 to a flexible hollow tube 188 that is fluid-connected to grooved passageways 202 in the exposed surface of the membrane 204. When a circular workpiece 194 is attached by the vacuum 170 to the membrane 204, the grooved vacuum passageways 202 in the exposed surface of the membrane 204 are sealed by mutual flat-surfaced contact of the workpiece 194 and the membrane 204 circular inner zone portion 198.

Another annular non-pressurized vented chamber 156 having a vent hole 152 surrounds the sealed pressure chamber 184. Pressurized fluid 170 can also be supplied to the flexible hollow tube 188 that is fluid-connected to grooved passageways 202 in the exposed surface of the membrane 204 to provide fluid pressure to separate the workpiece 194 from the flexible membrane 204 upon completion of an abrading procedure. The flexible elastomeric membrane 204 flexible elastomeric integral outer annular band 190 annular portion 192 can flex in a vertical direction that is perpendicular to the nominally flat surface of the workpiece 194 which allows the workpiece 194 to move in a vertical direction when pressure or vacuum 168 is applied to the sealed pressure chamber 184. Flexible localized movement of the membrane 204 and its integral components, the annular wall 150 and the annular portion 158 allow the equivalent-floating workpiece 194 to assume conformal flat-surfaced abrading contact with the flat surface of an abrasive coating (not shown) on a rotary flat-surfaced platen (not shown).

Figure 8:
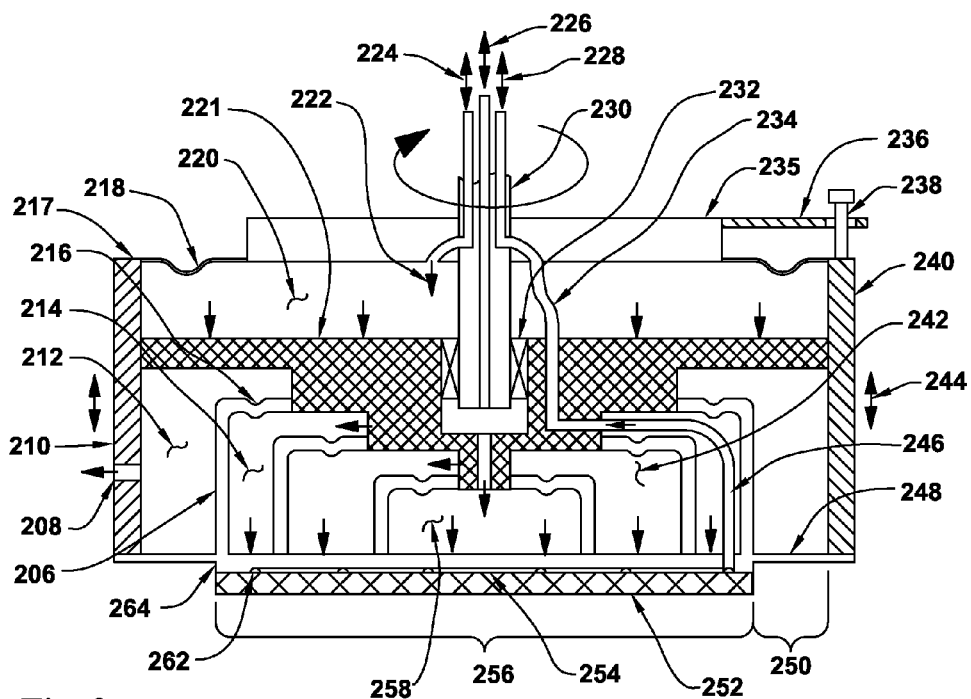
FIG. 8 is a cross section view of a pin-driven multiple-chamber workpiece carrier device.

FIG. 8 is a cross section view of a pin-driven multiple pressure chamber workpiece carrier device. A workpiece carrier head 217 has a flat-surfaced workpiece 252 that is attached to a slidable workpiece carrier rotor housing 210 attached flexible membrane 264 where the rotor housing 210 is rotationally driven by a drive-pin device 238. A nominally-horizontal drive plate 221 is supported by slidable shaft bearings 232 that are attached to a hollow drive shaft 230 where the carrier housing 210 can be raised and lowered in a vertical direction 244 by sliding in the bearings 232 along the hollow drive shaft 230.

A rigid drive hub 235 that is attached to the hollow drive shaft 230 has an attached rotational drive arm 235 where rotation of the hollow drive shaft 230 rotates the rotational drive arm 236. The slidable drive-pin device 238 is attached a rigid annular member 240 that is attached to the rotor housing 210 and rotation of the drive arm 236 that is in sliding contact with the drive-pin device 238 causes the rotor housing 210 to rotate. An annular flexible diaphragm device 218 that is attached to the rigid drive hub 235 and to the rotor housing 210 forms a sealed pressure chamber 220 and the flexible diaphragm device 218 allows the slidable workpiece carrier rotor housing 210 to be translated vertically 244 along the rotational axis of the rotatable hollow drive shaft 230.

Fluid pressure or vacuum 224 can be supplied to fluid passageways in the rotatable hollow drive shaft 230 to create a pressure or vacuum 222 in the sealed pressure chamber 220 where the pressure 222 moves the carrier rotor housing 210 vertically downward and where vacuum 222 moves the carrier rotor housing 210 vertically upward.

The workpiece carrier head 210 has a flat-surfaced workpiece 252 that is attached by vacuum to a floating workpiece carrier flexible elastomeric membrane 264 that is rotationally driven by the rotor housing 210. The vertical rotatable hollow drive shaft 230 is supported by bearings (not shown) that are supported by a stationary-positioned rotatable carrier housing (not shown) where the rotatable carrier housing is adjustable in a vertical direction and is held stationary in a vertical position by an abrading machine frame (not shown). Rotational torque is supplied by the drive shaft 230 to rotate the annular-wall device 240 and the rotor housing 210. Torque is transmitted from the annular-wall device 240 to a flexible membrane outer annular band 248 that is an integral extension of the flexible membrane 264 where the transmitted torque rotates both the flexible membrane 264 and the workpiece 252 that is attached to the flexible membrane 264.

The workpiece carrier flexible elastomeric membrane 264 that has a nominally-horizontal integral outer annular band 248 also has a nominally-vertical annular wall 206 that has a nominally-horizontal annular portion 216 that can have an annular indentation. The upper membrane wall annular portion 216 is attached to the drive hub 221 where a sealed pressure chamber 242 is formed by the membrane 264, the annular wall 206, the annular portion 216 and the drive hub 221. Pressurized fluid or vacuum 226 can be applied to the sealed pressure chamber 242 via the hollow drive shaft 230 to create an abrading pressure 200 that is transmitted uniformly across the full abraded surface of the workpiece 252 through the thickness of the flexible membrane 264. Other of the multiple abrading pressure chambers are 214 and 258.

The flexible membrane 264 has a circular inner zone portion 256 and an integral outer annular band 248 annular portion 250 where the attached laterally-rigid semiconductor wafer workpiece 252 is firmly attached with vacuum to the flexible membrane 264 circular inner zone portion 256 which rigidizes the circular inner zone portion 256 of the membrane 264. Vacuum 228 is supplied through the hollow drive shaft 230 and through flexible fluid passageways 234 to the drive hub 221 to a flexible hollow tube 246 that is fluid-connected to grooved passageways 254, 262 in the exposed surface of the membrane 264. When a circular workpiece 252 is attached by the vacuum 228 to the membrane 264, the grooved vacuum passageways 254, 262 in the exposed surface of the membrane 264 are sealed by mutual flat-surfaced contact of the workpiece 252 and the membrane 264 circular inner zone portion 256.

Another annular non-pressurized vented chamber 212 having a vent hole 208 surrounds the sealed pressure chamber 242. Pressurized fluid 228 can also be supplied to the flexible hollow tube 246 that is fluid-connected to grooved passageways 254, 262 in the exposed surface of the membrane 264 to provide fluid pressure to separate the workpiece 252 from the flexible membrane 264 upon completion of an abrading procedure. The flexible elastomeric membrane 264 flexible elastomeric integral outer annular band 248 annular portion 250 can flex in a vertical direction that is perpendicular to the nominally flat surface of the workpiece 252 which allows the workpiece 252 to move in a vertical direction when pressure or vacuum 226 is applied to the sealed pressure chamber 242. Flexible localized movement of the membrane 264 and its integral components, the annular wall 206 and the annular portion 216 allow the equivalent-floating workpiece 252 to assume conformal flat-surfaced abrading contact with the flat surface of an abrasive coating (not shown) on a rotary flat-surfaced platen (not shown).

Figure 9:
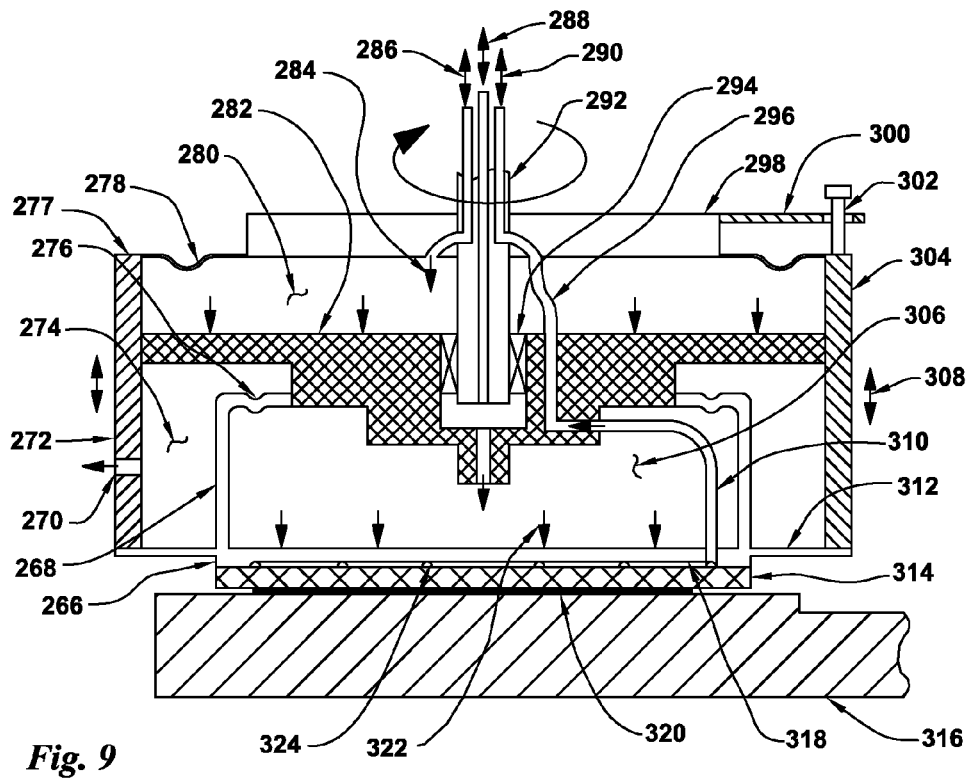
FIG. 9 is a cross section view of a membrane workpiece carrier with an abrasive platen.

FIG. 9 is a cross section view of a pin-driven vacuum-grooved flexible membrane workpiece carrier with a workpiece in abrading contact with an abrasive coated rotatable platen. The grooved-membrane carrier is used for flat-lapping hard material workpieces or polishing semiconductor wafers or other workpiece substrates such as sapphire substrates.

A workpiece carrier head 277 has a flat-surfaced workpiece 314 that is attached to a slidable workpiece carrier rotor housing 272 attached flexible membrane 266 where the rotor housing 272 is rotationally driven by a drive-pin device 302. A nominally-horizontal drive plate 282 is supported by slidable shaft bearings 294 that are attached to a hollow drive shaft 292 where the carrier housing 272 can be raised and lowered in a vertical direction 308 by sliding in the bearings 294 along the hollow drive shaft 292.

A rigid drive hub 298 that is attached to the hollow drive shaft 292 has an attached rotational drive arm 300 where rotation of the hollow drive shaft 292 rotates the rotational drive arm 300. The slidable drive-pin device 302 is attached a rigid annular member 304 that is attached to the rotor housing 272 and rotation of the drive arm 300 that is in sliding contact with the drive-pin device 302 causes the rotor housing 272 to rotate. An annular flexible diaphragm device 278 that is attached to the rigid drive hub 298 and to the rotor housing 272 forms a sealed pressure chamber 280 and the flexible diaphragm device 278 allows the slidable workpiece carrier rotor housing 272 to be translated vertically 308 along the rotational axis of the rotatable hollow drive shaft 292.

Fluid pressure or vacuum 286 can be supplied to fluid passageways in the rotatable hollow drive shaft 292 to create a pressure or vacuum 284 in the sealed pressure chamber 280 where the pressure 284 moves the carrier rotor housing 272 vertically downward and where vacuum 284 moves the carrier rotor housing 272 vertically upward.

The workpiece carrier head 272 has a flat-surfaced workpiece 314 that is attached by vacuum to a floating workpiece carrier flexible elastomeric membrane 266 that is rotationally driven by the rotor housing 272. The vertical rotatable hollow drive shaft 292 is supported by bearings (not shown) that are supported by a stationary-positioned rotatable carrier housing (not shown) where the rotatable carrier housing is adjustable in a vertical direction and is held stationary in a vertical position by an abrading machine frame (not shown). Rotational torque is supplied by the drive shaft 292 to rotate the annular-wall device 304 and the rotor housing 272. Torque is transmitted from the annular-wall device 304 to a flexible membrane outer annular band 312 that is an integral extension of the flexible membrane 266 where the transmitted torque rotates both the flexible membrane 266 and the workpiece 314 that is attached to the flexible membrane 266.

The workpiece carrier flexible elastomeric membrane 266 that has a nominally-horizontal integral outer annular band 312 also has a nominally-vertical annular wall 268 that has a nominally-horizontal annular portion 276 that can have an annular indentation. The upper membrane wall annular portion 276 is attached to the drive hub 282 where a sealed pressure chamber 306 is formed by the membrane 266, the annular wall 268, the annular portion 276 and the drive hub 282. Pressurized fluid or vacuum 288 can be applied to the sealed pressure chamber 306 via the hollow drive shaft 292 to create an abrading pressure 322 that is transmitted uniformly across the full abraded surface of the workpiece 314 through the thickness of the flexible membrane 266.

The flexible membrane 266 has a circular inner zone portion and an integral outer annular band 312 annular portion where the attached laterally-rigid semiconductor wafer workpiece 314 is firmly attached with vacuum to the flexible membrane 266 circular inner zone portion which rigidizes the circular inner zone portion of the membrane 266. Vacuum 290 is supplied through the hollow drive shaft 292 and through flexible fluid passageways 296 to the drive hub 282 to a flexible hollow tube 310 that is fluid-connected to grooved passageways 318, 324 in the exposed surface of the membrane 266. When a circular workpiece 314 is attached by the vacuum 290 to the membrane 266, the grooved vacuum passageways 318, 324 in the exposed surface of the membrane 266 are sealed by mutual flat-surfaced contact of the workpiece 314 and the membrane 266 circular inner zone portion.

Another annular non-pressurized vented chamber 274 having a vent hole 270 surrounds the sealed pressure chamber 306. Pressurized fluid 290 can also be supplied to the flexible hollow tube 310 that is fluid-connected to grooved passageways 318, 324 in the exposed surface of the membrane 266 to provide fluid pressure to separate the workpiece 314 from the flexible membrane 266 upon completion of an abrading procedure. The flexible elastomeric membrane 266 flexible elastomeric integral outer annular band 312 annular portion can flex in a vertical direction that is perpendicular to the nominally flat surface of the workpiece 314 which allows the workpiece 314 to move in a vertical direction when pressure or vacuum 288 is applied to the sealed pressure chamber 306. Flexible localized movement of the membrane 266 and its integral components, the annular wall 268 and the annular portion 276 allow the equivalent-floating workpiece 314 to assume conformal flat-surfaced abrading contact with the flat surface of an abrasive coating 320 on a rotary flat-surfaced platen 316.

Figure 10:
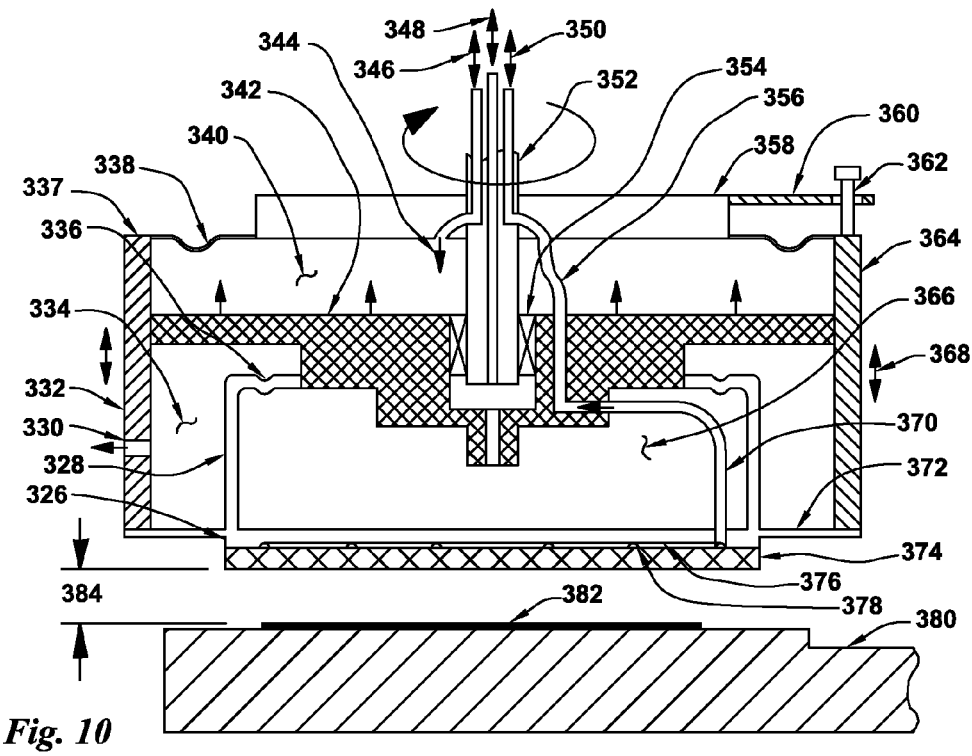
FIG. 10 is a cross section view of a membrane carrier with a workpiece raised from a platen.

FIG. 10 is a cross section view of a pin-driven vacuum-grooved flexible membrane workpiece carrier with a workpiece raised from abrading contact with an abrasive coated rotatable platen. A workpiece carrier head 337 has a flat-surfaced workpiece 374 that is attached to a slidable workpiece carrier rotor housing 332 attached flexible membrane 326 where the rotor housing 332 is rotationally driven by a drive-pin device 362. A nominally-horizontal drive plate 342 is supported by slidable shaft bearings 354 that are attached to a hollow drive shaft 352 where the carrier housing 332 can be raised and lowered in a vertical direction 368 by sliding in the bearings 354 along the hollow drive shaft 352.

A rigid drive hub 358 that is attached to the hollow drive shaft 352 has an attached rotational drive arm 360 where rotation of the hollow drive shaft 352 rotates the rotational drive arm 360. The slidable drive-pin device 362 is attached a rigid annular member 364 that is attached to the rotor housing 332 and rotation of the drive arm 360 that is in sliding contact with the drive-pin device 362 causes the rotor housing 332 to rotate. An annular flexible diaphragm device 338 that is attached to the rigid drive hub 358 and to the rotor housing 332 forms a sealed pressure chamber 340 and the flexible diaphragm device 338 allows the slidable workpiece carrier rotor housing 332 to be translated vertically 368 along the rotational axis of the rotatable hollow drive shaft 352.

Vacuum 346 can be supplied to fluid passageways in the rotatable hollow drive shaft 352 to create a vacuum 344 in the sealed pressure chamber 340 where the vacuum 344 moves the carrier rotor housing 332 vertically upward 368 and the workpiece 374 is raised a distance 384 from the surface of the abrasive 382 coating on the rotatable platen 380.

The workpiece carrier head 332 has a flat-surfaced workpiece 374 that is attached by vacuum to a floating workpiece carrier flexible elastomeric membrane 326 that is rotationally driven by the rotor housing 332. The vertical rotatable hollow drive shaft 352 is supported by bearings (not shown) that are supported by a stationary-positioned rotatable carrier housing (not shown) where the rotatable carrier housing is adjustable in a vertical direction and is held stationary in a vertical position by an abrading machine frame (not shown). Rotational torque is supplied by the drive shaft 352 to rotate the annular-wall device 364 and the rotor housing 332. Torque is transmitted from the annular-wall device 364 to a flexible membrane outer annular band 372 that is an integral extension of the flexible membrane 326 where the transmitted torque rotates both the flexible membrane 326 and the workpiece 374 that is attached to the flexible membrane 326.

The workpiece carrier flexible elastomeric membrane 326 that has a nominally-horizontal integral outer annular band 372 also has a nominally-vertical annular wall 328 that has a nominally-horizontal annular portion 336 that can have an annular indentation. The upper membrane wall annular portion 336 is attached to the drive hub 342 where a sealed pressure chamber 366 is formed by the membrane 326, the annular wall 328, the annular portion 336 and the drive hub 342.

The flexible membrane 326 has a circular inner zone portion and an integral outer annular band 372 annular portion where the attached laterally-rigid semiconductor wafer workpiece 374 is firmly attached with vacuum to the flexible membrane 326 circular inner zone portion which rigidizes the circular inner zone portion of the membrane 326. Vacuum 350 is supplied through the hollow drive shaft 352 and through flexible fluid passageways 356 to the drive hub 342 to a flexible hollow tube 370 that is fluid-connected to grooved passageways 376, 378 in the exposed surface of the membrane 326. When a circular workpiece 374 is attached by the vacuum 350 to the membrane 326, the grooved vacuum passageways 376, 378 in the exposed surface of the membrane 326 are sealed by mutual flat-surfaced contact of the workpiece 374 and the membrane 326 circular inner zone portion.

Another annular non-pressurized vented chamber 334 having a vent hole 330 surrounds the sealed pressure chamber 366. Pressurized fluid 350 can also be supplied to the flexible hollow tube 370 that is fluid-connected to grooved passageways 376, 378 in the exposed surface of the membrane 326 to provide fluid pressure to separate the workpiece 374 from the flexible membrane 326 upon completion of an abrading procedure. The flexible elastomeric membrane 326 flexible elastomeric integral outer annular band 372 annular portion can flex in a vertical direction that is perpendicular to the nominally flat surface of the workpiece 374 which allows the workpiece 374 to move in a vertical direction when pressure or vacuum 348 is applied to the sealed pressure chamber 366. Flexible localized movement of the membrane 326 and its integral components, the annular wall 328 and the annular portion 336 allow the equivalent-floating workpiece 374 to assume conformal flat-surfaced abrading contact with the flat surface of an abrasive coating 382 on a rotary flat-surfaced platen 380.

Figure 11:
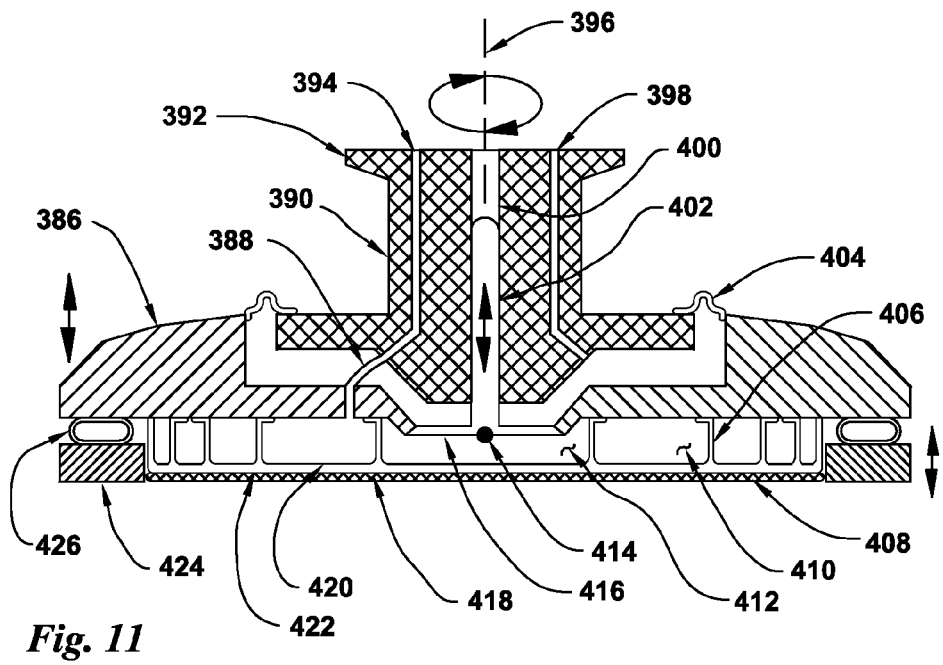
FIG. 11 is a cross section view of a prior art pneumatic bladder type of wafer carrier.

FIG. 11 is a cross section view of a conventional prior art pneumatic bladder type of wafer carrier. A rotatable wafer carrier head 390 having a wafer carrier hub 392 is attached to the rotatable head (not shown) of a polishing machine tool (not shown) where the carrier hub 392 is loosely attached with flexible joint device 404 and a rigid slide-pin 402 to a rigid carrier plate 386. The cylindrical rigid slide-pin 402 can move along a cylindrical hole 400 in the carrier hub 392 which allows the rigid carrier plate 386 to move axially along the hole 400 where the movement of the carrier plate 386 is relative to the carrier hub 392. The rigid slide-pin 402 is attached to a flexible diaphragm 416 that is attached to carrier plate 386 which allows the carrier plate 386 to be spherically rotated about a rotation point 414 relative to the rotatable carrier hub 392 that is remains aligned with its rotational axis 396.

A sealed flexible elastomeric diaphragm device 420 has a number of individual annular sealed pressure chambers 410 having flexible elastomeric chamber walls 406 and a circular center chamber 412 where the air pressure can be independently adjusted for each of the individual chambers 410, 412 to provide different abrading pressures to a wafer workpiece 408 that is attached to the wafer mounting surface 422 of the elastomeric diaphragm 420. A wafer 408 carrier annular back-up ring 424 provides containment of the wafer 408 within the rotating but stationary-positioned wafer carrier head 390 as the wafer 408 abraded surface 418 is subjected to abrasion-friction forces by the moving abrasive coated platen (not shown). An air-pressure annular bladder 426 applies controlled contact pressure of the wafer 408 carrier annular back-up ring 424 with the platen abrasive coating surface. Controlled-pressure air is supplied from air inlet passageways 394 and 398 in the carrier hub 392 to each of the multiple flexible pressure chambers 410, 412 by flexible tubes 388.

When CMP polishing of wafers takes place, a resilient porous CMP pad is saturated with a liquid loose-abrasive slurry mixture and is held in moving contact with the flat-surfaced semiconductor wafers to remove a small amount of excess deposited material from the top surface of the wafers. The wafers are held by a wafer carrier head that rotates as the wafer is held in abrading contact with the CMP pad that is attached to a rotating rigid platen. Both the carrier head and the pad are rotated at the same slow speeds.

The pneumatic-chamber wafer carrier heads typically are constructed with a flexible elastomer membrane that supports a wafer where five individual annular chambers allow the abrading pressure to be varied across the radial surface of the wafer. The rotating carrier head has a rigid hub and a floating wafer carrier plate that has a "spherical" center of rotation where the wafer is held in flat-surfaced abrading contact with a moving resilient CMP pad. A rigid wafer retaining ring that contacts the edge of the wafer is used to resist the abrading forces applied to the wafer by the moving pad.

Figure 12:
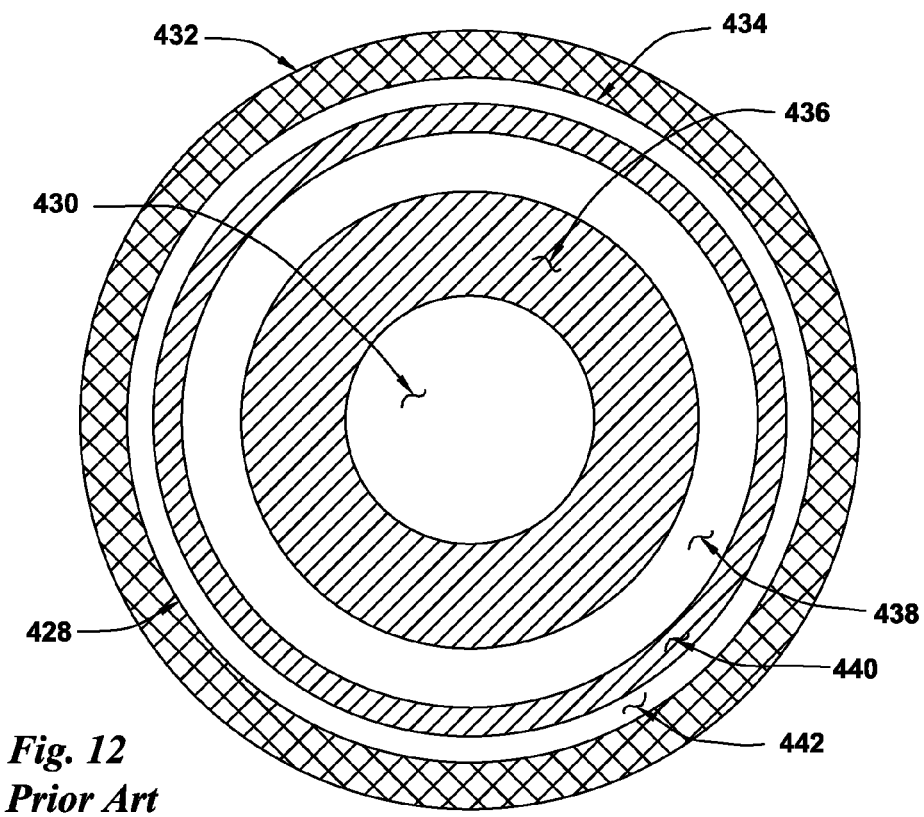
FIG. 12 is a bottom view of a prior art pneumatic bladder type of wafer carrier.

FIG. 12 is a bottom view of a conventional prior art pneumatic bladder type of wafer carrier. A wafer carrier head 432 having an continuous nominally-flat surface elastomeric diaphragm 434 is shown having multiple annular pneumatic pressure chamber areas 436, 438, 440, 442 and one circular center pressure chamber area 430. The wafer carrier head 432 can have more or less than five individual pressure chambers. A wafer carrier head 432 annular back-up ring 428 provides containment of the wafer (not shown) within the wafer carrier head 432 as the wafer (not shown) that is attached to the continuous nominally-flat surface of the elastomeric diaphragm device 434 is subjected to abrasive friction forces. Here, the semiconductor wafer substrate is loosely attached to a flexible continuous-surface of a membrane that is attached to the rigid portion of the substrate carrier. Multiple pneumatic air-pressure chambers that exist between the substrate mounting surface of the membrane and the rigid portion of the substrate carrier are an integral part of the carrier membrane.

Each of the five annular pneumatic chambers shown here can be individually pressurized to provide different abrading pressures to different annular portions of the wafer substrate. These different localized abrading pressures are provided to compensate for the non-uniform abrading action that occurs with this wafer polishing system.

The flexible semiconductor wafer is extremely flat on both opposed surfaces. Attachment of the wafer to the carrier membrane is accomplished by pushing the very flexible membrane against the flat backside surface of a water-wetted wafer to drive out all of the air and excess water that exists between the wafer and the membrane. The absence of an air film in this wafer-surface contact are provides an effective suction-attachment of the wafer to the carrier membrane surface. Sometimes localized "vacuum pockets" are used to enhance the attachment of the wafer to the flexible flat-surfaced membrane.

Each of the five annular pressure chambers expand vertically when pressurized. The bottom surfaces of each of these chambers move independently from their adjacent annular chambers. By having different pressures in each annular ring-chamber, the individual chamber bottom surfaces are not in a common plane if the wafer is not held in flat-surfaced abrading contact with a rigid abrasive surface. If the abrasive surface is rigid, then the bottom surfaces of all of the five annular rings will be in a common plane. However, when the abrasive surface is supported by a resilient pad, each individual pressure chamber will distort the abraded wafer where the full wafer surface is not in a common plane. Resilient support pads are used both for CMP pad polishing and for fixed-abrasive web polishing.

Because of the basic design of the flexible membrane wafer carrier head that has five annular zones, each annular abrading pressure-controlled zone provides an "average" pressure for that annular segment. This constant or average pressure that exist across the radial width of that annular pressure chamber does not accurately compensate for the non-linear wear rate that actually occurs across the radial width of that annular band area of the wafer surface.

Overall, this flexible membrane wafer substrate carrier head is relatively effective for CMP pad polishing of wafers. Use of it with resilient CMP pads require that the whole system be operated at very low speeds, typically at 30 rpm. However, the use of this carrier head also causes many problems results in non-uniform material removal across the full surface of a wafer.

Figure 13:
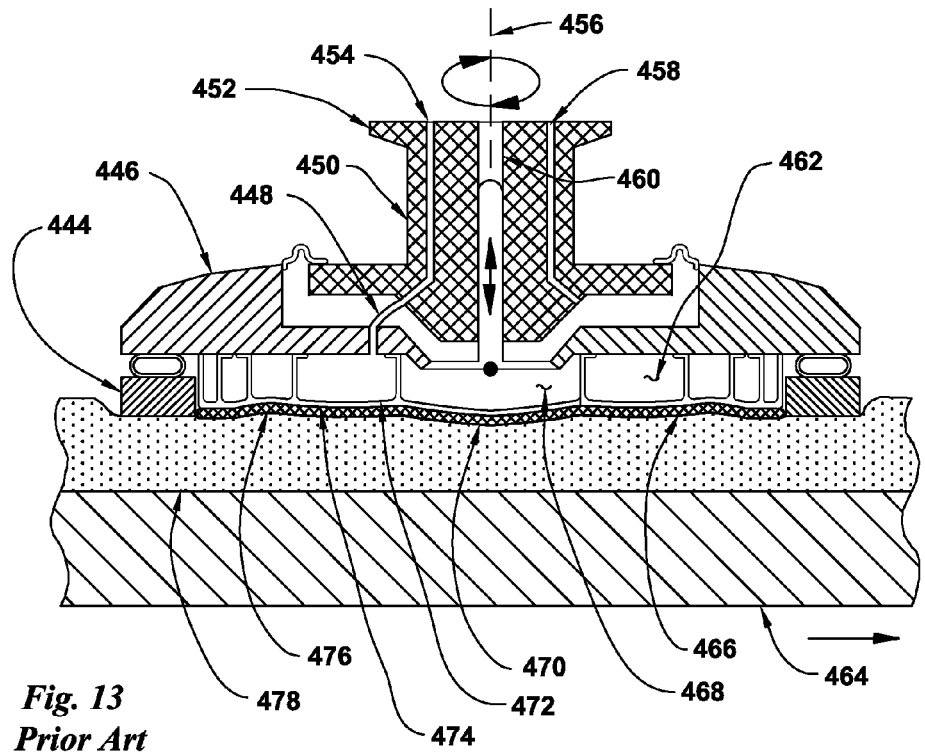
FIG. 13 is a cross section view of a prior art bladder type of wafer carrier distorted bottom.

FIG. 13 is a cross section view of a prior art pneumatic bladder type of wafer carrier with a distorted bottom surface. A rotatable wafer carrier head 450 having a wafer carrier hub 452 is attached to the rotatable head (not shown) of a wafer polishing machine tool (not shown) where the carrier hub 452 is loosely attached with flexible joint devices and a rigid slide-pin to a rigid carrier plate 446. The cylindrical rigid slide-pin can move along a cylindrical hole 460 in the carrier hub 452 which allows the rigid carrier plate 446 to move axially along the hole 460 where the movement of the carrier plate 446 is relative to the carrier hub 452. The rigid slide-pin is attached to a flexible diaphragm that is attached to carrier plate 446 which allows the carrier plate 446 to be spherically rotated about a rotation point relative to the rotatable carrier hub 452 that is remains aligned with its rotational axis 456.

A sealed flexible elastomeric diaphragm device 472 having a nominally-flat but flexible wafer 466 mounting surface 474 has a number of individual annular sealed pressure chambers 462 and a circular center chamber 468 where the air pressure can be independently adjusted for each of the individual chambers 462, 468 to provide different abrading pressures to a wafer workpiece 466 that is attached to the wafer mounting surface 474 of the elastomeric diaphragm 472. A wafer 466 carrier annular back-up ring 444 provides containment of the wafer 466 within the rotating but stationary-positioned wafer carrier head 450 as the wafer 466 abraded surface 476 is subjected to abrasion-friction forces by the moving abrasive coated platen (not shown). An air-pressure annular bladder applies controlled contact pressure of the wafer 466 carrier annular back-up ring 444 with the platen abrasive coating surface. Controlled-pressure air is supplied from air inlet passageways 454 and 458 in the carrier hub 452 to each of the multiple flexible pressure chambers 462, 468 by flexible tubes 448.

When air, or other fluids such as water, pressures are applied to the individual sealed pressure chambers 462, 468, the flexible bottom wafer mounting surface 474 of the elastomeric diaphragm 472 is deflected different amounts in the individual annular or circular bottom areas of the sealed pressure chambers 462, 468 where the nominally-flat but flexible wafer 466 is distorted into a non-flat condition as shown by 470 as the wafer 466 is pushed downward into the flexible and resilient CMP pad 478 which is supported by a rigid rotatable platen 464.

When the multi-zone wafer carrier is used to polish wafer surfaces with a resilient CMP abrasive slurry saturated polishing pad, the individual annular rings push different annular portions of the wafer into the resilient pad. Each of the wafer carrier air-pressure chambers exerts a different pressure on the wafer to provide uniform material removal across the full surface of the wafer. Typically the circular center of the wafer carrier flexible diaphragm has the highest pressure. This high-pressure center-area distorts the whole thickness of the wafer as it is forced deeper into the resilient CMP wafer pad. Adjacent annular pressure zones independently distort other portions of the wafer.

Here, the wafer body is substantially distorted out-of-plane by the independent annual pressure chambers. However, the elastomer membrane that is used to attach the wafer to the rotating wafer carrier is flexible enough to allow the individual pressure chambers to flex the wafer while still maintaining the attachment of the wafer to the membrane. As the wafer body is distorted, the distorted and moving resilient CMP pad is thick enough to allow this out-of-plane distortion to take place while providing polishing action on the wafer surface.

When a wafer carrier pressure chamber is expanded downward, the chamber flexible wall pushes a portion of the wafer down into the depths of the resilient CMP pad. The resilient CMP pad is compressible and acts as an equivalent series of compression springs. The more that a spring is compressed, the higher the resultant force is. The compression of a spring is defined as F=KX where F is the spring force, K is the spring constant and X is the distance that the end of the spring is deflected.

The CMP resilient pads have a stiffness that resists wafers being forced into the depths of the pads. Each pad has a spring constant that is typically linear. In order to develop a higher abrading pressure at a localized region of the flat surface of a wafer, it is necessary to move that portion of the wafer down into the depth of the compressible CMP pad. The more that the wafer is moved downward to compresses the pad, the higher the resultant abrading force in that localized area of the wafer. If the spring-like pad is not compressed, the required wafer abrading forces are not developed.

Due to non-uniform localized abrading speeds on the wafer surface, and other causes such as distorted resilient pads, it is necessary to compress the CMP pad different amounts at different radial areas of the wafer. However, the multi-zone pressure chamber wafer carrier head has abrupt chamber-bottom membrane deflection discontinuities at the annular joints that exist between adjacent chambers having different chamber pressures. Undesirable wafer abrading pressure discontinuities exist at these membrane deflection discontinuity annular ring-like areas.

Often, wafers that are polished using the pneumatic wafer carrier heads are bowed. These bowed wafers can be attached to the flexible elastomeric membranes of the carrier heads. However, in a free-state, these bowed wafers will be first attached to the center-portion of the carrier head. Here, the outer periphery of the bowed wafer contacts the CMP pad surface before the wafer center does. Pressing the wafer into forced contact with the CMP pad allows more of the wafer surface to be in abrading contact with the pad. Using higher fluid pressures in the circular center of the carrier head chamber forces this center portion of the bowed wafer into the pad to allow uniform abrading and material removal across this center portion of the surface of the wafer. There is no defined planar reference surface for abrading the surface of the wafer.

Figure 14:
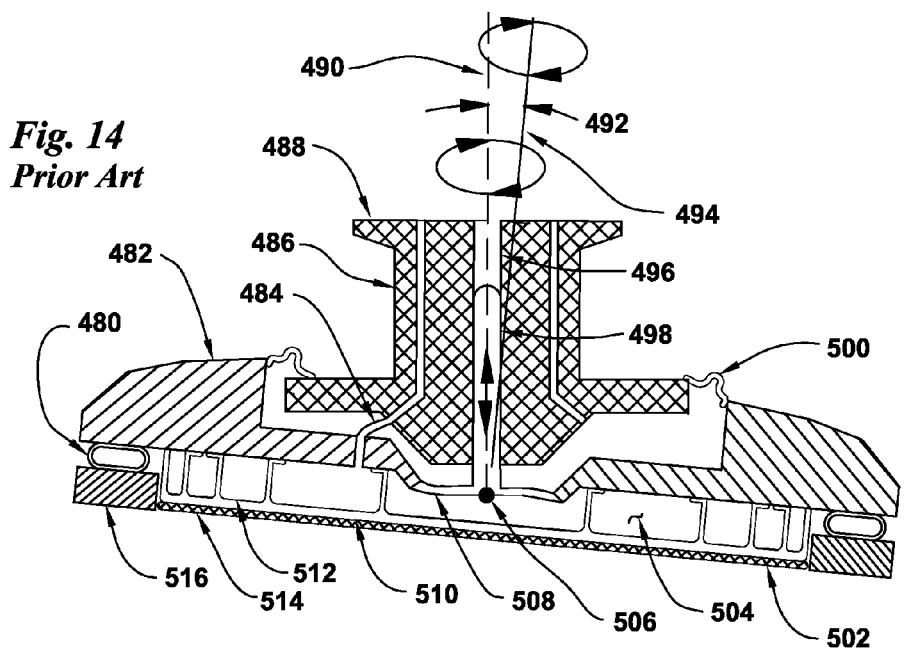
FIG. 14 is a cross section view of a prior art bladder type of wafer carrier tilted wafer carrier.

FIG. 14 is a cross section view of a prior art pneumatic bladder type of wafer carrier head with a tilted wafer carrier. The pneumatic-chamber carrier head is made up of two internal parts to allow "spherical-action" motion of the floating annular plate type of substrate carrier that is supported by a rotating carrier hub. The floating substrate carrier plate is attached to the rotating drive hub by a flexible elastomeric or a flexible metal diaphragm at the top portion of the hub. This upper elastomeric diaphragm allows approximate-spherical motion of the substrate carrier to provide flat-surfaced contact of the wafer substrate with the "flat" but indented resilient CMP pad. The CM pad is saturated with a liquid abrasive slurry mixture.

To keep the substrate nominally centered with the rotating carrier drive hub, a stiff (or flexible) post is attached to a flexible annular portion of the rigid substrate carrier structure. This circular centering-post fits in a cylindrical sliding-bearing receptacle-tube that is attached to the rotatable hub along the hub rotation axis. When misalignment of the polishing tool (machine) components occurs or large lateral friction abrading forces tilt the carrier head, the flexible centering post tends to slide vertically along the length of the carrier head rotation axis. This post-sliding action and out-of-plane distortion of the annular diaphragm that is attached to the base of the centering posts together provide the required "spherical-action" motion of the rigid carrier plate. In this way, the surface of the wafer substrate is held in flat-surfaced contact with the nominal-flatness of the CMP pad as the carrier head rotates.

Here, the "spherical action" motion of the substrate carrier depends upon the localized distortion of the structural member of the carrier head. This includes diaphragm-bending of the flexible annular base portion of the rigid substrate carrier which the center-post shaft is attached to. All of these carrier head components are continuously flexed upon each rotation of the carrier head which often requires that the wafer substrate carrier head is typically operated at very slow operating speeds of only 30 rpm.

A rotatable wafer carrier head 486 having a wafer carrier hub 488 is attached to the rotatable head (not shown) of a polishing machine tool (not shown) where the carrier hub 488 is loosely attached with flexible joint device 500 and a rigid slide-pin 498 to a rigid carrier plate 482. The cylindrical rigid slide-pin 498 can move along a cylindrical hole 496 in the carrier hub 488 which allows the rigid carrier plate 482 to move axially along the hole 496 where the movement of the carrier plate 482 is relative to the carrier hub 488. The rigid slide-pin 498 is attached to a flexible diaphragm 508 that is attached to the carrier plate 482 which allows the carrier plate 482 to be spherically rotated about a rotation point 506 relative to the rotatable carrier hub 488 that is remains aligned with its rotational axis 346.

The carrier plate 482 is shown spherically rotated about a rotation point 506 relative to the rotatable carrier hub 488 where the slide-pin axis 490 is at a tilt-angle 492 with an axis 494 that is perpendicular with the wafer 502 abraded surface 510 and where the carrier plate 482 and the wafer 502 are shown here to rotate about the axis 494. The flexible diaphragm 508 that is attached to the carrier plate 482 is distorted when the carrier plate 482 is spherically rotated about a rotation point 506 relative to the rotatable carrier hub 488.

A sealed flexible elastomeric diaphragm device 512 has a number of individual annular sealed pressure chambers 504 and a circular center chamber where the air pressure can be independently adjusted for each of the individual chambers 504 to provide different abrading pressures to a wafer workpiece 502 that is attached to the wafer mounting surface 514 of the elastomeric diaphragm 512. A wafer 502 carrier annular back-up ring 516 provides containment of the wafer 502 within the rotating but stationary-positioned wafer carrier head 486 as the wafer 502 abraded surface 510 is subjected to abrasion-friction forces by the moving abrasive coated platen (not shown). An air-pressure annular bladder 480 applies controlled contact pressure of the wafer 502 carrier annular back-up ring 516 with the platen abrasive coating surface. Controlled-pressure air is supplied from air inlet passageways in the carrier hub 488 to each of the multiple flexible pressure chambers 504 by flexible tubes 484.

The pneumatic abrading pressures that are applied during CMP polishing procedures range from 1 to 8 psi. The downward pressures that are applied by the wafer retaining ring to push-down the resilient CMP pad prior to it contacting the leading edge of the wafer are often much higher than the nominal abrading forces applied to the wafer. For a 300 mm (12 inch) diameter semiconductor wafer substrate, that has a surface area of 113 sq. inches, an abrading force of 4 psi is often applied for polishing with a resilient CMP pad. The resultant downward abrading force on the wafer substrate is 4×113=452 lbs. An abrading force of 2 psi results in a downward force of 226 lbs.

The coefficient of friction between a resilient pad and a wafer substrate can vary between 0.5 and 2.0. Here, the wafer is plunged into the depths of the resilient CMP pad. A lateral force is applied to the wafer substrate along the wafer flat surface that is a multiple of the coefficient of friction and the applied downward abrading force. If the downward force is 452 lbs and the coefficient of friction is 0.5, then the lateral force is 226 lbs. If the downward force is 452 lbs and the coefficient of friction is 2.0, then the lateral force is 904 lbs. If a 2 psi downward force is 226 lbs and the coefficient of friction is 2.0, then the lateral force is 452 lbs.

When this lateral force of 226 to 904 lbs is applied to the wafer, it tends to drive the wafer against the rigid outer wafer retaining ring of the wafer carrier head. Great care is taken not to damage or chip the fragile, very thin and expensive semiconductor wafer due to this wafer-edge contact. This wafer edge-contact position changes continually along the periphery of the wafer during every revolution of the carrier head. Also, the overall structure of the carrier head is subjected to this same lateral force that can range from 226 to 904 lbs.

All the head internal components tend to tilt and distort when the head is subjected to the very large friction forces caused by forced-contact with the moving abrasive surface. The plastic components that the pneumatic head is constructed from have a stiffness that is a very small fraction of the stiffness of same-sized metal components. This is especially the case for the very flexible elastomeric diaphragm materials that are used to attach the wafers to the carrier head. These plastic and elastomeric components tend to bend and distort substantial amounts when they are subjected to these large lateral abrading friction forces.

The equivalent-vacuum attachment of a water-wetted wafer, plus the coefficient-of-friction surface characteristics of the elastomer membrane, are sufficient to successfully maintain the attachment of the wafer to the membrane even when the wafer is subjected to the large lateral friction-caused abrading forces. However, to maintain the attachment of the wafer to the membrane, it is necessary that the flexible elastomer membrane is distorted laterally by the friction forces to where the outer periphery edge of the wafer is shifted laterally to contact the wall of the rigid wafer substrate retainer ring. Because the thin wafer is constructed form a very rigid silicon material, it is very stiff in a direction along the flat surface of the wafer.

The rigid wafer outer periphery edge is continually pushed against the substrate retainer ring to resist the very large lateral abrading forces. This allows the wafer to remain attached to the flexible elastomer diaphragm flat surface because the very weak diaphragm flat surface is also pushed laterally by the abrading friction forces. Most of the lateral abrading friction forces are resisted by the body of the wafer and a small amount is resisted by the elastomer bladder-type diaphragm. Contact of the wafer edge with the retainer ring continually moves along the wafer periphery upon each revolution of the wafer carrier head.

Figure 15:
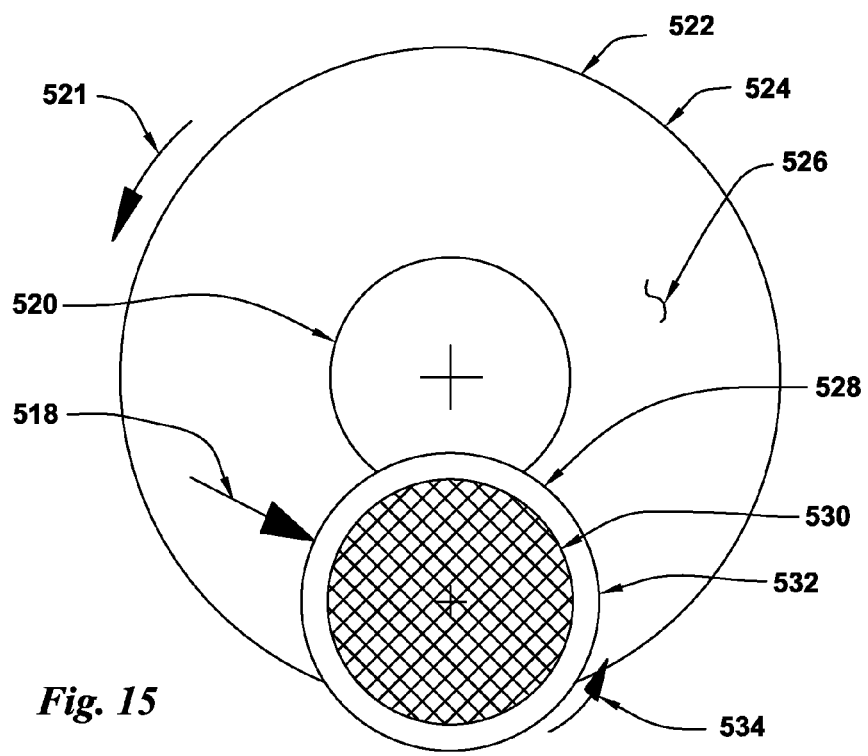
FIG. 15 is a top view of a membrane workpiece carrier and an abrasive coated platen.

FIG. 15 is a top view of a vacuum-grooved membrane workpiece carrier and an abrasive coated platen used for lapping or polishing semiconductor wafers or other workpiece substrates. A vacuum-grooved membrane workpiece carrier 528 has a flat-surfaced workpiece 530 that is attached with vacuum to the vacuum-grooved membrane 532 that is part of the workpiece carrier 528 that is rotationally driven.

An abrasive disk 524 that has an annular band of abrasive 526 having an inner abrasive periphery 520 is attached to a rotating platen 522. The workpiece 530 overhangs both the inner and outer radii of the annular band 526 of fixed abrasive to provide uniform wear-down of both the annular band 526 of fixed abrasive and the abraded surface of the workpiece 530.

The workpiece 530 is rotated in a rotation direction 534 that is the same as the platen 522 rotation direction 521 and the workpiece 530 and the platen 522 are typically rotated at approximately at the same rpm rotation speeds as the workpiece 530 is in flat-surfaced abrading contact with the annular band of abrasive 526 to provide uniform wear-down of both the annular band 526 of fixed abrasive and the abraded surface of the workpiece 530. The moving abrasive 526 applies an abrading force 518 on the shown upstream side of the workpiece 530 as the platen 522 is rotated. When the platen 522 has a precision-flat surface and the water cooled fixed-abrasive raised-island disk 524 has a precisely uniform thickness over the full annular abrasive surface 526, the platen 522 can be rotated at very high speeds to provide high speed material removal from the surface of the workpiece 530 without hydroplaning of the workpiece 530.

Figure 16:
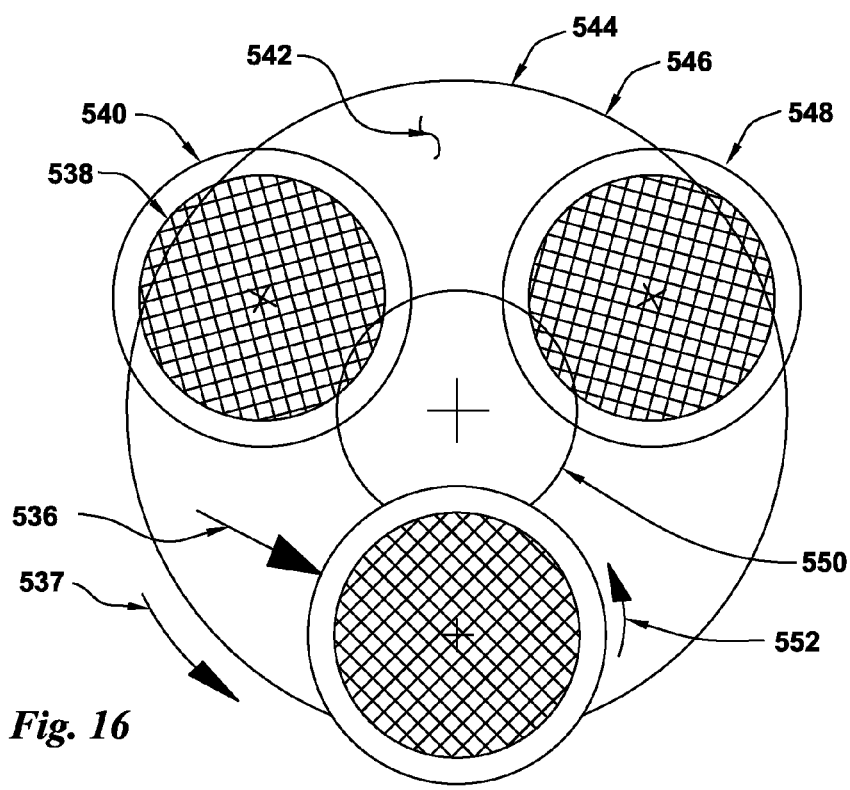
FIG. 16 is a top view of multiple membrane workpiece carriers and a abrasive coated platen.

FIG. 16 is a top view of multiple vacuum-grooved membrane workpiece carriers used with an abrasive coated platen to provide simultaneous lapping or polishing multiple semiconductor wafers or other workpiece substrates. Three vacuum-grooved membrane workpiece carriers 540 have flat-surfaced workpieces 538 that are attached with vacuum to the vacuum-grooved membranes 548 that are part of the workpiece carriers 540 that are rotationally driven. An abrasive disk 546 that has an annular band of abrasive 542 having an inner abrasive periphery 550 is attached to a rotating platen 544. The workpieces 538 overhang both the inner and outer radii of the annular band 542 of fixed abrasive to provide uniform wear-down of both the annular band 542 of fixed abrasive and the abraded surface of the workpieces 538.

The workpieces 538 are rotated in a rotation direction 552 that is the same as the platen 544 rotation direction 537 and the workpieces 538 and the platen 544 are typically rotated at approximately at the same rpm rotation speeds as the workpieces 538 are in flat-surfaced abrading contact with the annular band of abrasive 542 to provide uniform wear-down of both the annular band 542 of fixed abrasive and the abraded surfaces of the workpieces 538. The moving abrasive 542 applies an abrading force 536 on the shown upstream side of each of the workpieces 538 as the platen 544 is rotated. When the platen 544 has a precision-flat surface and the water cooled fixed-abrasive raised-island disk 546 has a precisely uniform thickness over the full annular abrasive surface 542, the platen 544 can be rotated at very high speeds to provide high speed material removal simultaneously from the surfaces of the workpieces 538 without hydroplaning of the workpieces 538.

Figure 17:
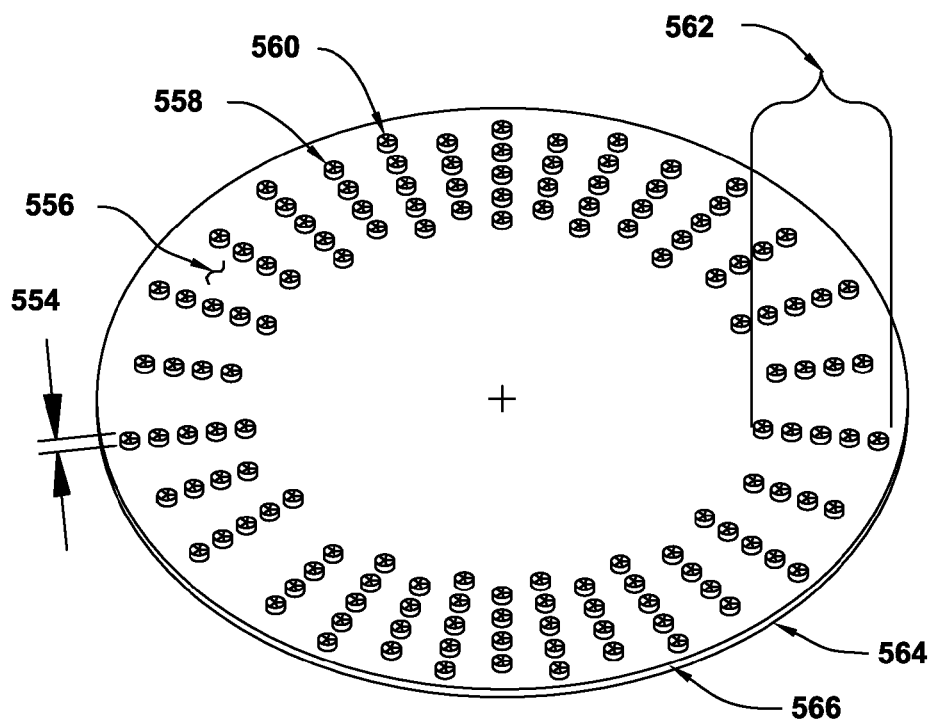
FIG. 17 is an isometric view of an abrasive disk with an annual band of raised islands.

FIG. 17 is an isometric view of an abrasive disk with an annual band of raised islands. A flexible abrasive disk 564 has attached raised island structures 558 that are top-coated with abrasive particles 560 where the island structures 558 are attached to a disk 564 transparent or non-transparent backing 566. The raised-island disk 564 has annular bands of abrasive-coated 560 raised islands 558 where the annular bands have a radial width of 562. Each island 558 has a typical width 554. The islands 558 can be circular as shown here or can have a variety of shapes comprising radial bars (not shown) where the abrasive-coated 560 raised islands 558 allow the abrasive disks 564 to be used successfully at very high abrading speeds in the presence of coolant water without hydroplaning of the workpieces (not shown). There are channel gap openings 556 that exist on the abrasive disk 564 between the raised island structures 558.

For high speed flat lapping or polishing, the abrasive disk 564 has an overall thickness variation, as measured from the top of the abrasive-coated 560 raised islands 558 to the bottom surface of the abrasive disk backing 566, that is typically less than 0.0001 inches 0.254 micron). This abrasive disk 564 precision surface flatness is necessary to provide an abrasive coating that is uniformly flat across the full annular band abrading surface of the abrasive disk 564 which allows the abrasive disk 564 to be used at very high abrading speeds of 10,000 surface feet (3,048 m) per minute or more. These high abrading speeds are desirable as the workpiece material removal rate is directly proportional to the abrading speeds.

Figure 18:
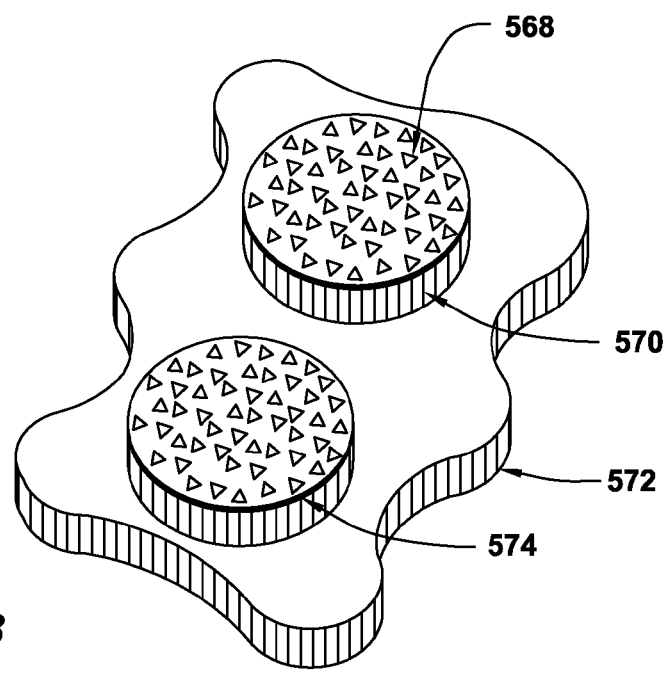
FIG. 18 is an isometric view of a portion of an abrasive disk with individual raised islands.

FIG. 18 is an isometric view of a portion of an abrasive disk with individual raised islands. A transparent or non-transparent backing sheet 572 has raised island structures 570 that are top-coated with a solidified abrasive-slurry layer mixture 574 which is filled with abrasive particles 568. The fixed-abrasive coating 574 on the raised islands 570 includes individual abrasive particles 568 or ceramic spherical beads (not shown) that are filled with very small diamond, cubic boron nitride (CBN) or aluminum oxide abrasive particles. The sizes of the abrasive particles 568 contained in the beads ranges from 60 microns to submicron sizes where the smaller sizes are typically used to polish semiconductor wafers.

Figure 19:
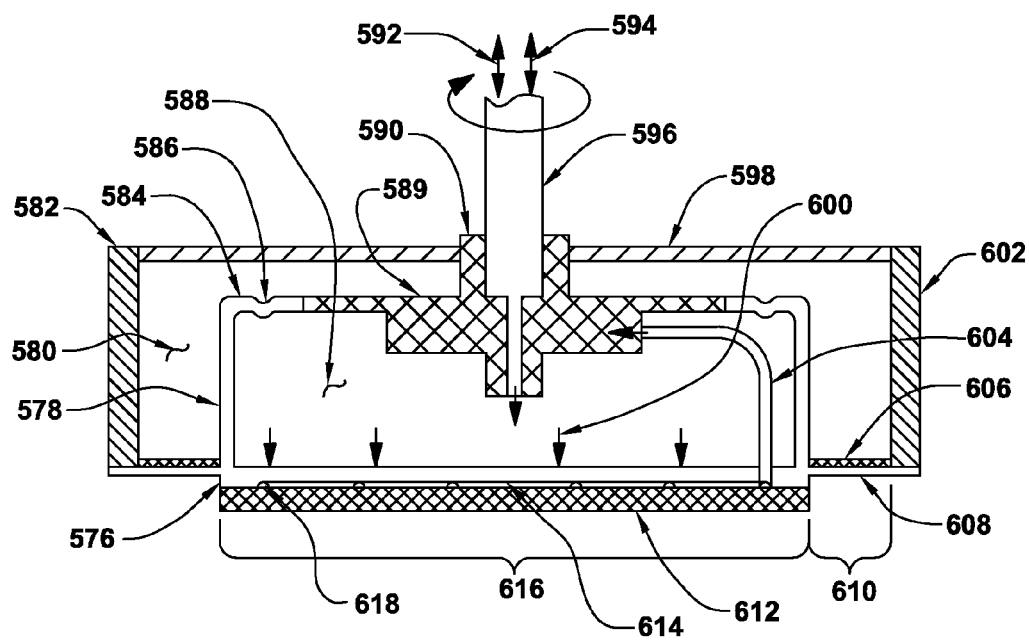
FIG. 19 is a cross section view of a workpiece carrier membrane reinforced annular ring.

FIG. 19 is a cross section view of a workpiece carrier vacuum-grooved membrane with a reinforced annular ring. A stationary workpiece carrier head 582 has a flat-surfaced workpiece 612 that is attached by vacuum to a floating workpiece carrier flexible elastomeric membrane 576 that is rotationally driven by an annular-wall device 602. A vertical rotatable hollow drive shaft 596 is supported by bearings (not shown) that are supported by a stationary-positioned rotatable carrier housing (not shown) where the rotatable carrier housing is adjustable in a vertical direction and is held stationary in a vertical position by an abrading machine frame (not shown). Rotational torque is supplied by the drive shaft 596 to an attached drive hub 590 that has an attached rotational drive device 598 that rotates the annular-wall device 602. Torque is transmitted from the annular-wall device 602 to a flexible membrane outer annular band 608 that is an integral extension of the flexible membrane 576 where the transmitted torque rotates both the flexible membrane 576 and the workpiece 612 that is attached to the flexible membrane 576. The outer annular band 608 has a radial-reinforcement 606 that is flexible vertically but has a controlled stiffness radially.

The workpiece carrier flexible elastomeric membrane 576 that has a nominally-horizontal integral outer annular band 608 also has a nominally-vertical annular wall 578 that has a nominally-horizontal annular portion 584 that can have an annular indentation 586. The upper membrane wall annular portion 584 is attached to the hub annular extension 589 of the drive hub 590 where a sealed pressure chamber 588 is formed by the membrane 576, the annular wall 578, the hub annular extension 589 and the drive hub 590. Pressurized fluid or vacuum 592 can be applied to the sealed pressure chamber 588 via the hollow drive shaft 596 create an abrading pressure 600 that is transmitted to the workpiece 612 through the thickness of the flexible membrane 576.

The flexible membrane 576 has a circular inner zone portion 616 and an integral outer annular band 608 annular portion 610 where the attached laterally-rigid semiconductor wafer workpiece 612 is firmly attached with vacuum to the flexible membrane 576 circular inner zone portion 616 which rigidizes the circular inner zone portion 616 of the membrane 576. Vacuum 594 is supplied through the hollow drive shaft 596 and through fluid passageways in the drive hub 590 to a flexible hollow tube 604 that is fluid-connected to grooved passageways 614, 618 in the exposed surface of the membrane 576. When a circular workpiece 612 is attached by the vacuum 594 to the membrane 576, the grooved vacuum passageways 614, 618 in the exposed surface of the membrane 576 are sealed by mutual flat-surfaced contact of the workpiece 612 and the membrane 576 circular inner zone portion 616.

Another annular non-pressurized vented chamber 580 surrounds the sealed pressure chamber 588. Pressurized fluid 594 can also be supplied to the flexible hollow tube 604 that is fluid-connected to grooved passageways 614, 618 in the exposed surface of the membrane 576 to provide fluid pressure to separate the workpiece 612 from the flexible membrane 576 upon completion of an abrading procedure. The flexible elastomeric membrane 576 flexible elastomeric integral outer annular band 608 annular portion 610 can flex in a vertical direction that is perpendicular to the nominally flat surface of the workpiece 612 which allows the workpiece 612 to move in a vertical direction when pressure or vacuum 592 is applied to the sealed pressure chamber 588. Flexible localized movement of the membrane 576 and its integral components, the annular wall 578, the annular portion 584 and the annular indentation 586 allow the workpiece 612 to assume flat-surfaced abrading contact with the flat surface of an abrasive coating (not shown) on a rotary flat-surfaced platen.

Figure 20:
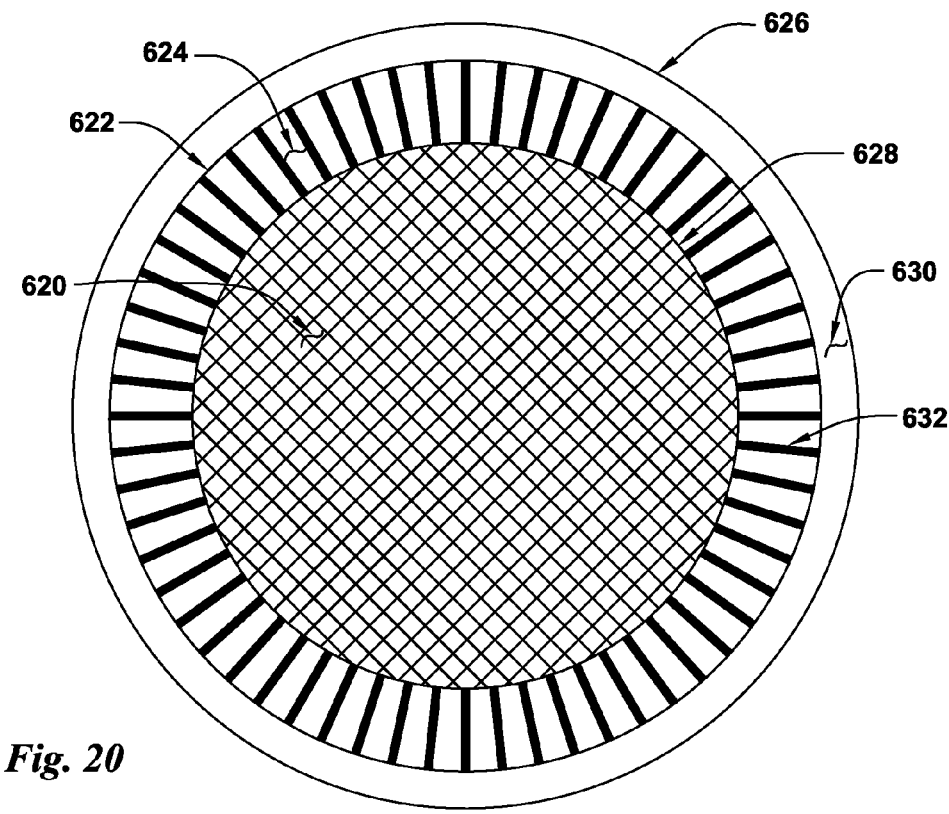
FIG. 20 is a top view of a workpiece carrier membrane with a reinforced annular ring.

FIG. 20 is a top view of a workpiece carrier vacuum-grooved membrane with a reinforced annular ring. A flexible elastomeric membrane 622 has a circular semiconductor wafer 628 attached to the central region 620 of the circular elastomeric membrane 622. The elastomeric membrane 622 also has an integral outer annular band 624 that is attached to an annular-wall device 630 and that is flexible in a direction that is perpendicular to the wafer 628 flat surface but is nominally stiff in a radial direction. The radial stiffness of the integral outer annular elastomeric band 624 maintains the circular wafer 628 nominally at the center of the circular elastomeric membrane 622 as the rotating wafer 628 is subjected to abrading forces by moving abrasive (not shown) that contacts the rotating wafer 628. Vacuum attachment of the radially-rigid wafer 628 to the flexible membrane 622 rigidizes the circular inner zone portion of the membrane 622.

The elastomeric membrane 622 integral outer annular band 624 is attached at its outer periphery to a rotatable workpiece carrier drive housing 626 and radial reinforcement cables or wires 632 are attached to the elastomeric membrane 622 integral outer annular band 624. The radial reinforcement strings, cables or wire devices 632 are flexible vertically to allow flexible vertical motion of both the elastomeric membrane 622 integral outer annular band 624 in a direction that is perpendicular to the flat surface of the elastomeric membrane 622 but provide added radial stiffness to the elastomeric membrane 622 integral outer annular band 624.

The radial reinforcement strings, cables or wire devices 632 comprise threads, monofilament strands, braided strands of fibers, woven matrices, woven cloths, and laminated layers. The reinforcing materials comprise: polymers, inorganic or organic materials and metals. The radial reinforcement devices 632 typically can be constructed of small-diameter stretch-resistant filaments to provide axial rigidity to the strands but also provide flexibility perpendicular to the axis of the individual fibers or strands of fibers. In addition, thin layers of metal with narrow radial spokes that project from a narrow annular band can be used to provide substantial radial stiffness but allow vertical flexibility to the elastomeric membrane 622 integral outer annular band 624. Reinforcement types of continuous filaments or threads can be woven or formed into radial loops or other geometric patterns to provide direction-controlled radial and circumferential or tangential rigidity to the reinforcement devices 632. Adhesives are typically used to attach the radial reinforcement devices 632 to the elastomeric membrane 622 integral outer annular band 624.

Figure 21:
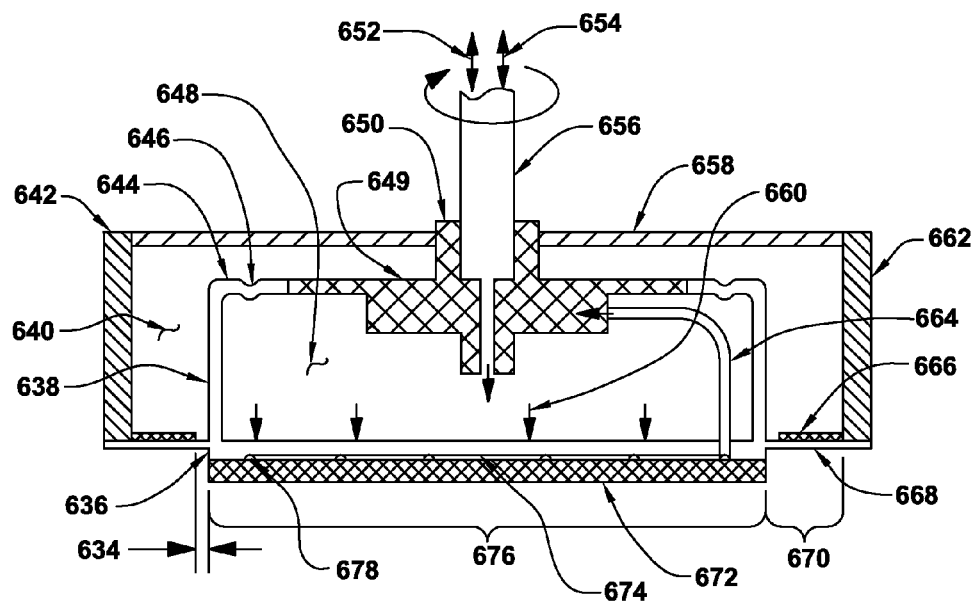
FIG. 21 is a cross section view of a workpiece carrier membrane partial-reinforced ring.

FIG. 21 is a cross section view of a workpiece carrier vacuum-grooved membrane partial-reinforced ring. A stationary workpiece carrier head 642 has a flat-surfaced workpiece 672 that is attached by vacuum to a floating workpiece carrier flexible elastomeric membrane 636 that is rotationally driven by an annular-wall device 662. A vertical rotatable hollow drive shaft 656 is supported by bearings (not shown) that are supported by a stationary-positioned rotatable carrier housing (not shown) where the rotatable carrier housing is adjustable in a vertical direction and is held stationary in a vertical position by an abrading machine frame (not shown). Rotational torque is supplied by the drive shaft 656 to an attached drive hub 650 that has an attached rotational drive device 658 that rotates the annular-wall device 662. Torque is transmitted from the annular-wall device 662 to a flexible membrane outer annular band 668 that is an integral extension of the flexible membrane 636 where the transmitted torque rotates both the flexible membrane 636 and the workpiece 672 that is attached to the flexible membrane 636.

The workpiece carrier flexible elastomeric membrane 636 that has a nominally-horizontal integral outer annular band 668 also has a nominally-vertical annular wall 638 that has a nominally-horizontal annular portion 644 that can have an annular indentation 646. The upper membrane wall annular portion 644 is attached to the hub annular extension 649 of the drive hub 650 where a sealed pressure chamber 648 is formed by the membrane 636, the annular wall 638, the hub annular extension 649 and the drive hub 650. Pressurized fluid or vacuum 652 can be applied to the sealed pressure chamber 648 via the hollow drive shaft 656 create an abrading pressure 660 that is transmitted to the workpiece 672 through the thickness of the flexible membrane 636.

The flexible membrane 636 has a circular inner zone portion 676 and an integral outer annular band 668 annular portion 670 where the attached laterally-rigid semiconductor wafer workpiece 672 is firmly attached with vacuum to the flexible membrane 636 circular inner zone portion 676 which rigidizes the circular inner zone portion 676 of the membrane 636. Vacuum 654 is supplied through the hollow drive shaft 656 and through fluid passageways in the drive hub 650 to a flexible hollow tube 664 that is fluid-connected to grooved passageways 674, 678 in the exposed surface of the membrane 636. When a circular workpiece 672 is attached by the vacuum 654 to the membrane 636, the grooved vacuum passageways 674, 678 in the exposed surface of the membrane 636 are sealed by mutual flat-surfaced contact of the workpiece 672 and the membrane 636 circular inner zone portion 676.

The outer annular band 668 has a radial-reinforcement 666 that extends radially from the annular-wall device 662 a partial distance to the flexible membrane outer annular band 668 leaving a radial gap distance 634 where the radial-reinforcement 666 is flexible vertically but has a controlled stiffness radially. Control of the radial gap distance 634 between radial-reinforcement 666 and the flexible membrane 636 circular inner zone portion 676 allows the flexibility of the outer annular band 668 to be optimized for providing limited vertical excursion and lateral horizontal excursion of the flexible membrane 636 during a workpiece 672 abrading procedure.

Another annular non-pressurized vented chamber 640 surrounds the sealed pressure chamber 648. Pressurized fluid 654 can also be supplied to the flexible hollow tube 664 that is fluid-connected to grooved passageways 674, 678 in the exposed surface of the membrane 636 to provide fluid pressure to separate the workpiece 672 from the flexible membrane 636 upon completion of an abrading procedure. The flexible elastomeric membrane 636 flexible elastomeric integral outer annular band 668 annular portion 670 can flex in a vertical direction that is perpendicular to the nominally flat surface of the workpiece 672 which allows the workpiece 672 to move in a vertical direction when pressure or vacuum 652 is applied to the sealed pressure chamber 648. Flexible localized movement of the membrane 636 and its integral components, the annular wall 638, the annular portion 644 and the annular indentation 646 allow the workpiece 672 to assume flat-surfaced abrading contact with the flat surface of an abrasive coating (not shown) on a rotary flat-surfaced platen.

Figure 22:
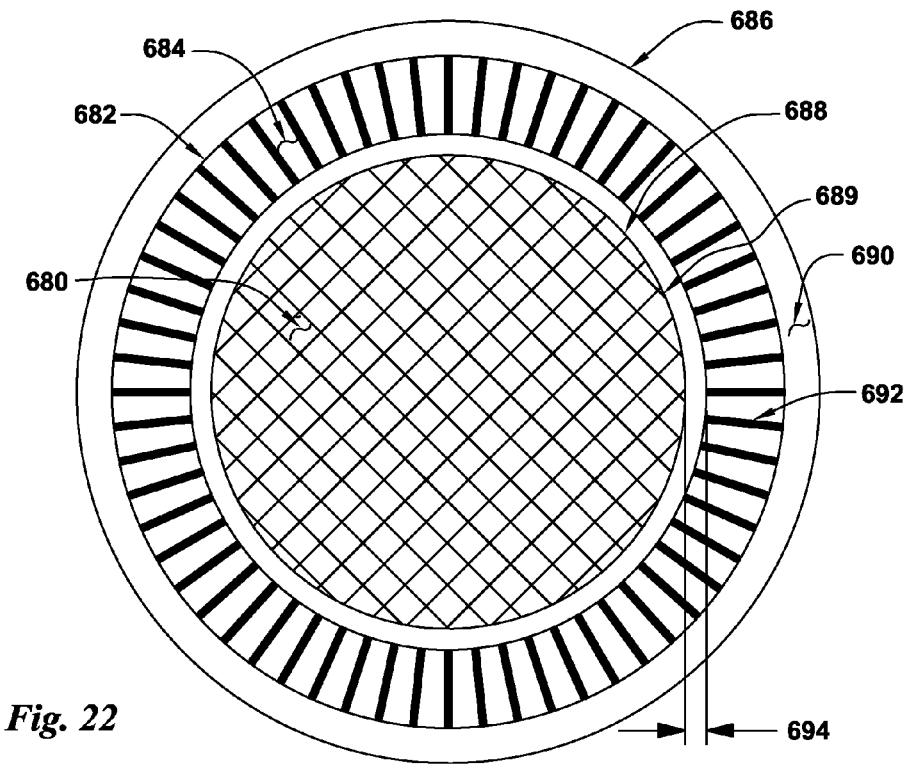
FIG. 22 is a top view of a workpiece carrier membrane with a partial radial-reinforced ring.

FIG. 22 is a top view of a workpiece carrier vacuum-grooved membrane with a partial radial-reinforced ring. A flexible elastomeric membrane 682 has a circular semiconductor wafer 688 attached to the central region 680 of the circular elastomeric membrane 682. The elastomeric membrane 682 also has an integral outer annular band 684 that is attached to an annular-wall device 690 and that is flexible in a direction that is perpendicular to the wafer 688 flat surface but is nominally stiff in a radial direction. The radial stiffness of the integral outer annular elastomeric band 684 maintains the circular wafer 688 nominally at the center of the circular elastomeric membrane 682 as the rotating wafer 688 is subjected to abrading forces by moving abrasive (not shown) that contacts the rotating wafer 688. Vacuum attachment of the radially-rigid wafer 688 to the flexible membrane 682 rigidizes the circular inner zone portion of the membrane 682.

The elastomeric membrane 682 integral outer annular band 684 is attached at its outer periphery to a rotatable workpiece carrier drive housing 686 and radial reinforcement cables or wires 692 are attached to the elastomeric membrane 682 integral outer annular band 684. The radial reinforcement strings, cables or wire devices 692 are flexible vertically to allow flexible vertical motion of both the elastomeric membrane 682 integral outer annular band 684 in a direction that is perpendicular to the flat surface of the elastomeric membrane 682 but provide added radial stiffness to the elastomeric membrane 682 integral outer annular band 684.

The outer annular band 684 has a radial-reinforcement 692 that extends radially from the annular-wall device 690 a partial distance to the flexible membrane inner zone 689 leaving a radial gap distance 694 where the radial-reinforcement 692 is flexible vertically but has a controlled stiffness radially. Control of the radial gap distance 694 between radial-reinforcement 692 and the flexible membrane 682 circular inner zone portion 689 allows the flexibility of the outer annular band 684 to be optimized for providing limited vertical excursion and lateral horizontal excursion of the flexible membrane 682 during a workpiece 688 abrading procedure.

Figure 23:
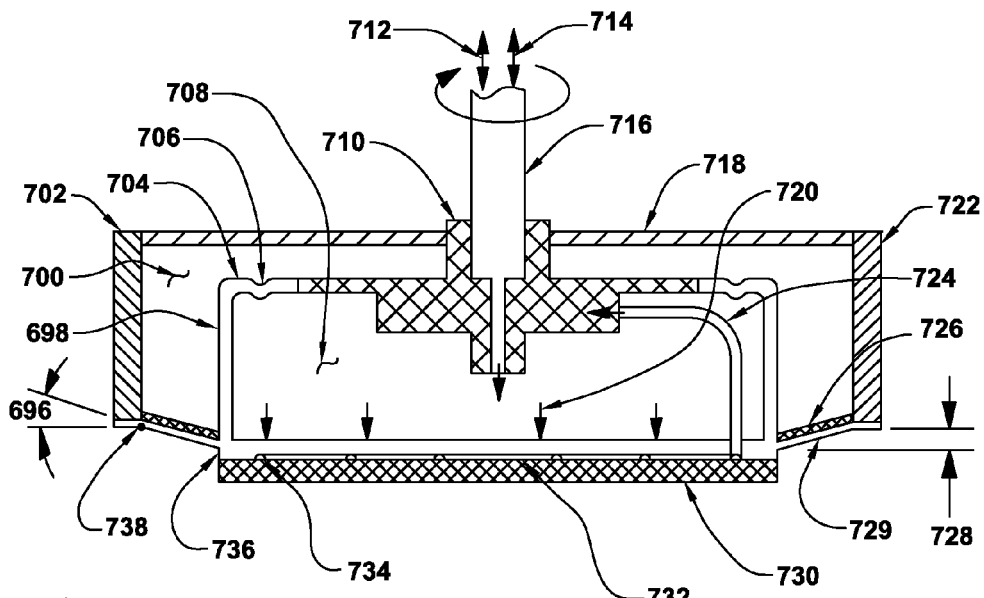
FIG. 23 is a cross section view of a workpiece carrier membrane distorted annular ring.

FIG. 23 is a cross section view of a workpiece carrier vacuum-grooved membrane distorted annular ring. A stationary workpiece carrier head 702 has a flat-surfaced workpiece 730 that is attached by vacuum to a floating workpiece carrier flexible elastomeric membrane 736 that is rotationally driven by an annular-wall device 722. A vertical rotatable hollow drive shaft 716 is supported by bearings (not shown) that are supported by a stationary-positioned rotatable carrier housing (not shown) where the rotatable carrier housing is adjustable in a vertical direction and is held stationary in a vertical position by an abrading machine frame (not shown). Rotational torque is supplied by the drive shaft 716 to an attached drive hub 710 that has an attached rotational drive device 718 that rotates the annular-wall device 722. Torque is transmitted from the annular-wall device 722 to a flexible membrane outer annular band 729 that is an integral extension of the flexible membrane 736 where the transmitted torque rotates both the flexible membrane 736 and the workpiece 730 that is attached to the flexible membrane 736.

The workpiece carrier flexible elastomeric membrane 736 that has a nominally-horizontal integral outer annular band 729 also has a nominally-vertical annular wall 698 that has a nominally-horizontal annular portion 704 that can have an annular indentation 706. The upper membrane wall annular portion 704 is attached to the hub annular extension 649 of the drive hub 710 where a sealed pressure chamber 708 is formed by the membrane 736, the annular wall 698, the hub annular extension 649 and the drive hub 710. Pressurized fluid or vacuum 712 can be applied to the sealed pressure chamber 708 via the hollow drive shaft 716 create an abrading pressure 720 that is transmitted to the workpiece 730 through the thickness of the flexible membrane 736.

The flexible membrane 736 has a circular inner zone portion and an integral outer annular band 729 annular portion where the attached laterally-rigid semiconductor wafer workpiece 730 is firmly attached with vacuum to the flexible membrane 736 circular inner zone portion which rigidizes the circular inner zone portion of the membrane 736. Vacuum 714 is supplied through the hollow drive shaft 716 and through fluid passageways in the drive hub 710 to a flexible hollow tube 724 that is fluid-connected to grooved passageways 732, 734 in the exposed surface of the membrane 736. When a circular workpiece 730 is attached by the vacuum 714 to the membrane 736, the grooved vacuum passageways 732, 734 in the exposed surface of the membrane 736 are sealed by mutual flat-surfaced contact of the workpiece 730 and the membrane 736 circular inner zone portion.

Another annular non-pressurized vented chamber 700 surrounds the sealed pressure chamber 708. Pressurized fluid 714 can also be supplied to the flexible hollow tube 724 that is fluid-connected to grooved passageways 732, 734 in the exposed surface of the membrane 736 to provide fluid pressure to separate the workpiece 730 from the flexible membrane 736 upon completion of an abrading procedure. The flexible elastomeric membrane 736 flexible elastomeric integral outer annular band 729 annular portion can flex in a vertical direction that is perpendicular to the nominally flat surface of the workpiece 730 which allows the workpiece 730 to move in a vertical direction when pressure or vacuum 712 is applied to the sealed pressure chamber 708. Flexible localized movement of the membrane 736 and its integral components, the annular wall 698, the annular portion 704 and the annular indentation 706 allow the workpiece 730 to assume flat-surfaced abrading contact with the flat surface of an abrasive coating (not shown) on a rotary flat-surfaced platen.

The flexible elastomeric membrane 736 can be moved in a vertical direction a distance 728 where the flexible elastomeric integral outer annular band 729 annular portion is flexed vertically and tilted downward through an angle 696 about an annular pivot line 738. This motion allows the workpiece 730 to move in a vertical direction when pressure or vacuum 712 is applied to the sealed pressure chamber 708.

Figure 24:
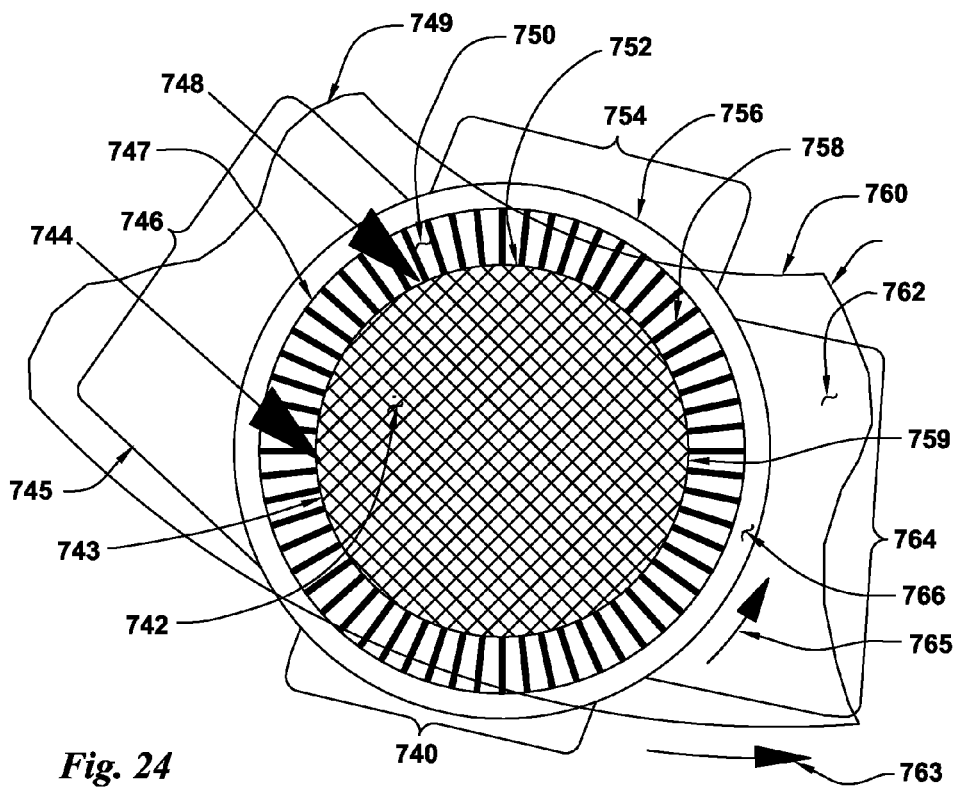
FIG. 24 is a top view of a workpiece carrier membrane abrading forces on an annular ring.

FIG. 24 is a top view of a vacuum-grooved membrane workpiece carrier and an abrasive coated platen and abrading forces on a polished wafer and on a membrane outer annular ring. A vacuum-grooved membrane workpiece carrier has a flat-surfaced workpiece 752 that is attached with vacuum to the vacuum-grooved membrane 743 that is part of the workpiece carrier that is rotationally driven. An abrasive disk 760 that has an annular band of abrasive 762 having an inner abrasive periphery 749 is attached to a rotating platen 761. The workpiece 752 overhangs both the inner 749 and outer radii 745 of the annular band 762 of fixed abrasive to provide uniform wear-down of both the annular band 762 of fixed abrasive and the abraded surface of the workpiece 752.

The workpiece 752 is rotated in a rotation direction 765 that is the same as the platen 761 rotation direction 763 and the workpiece 752 and the platen 761 are typically rotated at approximately at the same rpm rotation speeds as the workpiece 752 is in flat-surfaced abrading contact with the annular band of abrasive 762 to provide uniform wear-down of both the annular band 762 of fixed abrasive and the abraded surface of the workpiece 752. The moving abrasive 762 applies abrading forces 744, 748 on the shown upstream side 747 of the workpiece 752 as the platen 761 is rotated.

The flexible elastomeric membrane 743 has the circular semiconductor wafer 752 attached to the central region 742 of the circular elastomeric membrane 743. The elastomeric membrane 743 also has an integral outer annular elastomer band 750 that is attached to an annular-wall device 766 and that is flexible in a direction that is perpendicular to the wafer 752 flat surface but is nominally stiff in a radial direction. The radial stiffness of the integral outer annular elastomeric band 750 maintains the circular wafer 752 nominally at the center of the circular elastomeric membrane 743 and the center of the annular-wall device 766 as the rotating wafer 752 is subjected to abrading forces 744, 748 by the moving abrasive 762. The moving abrasive 762 contacts the upstream side 747 of the rotating wafer 752 and also contacts the full flat abraded surface of the wafer 752. Vacuum attachment of the radially-rigid wafer 752 to the flexible membrane 743 rigidizes the circular inner zone portion of the membrane 743.

The elastomeric membrane 743 integral outer annular band 750 is attached at its outer periphery to a rotatable workpiece carrier drive housing 756 and radial reinforcement device comprising cables or wires 758 is attached to the elastomeric membrane 743 integral outer annular band 750. The radial reinforcement strings, cables or wire devices 758 are flexible vertically to allow flexible vertical motion of both the elastomeric membrane 743 integral outer annular band 750 in a direction that is perpendicular to the flat surface of the elastomeric membrane 743 but provide added radial stiffness to the elastomeric membrane 743 integral outer annular band 750. The radial reinforcement strings, cables or wire devices 758 are attached to the elastomeric membrane 743 with adhesives or solvents, by impregnation or by thermal bonding or melting of the elastomer.

During an abrading procedure the abrading forces 744, 748 act upon the upstream side 747 of the wafer 752 which are counteracted by tension forces in the radial reinforcement strings, cables or wire devices 758 which occurs in the zone 746. On the downstream side 759 of the wafer 752 in zone 764, the radial reinforcement strings, cables or wire devices 758 tend to be in compression but these flexible radial reinforcement strings, cables or wire devices are typically weak in compression so they contribute very little support in keeping the wafer 752 centered in the middle of the elastomeric membrane 743 or the annular-wall device 766. There is substantially little radial forces in the radial reinforcement strings, cables or wire devices 758 due to the applied abrading forces 744, 748 in the zones 740 and 754 because the zones 740 and 754 are approximately perpendicular to the applied abrading forces 744, 748.

Figure 25:
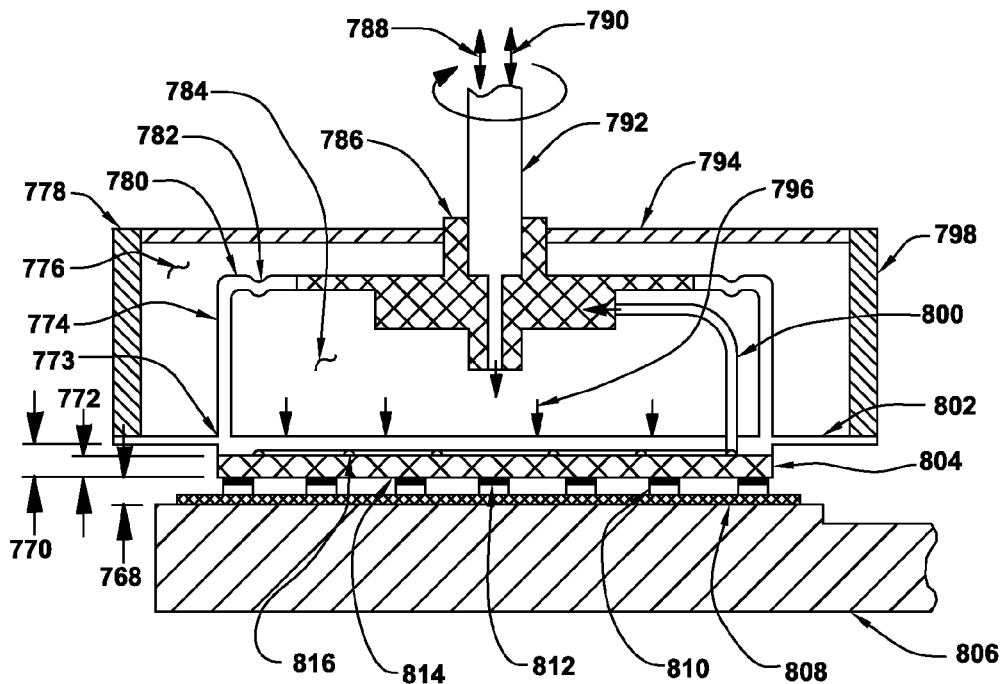
FIG. 25 is a cross section view of a membrane carrier and raised-island abrasive disk platen.

FIG. 25 is a cross section view of a vacuum-groove membrane carrier in abrading contact with a raised-island abrasive disk that is attached to a precision-flat surfaced rotatable platen. A workpiece carrier head 778 shown at a stationary position has a flat-surfaced workpiece 804 that is attached by vacuum to a floating workpiece carrier flexible elastomeric membrane 773 that is rotationally driven by an annular-wall device 798. A vertical rotatable hollow drive shaft 792 is supported by bearings (not shown) that are supported by a stationary-positioned rotatable carrier housing (not shown) where the rotatable carrier housing is adjustable in a vertical direction and is held stationary in a vertical position by an abrading machine frame (not shown). Rotational torque is supplied by the drive shaft 792 to an attached drive hub 786 that has an attached rotational drive device 794 that rotates the annular-wall device 798. Torque is transmitted from the annular-wall device 798 to a flexible membrane outer annular band 802 that is an integral extension of the flexible membrane 773 where the transmitted torque rotates both the flexible membrane 773 and the workpiece 804 that is attached to the flexible membrane 773.

The workpiece carrier flexible elastomeric membrane 773 that has a nominally-horizontal integral outer annular band 802 also has a nominally-vertical annular wall 774 that has a nominally-horizontal annular portion 780 that can have an annular indentation 782. The upper membrane wall annular portion 780 is attached to the hub annular extension 649 of the drive hub 786 where a sealed pressure chamber 784 is formed by the membrane 773, the annular wall 774, the hub annular extension and the drive hub 786. Pressurized fluid or vacuum 788 can be applied to the sealed pressure chamber 784 via the hollow drive shaft 792 create an abrading pressure 796 that is transmitted to the workpiece 804 through the thickness of the flexible membrane 773.

The flexible membrane 773 has a circular inner zone portion and an integral outer annular band 802 annular portion where the attached laterally-rigid semiconductor wafer workpiece 804 is firmly attached with vacuum to the flexible membrane 773 circular inner zone portion which rigidizes the circular inner zone portion of the membrane 773. Vacuum 790 is supplied through the hollow drive shaft 792 and through fluid passageways in the drive hub 786 to a flexible hollow tube 800 that is fluid-connected to grooved passageways 816 in the exposed surface of the membrane 773. When a circular workpiece 804 is attached by the vacuum 790 to the membrane 773, the grooved vacuum passageways 816 in the exposed surface of the membrane 773 are sealed by mutual flat-surfaced contact of the workpiece 804 and the membrane 773 circular inner zone portion.

Another annular non-pressurized vented chamber 776 surrounds the sealed pressure chamber 784. Pressurized fluid 790 can also be supplied to the flexible hollow tube 800 that is fluid-connected to grooved passageways 816 in the exposed surface of the membrane 773 to provide fluid pressure to separate the workpiece 804 from the flexible membrane 773 upon completion of an abrading procedure. The flexible elastomeric membrane 773 flexible elastomeric integral outer annular band 802 annular portion can flex in a vertical direction that is perpendicular to the nominally flat surface of the workpiece 804 which allows the workpiece 804 to move in a vertical direction when pressure or vacuum 788 is applied to the sealed pressure chamber 784. Flexible localized movement of the membrane 773 and its integral components, the annular wall 774, the annular portion 780 and the annular indentation 782 allow the workpiece 804 to assume flat-surfaced abrading contact with the flat annular surface of the fixed-abrasive disk 808 that is attached to the rotary flat-surfaced platen 806.

The fixed-abrasive disk 808 that is attached to the rigid rotary flat-surfaced platen 806 has raised island structures 810 that are top-coated with fixed abrasive 812. The abraded surface 814 of the workpiece or wafer 804 is in flat-surfaced abrading contact with the precision-flat annular band of abrasive 812 coated raised islands 810. The fixed-abrasive disk 808 is rigid through the thickness 768 of the abrasive disk 808 from the top surface of the fixed-abrasive 812 to the bottom attachment surface of the abrasive disk 808 that is in conformal flat-surfaced contact with the rigid platen 806. Here, the full abraded surface 814 of the wafer 804 contacts the rigid fixed-abrasive 812 coating on the rigid-thickness abrasive disk 808 that is supported by the rigid platen 806. As both the wafer 804 and the vacuum-grooved membrane 773 are flexible in a direction that is perpendicular to the abraded surface 814 of the wafer 804, the abraded surface 814 of the wafer 804 assumes flat conformal contact with the rigid fixed-abrasive 812 surface when abrading pressure 796 is present in the sealed abrading chamber 784.

When an abrading or wafer 804 polishing procedure is begun, the hollow drive shaft 792 and the annular-wall device 798 are lowered vertically where the non-rotating wafer 804 abraded surface 814 is in flat-surfaced contact with the non-rotating annular band of abrasive 812 coated raised islands 810 where the plane of the flexible elastomeric membrane 773 outer annular band 802 assumes a horizontal position. This vertical alignment of the hollow drive shaft 792 and the annular-wall device 798 is relatively easy to make because the thickness 772 of the wafer 804 is known or can be measured and the distance 770 between the bottom surface 814 of the wafer 804 and the lower edge of the annular-wall device 798 is readily known or can be calculated. The distance between the lower edge of the annular-wall device 798 and the platen abrading surface can be measured by a distance-measuring device (not shown) that is attached to the annular-wall device 798 where this distance-measuring device can be used to align the plane of the flexible elastomeric membrane 773 outer annular band 802 in a horizontal position.

Because very little material is removed (approximately 0.8 microns or 0.03 mils or 0.03 thousandths of an inch) from the full abraded surface 814 of the wafer 804 during a wafer 804 polishing procedure or from the abrasively lapped surface 814 of the workpiece 804 during a workpiece 804 flat-lapping procedure, the plane of the flexible elastomeric membrane 773 outer annular band 802 nominally remains in a horizontal position throughout the full abrading procedure. Here the flexible elastomeric membrane 773 outer annular band 802 experiences very little tilting during the abrading procedure due to material removal from the wafer 804. The abrading forces that are applied to the wafer 804 by the moving abrasive are resisted by radial reactive restraining forces within annular elastomeric band 802 where they nominally remain in the plane of the flexible elastomeric membrane 773 outer annular band 802. When the wafer 804 radial reactive restraining forces within the annular band 802 remain in the horizontal plane, there is a substantial absence of tilting of the wafer 804 during the abrading procedure.

The radial tension in the outer annular band 802 is adjustable where it can be set as a slack-tension, a neutral-tension and an initial pre-tension to optimize the performance of the outer annular band 802 in maintaining the wafer 804 center at the rotational axis of the hollow drive shaft 792 during an abrading procedure when the abraded surface 814 of the rotated workpiece or wafer 804 is in flat-surfaced abrading contact with the precision-flat annular band of abrasive 812 coated raised islands 810 or with other types of abrasive coating on the rotating platen 806.

Any natural frequency vibrations of the workpiece or wafer 804 that are a function of the combined mass of the wafer 804 and portions of the flexible membrane 773 and the spring constant of the semi-flexible outer annular band 802 that can be excited by rotation of the workpiece or wafer 804 are typically damped-out by shearing of the coolant water that is present at the abraded surface 814 of the workpiece or wafer 804 during a workpiece 804 abrading or wafer 804 polishing procedure.

Figure 26:
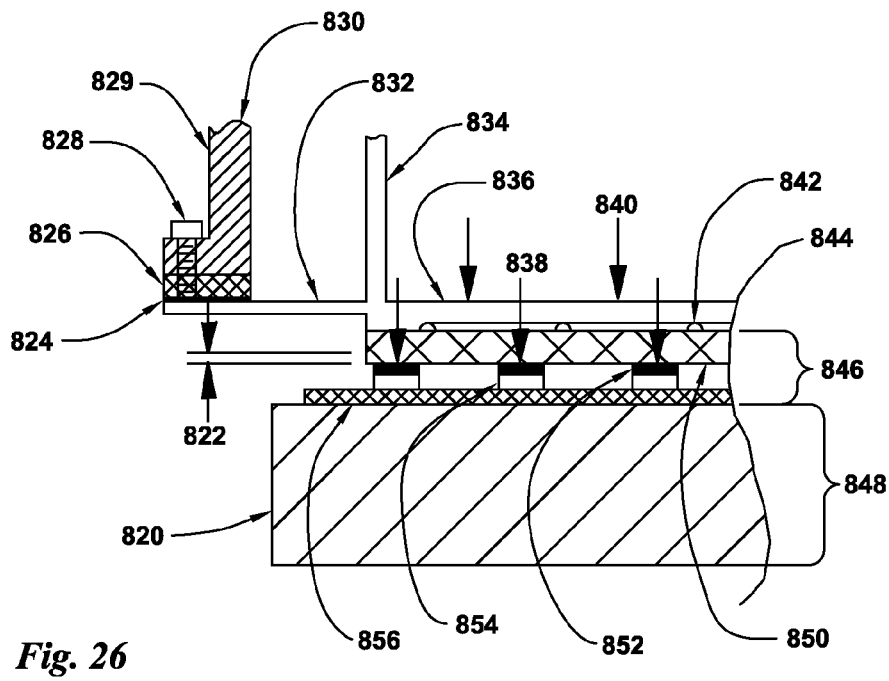
FIG. 26 is a cross section view of a membrane carrier and a rigid abrasive disk and platen.

FIG. 26 is a cross section view of a membrane carrier with an outer annular band and a rigid abrasive disk and platen. A vacuum-grooved membrane workpiece carrier 830 has a flat-surfaced wafer or workpiece 850 that is attached with vacuum to a vacuum-grooved 842 elastomer membrane 836 that is part of the workpiece carrier 830 that is rotationally driven. An abrasive disk 856 that has an annular band of abrasive 852 coated on raised-islands 854 is attached to the flat abrading surface of a rigid rotatable platen 820. The combined thickness 846 of the thickness-rigid abrasive disk 856 and the thickness-rigid workpiece 850 and the thickness 848 of the rigid platen 820 provide a rigid support for the flexible elastomeric membrane 836 during an abrading procedure. When applied abrading pressure 840 acts on the inside surface of the flexible elastomeric membrane 836, the applied abrading pressure 840 creates abrading pressures 838 that act uniformly across the full abraded surface of the wafer 850, in part because rubber-type elastomeric material that the flexible elastomeric membrane 836 can be constructed from is nominally incompressible.

The wafer 850 thickness changes only a very small thickness dimension 822 during an wafer 850 polishing procedure because very little material is removed (approximately 0.8 microns or 0.03 mils or 0.03 thousandths of an inch) from the full abraded surface of the wafer 850 during a wafer 850 polishing procedure. Because of the small wafer 850 material removal thickness dimension 822 change, the plane of the flexible elastomeric membrane 836 outer annular band 832 that was initially aligned in a horizontal position nominally remains in that horizontal position throughout the full abrading procedure.

The vacuum-grooved membrane workpiece carrier 830 has rotatable housing 829 that supports a rigid annular ring 826 that is attached to the flexible elastomeric membrane 836 outer annular band 832 with an adhesive 824 or by a thermal bond 824. The rigid annular ring 826 is attached to the rotatable housing 829 with fasteners 828 where the flexible elastomeric membrane 836 and the outer annular band 832 are rotated when the housing 829 is rotated.

Figure 27:
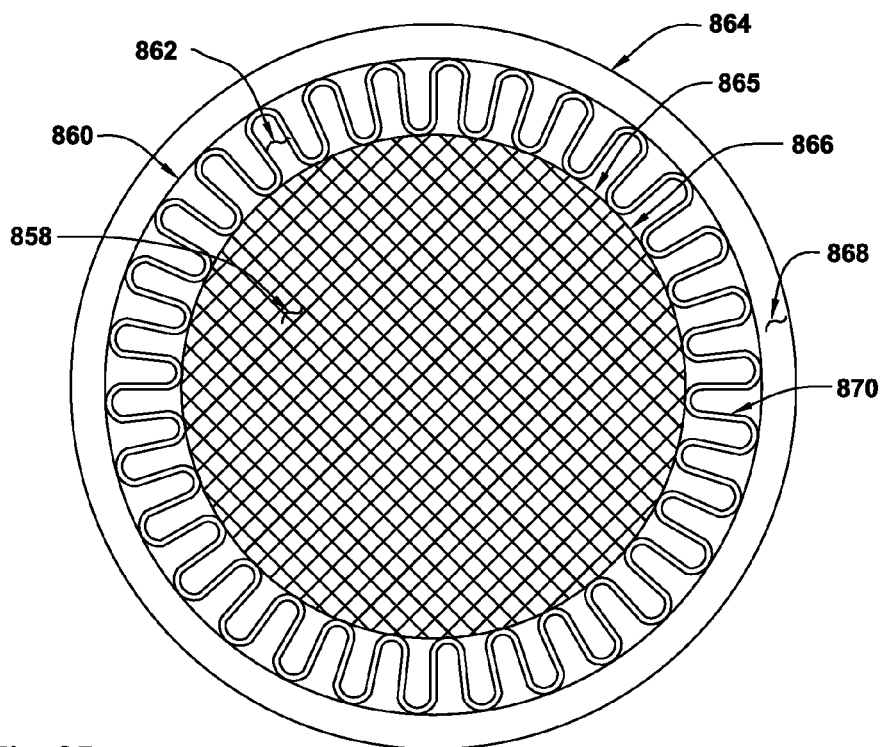
FIG. 27 is a top view of a workpiece carrier membrane with a looped-thread reinforced ring.

FIG. 27 is a top view of a workpiece carrier membrane with looped-thread reinforcement in the outer annular band. A workpiece carrier 864 has a vacuum-grooved flexible elastomer membrane 865 that has an outer annular band 862 that is attached to a rotatable housing 868 where outer annular band 862 has an outer diameter 860 and an inner diameter 866. A serpentine path of reinforcing thread, wire, fiber or cable 870 located between the outer annular band 862 outer diameter 860 and inner diameter 866 is attached to the outer annular band 862 to reinforce the outer annular band 862 radially but allow the outer annular band 862 to flex perpendicular to the flat surface of a wafer 858 that is vacuum attached to the flexible membrane 865.

Figure 28:
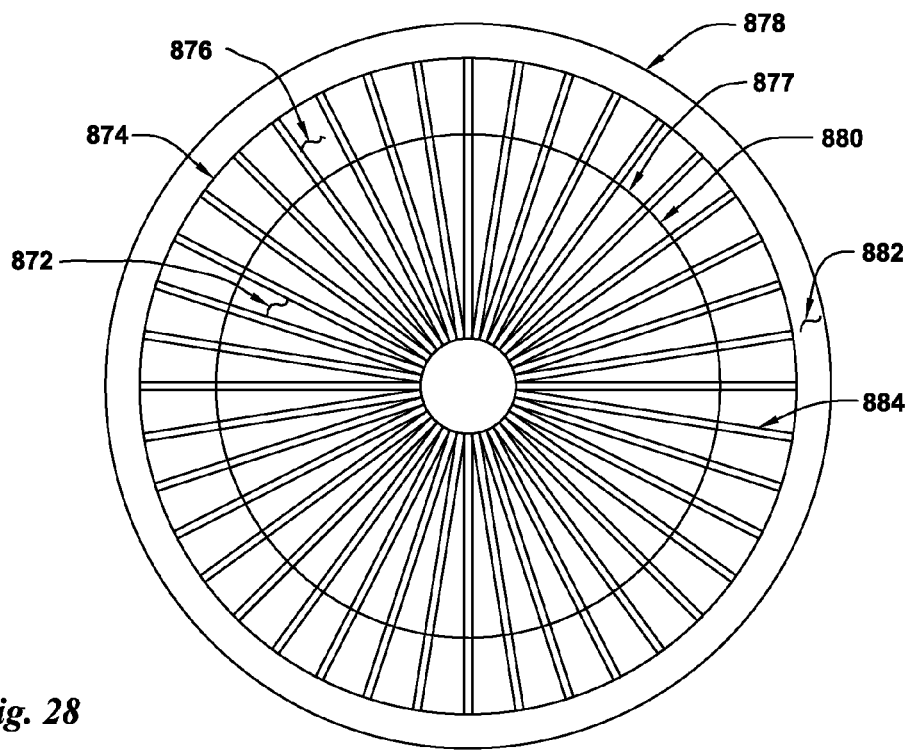
FIG. 28 is a top view of a workpiece carrier membrane with extended-thread reinforcement.

FIG. 28 is a top view of a workpiece carrier membrane with radial thread reinforcement in the central region of the flexible membrane that extends into the outer annular band. A workpiece carrier 878 has a vacuum-grooved flexible elastomer membrane 877 that has an outer annular band 876 that is attached to a rotatable housing 882 where outer annular band 876 has an outer diameter 874 and an inner diameter 880. A pattern of radial reinforcing threads, wires, fibers or cables 884 located between the outer annular band 876 outer diameter 874 and the central portion of the flexible elastomer membrane 877. The pattern of radial reinforcing threads, wires, fibers or cables 884 are attached to the outer annular band 876 and the flexible elastomer membrane 877 to reinforce the outer annular band 876 radially but allow the outer annular band 876 to flex perpendicular to the flat surface of a wafer 876 that is vacuum attached to the flexible membrane 877.

Figure 29:
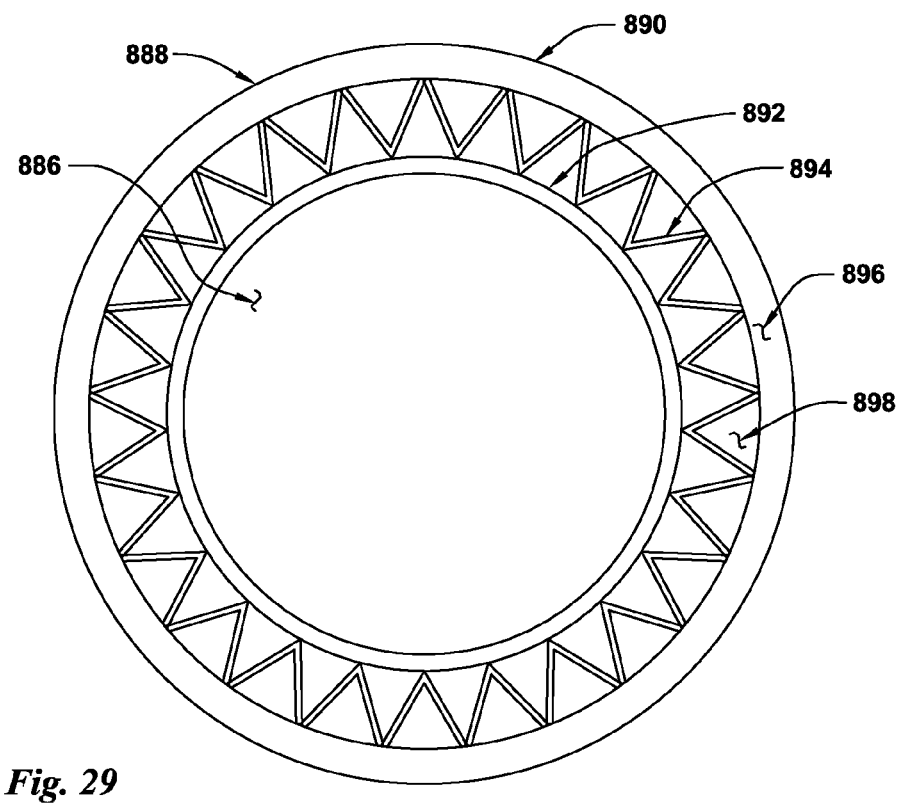
FIG. 29 is a top view of an elastomeric membrane with a reinforced outer annular band.

FIG. 29 is a top view of an elastomeric membrane with an angled-spoke reinforced outer annular band. A workpiece carrier 888 has a vacuum-grooved flexible elastomer membrane 892 that has an outer annular band 898 that is attached to a rotatable annular housing 896. A wafer or workpiece 886 is vacuum attached to the vacuum-grooved flexible elastomer membrane 892 where the rotatable housing 896 rotates the outer annular band 898 that rotates the elastomer membrane 892 and rotates the vacuum-attached wafer or workpiece 886. A pattern of spokes of reinforcing thread, wire, fiber or cable 894 provide radial and circumferential or tangential reinforcement of the outer annular band 898 to transmit rotational torque from the rotatable housing 896 to the flexible elastomer membrane 892 and to maintain the wafer or workpiece 886 at the geometric center of the rotatable annular housing 896 when the wafer or workpiece 886 is subjected to abrading forces that are parallel to the abraded surfaces of the wafer or workpiece 886.

Figure 30:
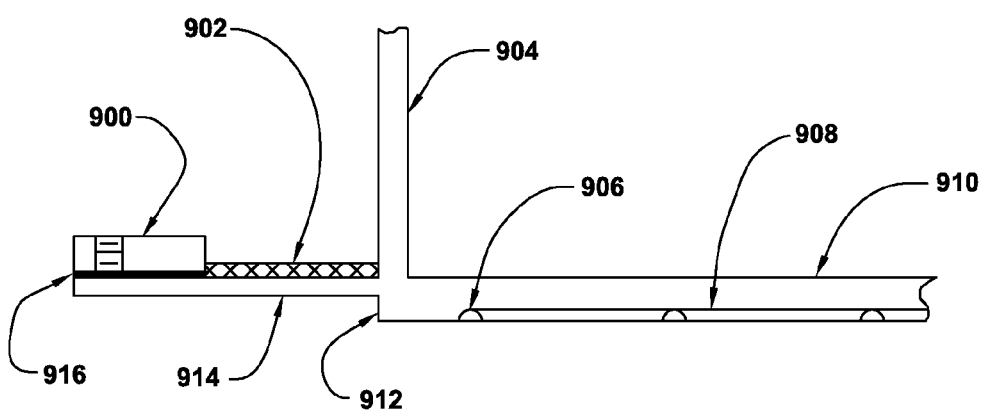
FIG. 30 is a cross section view of an elastomeric membrane with a reinforced outer band.

FIG. 30 is a cross section view of an elastomeric membrane with a reinforced outer band. A flexible membrane 912 has a top surface 910, recessed radial vacuum grooves 908 and tangential vacuum grooves 906 that are used to attach a wafer (not shown) with vacuum to the flexible membrane 912. The flexible membrane 912 has an outer vertical annular wall 904 and an outer annular band 914 that has an attached or integral outer annular band 914 reinforcement 902. The outer annular band 914 is shown here attached to an annular ring 900 that can be attached to a rotatable annular housing (not shown) with fasteners (not shown) and where the outer annular band 914 can be attached to the annular ring 900 with an adhesive 916.

Figure 31:
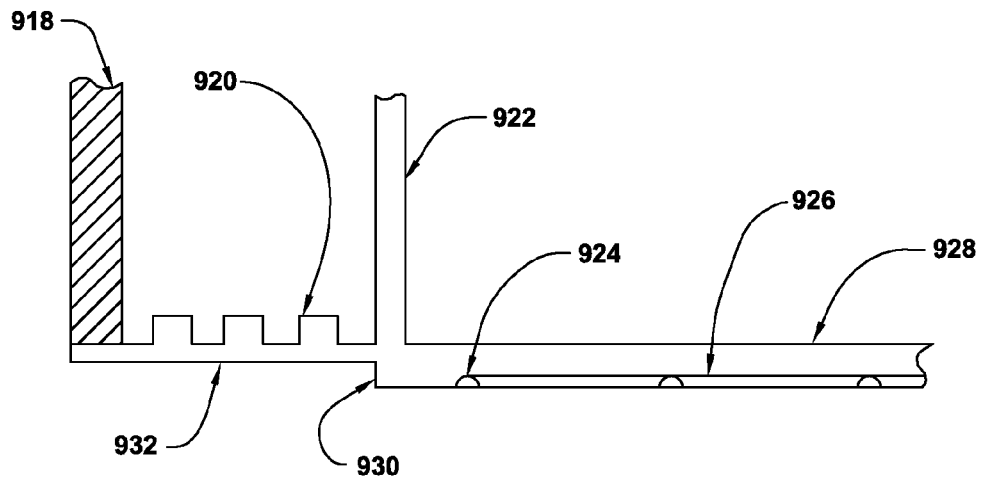
FIG. 31 is a cross section view of an elastomeric membrane outer band with ribs.

FIG. 31 is a cross section view of an elastomeric membrane outer band with integral annular ribs. A flexible membrane 930 has a top surface 928, recessed radial vacuum grooves 926 and tangential vacuum grooves 924 that are used to attach a wafer (not shown) with vacuum to the flexible membrane 930. The flexible membrane 930 has an outer vertical annular wall 922 and an outer annular band 932 that has integral annular ribs 920 that act as radial and circumferential reinforcement to the outer annular band 932 but allow the outer annular band 932 to be flexible in a direction that is perpendicular to the flexible membrane 930 nominally-flat top surface 928. The outer annular band 932 is attached to a rotatable annular housing 918.

Figure 32:
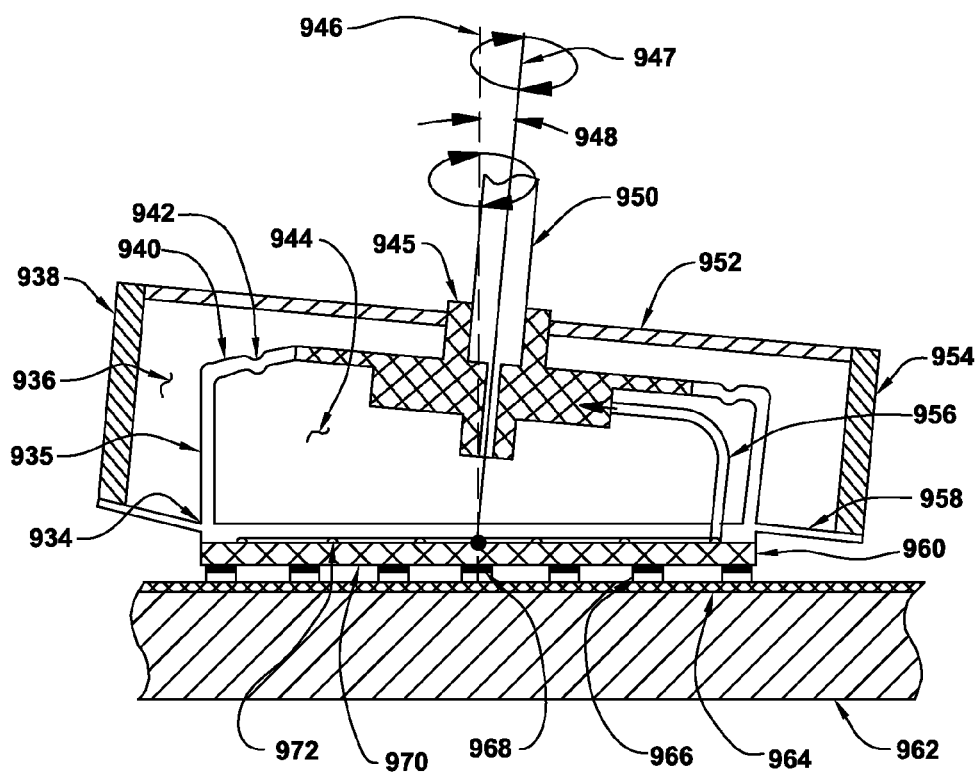
FIG. 32 is a cross section view of a tilted membrane carrier and abrasive disk platen.

FIG. 32 is a cross section view of a tilted vacuum-groove membrane carrier in abrading contact with a raised-island abrasive disk that is attached to a precision-flat surfaced rotatable platen. A workpiece carrier head 938 shown in a stationary position has a flat-surfaced workpiece 960 that is attached by vacuum to a floating workpiece carrier flexible elastomeric membrane 934 that is rotationally driven by an annular-wall device 954. A vertical rotatable hollow drive shaft 950 is supported by bearings (not shown) that are supported by a stationary-positioned rotatable carrier housing (not shown) where the rotatable carrier housing is adjustable in a vertical direction and is held stationary in a vertical position by an abrading machine frame (not shown). Rotational torque is supplied by the drive shaft 950 to an attached drive hub 945 that has an attached rotational drive device 952 that rotates the annular-wall device 954. Torque is transmitted from the annular-wall device 954 to a flexible membrane outer annular band 958 that is an integral extension of the flexible membrane 934 where the transmitted torque rotates both the flexible membrane 934 and the workpiece 960 that is attached to the flexible membrane 934.

The workpiece carrier flexible elastomeric membrane 934 that has a nominally-horizontal integral outer annular band 958 also has a nominally-vertical annular wall 935 that has a nominally-horizontal annular portion 940 that can have an annular indentation 942. The upper membrane wall annular portion 940 is attached to the hub annular extension 649 of the drive hub 945 where a sealed pressure chamber 944 is formed by the membrane 934, the annular wall 935, the hub annular extension and the drive hub 945. Pressurized fluid or vacuum can be applied to the sealed pressure chamber 944 via the hollow drive shaft 950 create an abrading pressure that is transmitted to the workpiece 960 through the thickness of the flexible membrane 934.

The flexible membrane 934 has a circular inner zone portion and an integral outer annular band 958 annular portion where the attached laterally-rigid semiconductor wafer workpiece 960 is firmly attached with vacuum to the flexible membrane 934 circular inner zone portion which rigidizes the circular inner zone portion of the membrane 934. Vacuum is supplied through the hollow drive shaft 950 and through fluid passageways in the drive hub 945 to a flexible hollow tube 956 that is fluid-connected to grooved passageways 972 in the exposed surface of the membrane 934. When a circular workpiece 960 is attached by the vacuum to the membrane 934, the grooved vacuum passageways 972 in the exposed surface of the membrane 934 are sealed by mutual flat-surfaced contact of the workpiece 960 and the membrane 934 circular inner zone portion.

Another annular non-pressurized vented chamber 936 surrounds the sealed pressure chamber 944. Pressurized fluid can also be supplied to the flexible hollow tube 956 that is fluid-connected to grooved passageways 972 in the exposed surface of the membrane 934 to provide fluid pressure to separate the workpiece 960 from the flexible membrane 934 upon completion of an abrading procedure. The flexible elastomeric membrane 934 flexible elastomeric integral outer annular band 958 annular portion can flex in a vertical direction that is perpendicular to the nominally flat surface of the workpiece 960 which allows the workpiece 960 to move in a vertical direction when pressure or vacuum is applied to the sealed pressure chamber 944. Flexible localized movement of the membrane 934 and its integral components, the annular wall 935, the annular portion 940 and the annular indentation 942 allow the workpiece 960 to assume flat-surfaced abrading contact with the flat annular surface of the fixed-abrasive disk 964 that is attached to the rotary flat-surfaced platen 962.

The fixed-abrasive disk 964 that is attached to the rigid rotary flat-surfaced platen 962 has raised island structures 966 that are top-coated with fixed abrasive 968. The abraded surface 970 of the workpiece or wafer 960 is in flat-surfaced abrading contact with the precision-flat annular band of abrasive 968 coated raised islands 966. The fixed-abrasive disk 964 is rigid through the thickness of the abrasive disk 964 from the top surface of the fixed-abrasive 968 to the bottom attachment surface of the abrasive disk 964 that is in conformal flat-surfaced contact with the rigid platen 962. Here, the full abraded surface 970 of the wafer 960 contacts the rigid fixed-abrasive 968 coating on the rigid-thickness abrasive disk 964 that is supported by the rigid platen 962. As both the wafer 960 and the vacuum-grooved membrane 934 are flexible in a direction that is perpendicular to the abraded surface 970 of the wafer 960, the abraded surface 970 of the wafer 960 assumes flat conformal contact with the rigid fixed-abrasive 968 surface when abrading pressure is present in the sealed abrading chamber 944.

The drive portions of the workpiece carrier head 938 including the drive shaft 950, the drive hub 945, the rotational drive device 952 and the annular-wall device 954 can be titled thru a tilt-angle 948 to provide uniform abrading pressure across the full abraded surface 970 of the wafer 960 that contacts the rigid fixed-abrasive 968 coating on the rigid-thickness abrasive disk 964 that is supported by the rigid platen 962. The tilt angle 948 is measured from the vertical 946 that is perpendicular to the abrasive surface of the rotatable rigid platen 962 and the drive shaft 950 rotational axis 947.

Tilting of the drive portions of the workpiece carrier head 938 relative to the rigid platen 962 allows the flexible outer annular band 958 to apply vertical upward or downward abrading forces to portions of the wafer 960 as it is being abraded by the abrasive coated rotating platen 962. The leading edge portion of the wafer 960 that is first contacted by the wafer 960 moving abrasive disk 964 can experience upward or downward abrading forces due to the offset location of the wafer 960 horizontal abraded surface 970 from the nominally-horizontal outer annular band 958. Likewise, the trailing edge portion of the wafer 960 that is last contacted by the wafer 960 moving abrasive disk 964 can experience upward or downward abrading forces due to the offset location of the wafer 960 horizontal abraded surface 970 from the nominally-horizontal outer annular band 958. Here, tilting of the drive portions of the workpiece carrier head 938 can neutralize the wafer 960 abrading forces that are a result of the offset location of the wafer 960 horizontal abraded surface 970 from the nominally-horizontal outer annular band 958.

The abrading machine floating workpiece substrate carrier apparatus and processes to use it are described here. An abrasive polishing wafer carrier apparatus comprising:
a) a movable carrier housing attached to a rotatable shaft having a rotatable shaft axis of rotation;
b) a flexible membrane having a top surface, a nominally-flat bottom surface and flexible membrane thickness is attached to the movable carrier housing wherein the flexible membrane nominally-flat bottom surface has recessed vacuum grooves;
c) a vacuum source supplied to the rotatable shaft is fluid-coupled to a flexible tube that is fluid-coupled to the flexible membrane recessed vacuum grooves;
d) a pressure source supplied to the rotatable shaft is fluid-coupled to a sealed pressure chamber formed by the flexible membrane and the movable carrier housing.

The apparatus where the flexible membrane has an outer annular portion that is flexible in a direction that is nominally-perpendicular to the flexible membrane nominally-flat bottom surface the outer annular portion is nominally-stiff in directions that are parallel to the flexible membrane nominally-flat bottom surface. Also, a circular wafer having opposed nominally-flat top and bottom surfaces is provided and is positioned wherein the circular wafer nominally-flat top surface is in flat-surfaced conformal contact with the flexible membrane nominally-flat bottom surface wherein the flexible membrane recessed vacuum grooves are sealed by the wafer and wherein vacuum present in the flexible membrane recessed vacuum grooves attaches the circular wafer to the flexible membrane nominally-flat bottom surface.

Further, the apparatus flexible membrane outer annular portion is reinforced with reinforcing materials comprising: fibers, strings, wires, cables, woven mats, polymers, and laminated materials wherein the reinforced flexible membrane outer annular portion is flexible in a direction that is nominally-perpendicular to the flexible membrane nominally-flat bottom surface and is nominally-stiff in directions that are parallel to the flexible membrane nominally-flat bottom surface.

In addition, the apparatus flexible membrane outer annular portion is an integral part of the flexible membrane and the embodiment where the flexible membrane outer annular portion is attached to the flexible membrane. Further, the flexible membrane comprises flexible materials selected from the group consisting of: elastomers, silicone rubber, room temperature vulcanizing silicone rubber, natural rubber, synthetic rubber, thermoset polyurethane, thermoplastic polyurethane, flexible polymers, composite materials, polymer-impregnated woven cloths, sealed fiber materials, laminated sheets of combinations thereof, sheets of impervious flexible materials, and metals.

Also, the flexible membrane outer annular portion transmits rotational torque from the movable carrier housing to the flexible membrane where the flexible membrane transmits the rotational torque to the wafer that is vacuum-attached to the flexible membrane. Further, the flexible membrane outer annular portion has sufficient radial stiffness to nominally-maintain the center of the circular wafer that is vacuum-attached to the flexible membrane at a position nominally at the rotation axis of the rotatable shaft when the rotating abraded wafer is subjected to abrading forces.

In another embodiment, the abrasive polishing wafer carrier apparatus movable carrier housing is tiltable a selected tilt angle from perpendicular to a rotatable platen abrading surface where the tilt angle is measured from the circle-center of the wafer in a plane that is coincident with the vector direction of the tangential motion of the rotating abrasive platen relative to the wafer circle-center and the perpendicular to the rotatable platen abrading surface. And, the abrasive polishing wafer carrier apparatus movable carrier housing is moveable a selected distance to move the wafer attached to the flexible membrane a selected distance from a rotatable platen abrading surface.

Further, a process is described for using the apparatus to polish the wafer or a workpiece that is attached with vacuum to the flexible membrane wherein the movable carrier housing is moved wherein the wafer or a workpiece nominally-flat bottom surface is positioned in flat-surfaced abrading contact with a rotatable abrading platen flat abrasive coating and fluid pressure is supplied to the sealed pressure chamber formed by the flexible membrane and the movable carrier housing wherein the fluid pressure is transmitted through the flexible membrane thickness to apply a controlled abrading pressure uniformly across the full abraded bottom surface of the wafer and both the rotatable abrading platen having the flat abrasive coated abrading surface and the flexible membrane having the attached wafer are rotated.

Also, a process for using the apparatus is wherein fluid pressure is applied to the flexible membrane bottom surface recessed vacuum grooves to separate the wafer from the flexible membrane bottom surface.

A process is described for using the apparatus wherein the abrasive polishing wafer carrier apparatus movable carrier housing is tilted a selected tilt angle from perpendicular to a rotatable platen abrading surface where the tilt angle is measured from the circle-center of the wafer in a plane that is coincident with the vector direction of the tangential motion of the rotating abrasive platen relative to the circle-center and the perpendicular to the rotatable platen abrading surface.

Further, a process uses the rotatable abrading platen flat abrasive coating with a liquid slurry comprising: abrasive particles and abrasive-process enhancing chemicals. In another embodiment, a process uses a rotatable abrading platen with a flexible fixed-abrasive disk that is conformably attached to the platen flat abrading surface. Also, the rotatable abrading platen flat abrasive coating is a flexible abrasive disk that has an annular band of fixed-abrasive coated raised islands and wherein coolant water or coolant water containing abrasive-process enhancing chemicals is used to cool the wafer during the abrading process.

In another embodiment, the abrasive polishing wafer carrier apparatus has multiple sealed pressure chambers formed by portions of the flexible membrane and the movable carrier housing.

In an additional embodiment, the abrasive polishing wafer carrier apparatus has a sealed flexible-diaphragm pressure chamber formed by a rotatable flexible annular diaphragm device and the movable carrier housing wherein fluid pressure supplied to the flexible-diaphragm pressure chamber will move the movable carrier housing downward relative to a vertical rotatable shaft and vacuum supplied to the flexible-diaphragm pressure chamber will move the movable carrier housing upward relative to the vertical rotatable shaft. Also, a process for using the apparatus is where vacuum applied to the sealed flexible-diaphragm pressure chamber moves the movable carrier housing upward relative to the vertical rotatable shaft and wherein fluid pressure applied to the sealed flexible-diaphragm pressure chamber moves the movable carrier housing downward relative to the vertical rotatable shaft.

In performing the present technology, sensing and measuring of distances, and controlled movement of platens, supports and workpieces, processing controls and analytical systems and components using processors, microprocessors, field programmable fated arrays, ASICs and other intelligent devices may be used. The sensors and measuring components provide electronic signals to the processor which then executes software display instructions or information on a visual display screen or actual provide commands to the apparatus with respect to relative movement between surface, adjust speeds or rotation, pressure and vacuum control, and other operational parameters in the performance of the abrading/polishing processes and apparatus described herein.

Although specific equipment, materials, speeds and pressures are described herein, variations may be practiced by those skilled in the art.

What is claimed:

1. An abrasive polishing wafer carrier apparatus comprising:
   a) a movable carrier housing attached to a rotatable shaft having a rotatable shaft axis of rotation;
   b) a flexible membrane having a top surface, a nominally-flat bottom surface attached to the movable carrier housing and flexible membrane thickness, wherein the flexible membrane nominally-flat bottom surface has recessed vacuum grooves;
   c) a vacuum source fluid-coupled to the flexible membrane recessed vacuum grooves; and
   d) a pressure source fluid-coupled to a sealed pressure chamber formed by the flexible membrane and the movable carrier housing.

2. The apparatus of claim 1 wherein the flexible membrane has an outer annular portion that is flexible in a direction that is nominally-perpendicular to the flexible membrane nominally-flat bottom surface and is nominally-stiff in directions parallel to the flexible membrane nominally-flat bottom surface.

3. The apparatus of claim 1 wherein a circular wafer having opposed nominally-flat top and bottom surfaces is positioned such that the circular wafer nominally-flat top surface is in flat-surfaced conformal contact with the flexible membrane nominally-flat bottom surface, wherein the flexible membrane recessed vacuum grooves are sealed by the wafer and wherein vacuum present in the flexible membrane recessed vacuum grooves attaches the circular wafer to the flexible membrane nominally-flat bottom surface.

4. The apparatus of claim 2 wherein the flexible membrane outer annular portion is reinforced with reinforcing materials comprising: fibers, filaments, strings, wires, cables, woven mats, non-woven fabric, polymers, and laminated materials wherein the reinforced flexible membrane outer annular portion is flexible in a direction that is nominally-perpendicular to the flexible membrane nominally-flat bottom surface and is nominally-stiff in directions parallel to the flexible membrane nominally-flat bottom surface.

5. The apparatus of claim 2 wherein the flexible membrane outer annular portion is an integral part of the flexible membrane.

6. The apparatus of claim 2 wherein the flexible membrane outer annular portion is attached to the flexible membrane.

7. The apparatus of claim 1 wherein the flexible membrane comprises flexible materials selected from the group consisting of: elastomers, silicone rubber, room temperature vulcanizing silicone rubber, natural rubber, synthetic rubber, thermoset polyurethane, thermoplastic polyurethane, flexible polymers, composite materials, polymer-impregnated woven cloths, sealed fiber materials, impervious flexible materials, and flexible metals.

8. The apparatus of claim 3 wherein the flexible membrane outer annular portion transmits rotational torque from the movable carrier housing to the flexible membrane and wherein the flexible membrane transmits the rotational torque to the wafer that is vacuum-attached to the flexible membrane.

9. The apparatus of claim 3 wherein the flexible membrane outer annular portion has sufficient radial stiffness to maintain the center of the circular wafer that is vacuum-attached to the flexible membrane at a position nominally at the rotation axis of the rotatable shaft when the rotating abraded wafer is subjected to abrading forces.

10. The apparatus of claim 3 wherein the abrasive polishing wafer carrier apparatus movable carrier housing is tiltable through a selected tilt angle measured between the rotatable shaft axis of rotation and a perpendicular to the rotatable platen flat abrading surface.

11. The apparatus of claim 3 wherein the movable carrier housing is moveable to enable movement of the wafer attached to the flexible membrane a selected distance from a rotatable platen abrading surface.

12. A process for using the apparatus of claim 3 to polish the wafer or a workpiece comprising attaching the wafer or the workpiece with vacuum to the flexible membrane, moving the movable carrier housing so that the wafer or a workpiece nominally-flat bottom surface is positioned in flat-surfaced abrading contact with a rotatable abrading platen flat abrasive coating and supplying
   fluid pressure to the sealed pressure chamber formed by the flexible membrane and the movable carrier housing so that the fluid pressure is transmitted through the flexible membrane thickness to apply a controlled abrading pressure uniformly across the full abraded bottom surface of the wafer and both the rotatable abrading platen having the flat abrading surface and the flexible membrane having the attached wafer are rotated to polish the wafer or the workpiece.

13. A process for using the apparatus of claim 3 wherein fluid pressure is applied to the flexible membrane bottom surface recessed vacuum grooves upon completion of a wafer abrading procedure to separate the wafer from the flexible membrane bottom surface.

14. A process for using the apparatus of claim 10 wherein the abrasive polishing wafer carrier apparatus movable carrier housing is tilted a selected tilt angle measured between the rotatable shaft axis of rotation and a perpendicular to the rotatable platen flat abrading surface and both the rotatable abrading platen having the flat abrading surface and the flexible membrane having the attached wafer are rotated to polish a wafer or workpiece.

15. A process according to claim 12 wherein the abrasive on the rotatable platen flat abrading surface is provided by a liquid slurry comprising: abrasive particles and abrasive-process enhancing chemicals.

16. A process according to claim 12 wherein the abrasive on the rotatable platen flat abrading surface is provided by a flexible fixed-abrasive disk that is conformably attached to the platen flat abrading surface.

17. A process according to claim 12 wherein the abrasive on the rotatable platen flat abrading surface is provided by a flexible flat-surfaced abrasive disk that is conformably attached to the platen flat abrading surface and the flexible abrasive disk has an annular band of fixed-abrasive coated raised islands and coolant water or coolant water containing abrasive-process enhancing chemicals is applied to cool the wafer during the abrading process.

18. The apparatus of claim 1 wherein the abrasive polishing wafer carrier apparatus has multiple sealed pressure chambers formed by portions of the flexible membrane and the movable carrier housing.

19. The apparatus of claim 1 wherein the abrasive polishing wafer carrier apparatus has a sealed flexible-diaphragm pressure chamber formed by a rotatable flexible annular diaphragm and the movable carrier housing wherein fluid pressure supplied to the flexible-diaphragm pressure chamber will move the movable carrier housing downward relative to a vertical rotatable shaft and vacuum supplied to the flexible-diaphragm pressure chamber will move the movable carrier housing upward relative to the vertical rotatable shaft.

20. A process for using the apparatus of claim 19 wherein vacuum applied to the sealed flexible-diaphragm pressure chamber moves the movable carrier housing upward relative to the vertical rotatable shaft and wherein fluid pressure applied to the sealed flexible-diaphragm pressure chamber moves the movable carrier housing downward relative to the vertical rotatable shaft.

* * * * *